United States Patent
Mallet et al.

(10) Patent No.: US 9,052,413 B1
(45) Date of Patent: Jun. 9, 2015

(54) SYSTEMS AND PROCESSES FOR BUILDING MULTIPLE EQUIPROBABLE COHERENT GEOMETRICAL MODELS OF THE SUBSURFACE

(71) Applicants: PARADIGM SCIENCES LTD., Grand Cayman (KY); Jean-Laurent Mallet, Garnich (LU)

(72) Inventors: Jean-Laurent Mallet, Garnich (LU); Anne-Laure Tertois, Crawley (GB)

(73) Assignees: PARADIGM SCIENCES LTD., Grand Cayman (KY); Jean-Laurent Mallet, Luxembourg-Beggen (LU)

( * ) Notice: Subject to any disclaimer, the term of this patent is extended or adjusted under 35 U.S.C. 154(b) by 1 day.

(21) Appl. No.: 14/065,713

(22) Filed: Oct. 29, 2013

Related U.S. Application Data

(63) Continuation of application No. 12/791,370, filed on Jun. 1, 2010, now Pat. No. 8,600,708.

(60) Provisional application No. 61/182,804, filed on Jun. 1, 2009.

(51) Int. Cl.
| | |
|---|---|
| *G06F 17/10* | (2006.01) |
| *G01V 99/00* | (2009.01) |
| *G06T 19/20* | (2011.01) |
| *G06T 17/20* | (2006.01) |

(52) U.S. Cl.
CPC .............. *G01V 99/005* (2013.01); *G06T 19/20* (2013.01); *G01V 2210/66* (2013.01); *G01V 2210/64* (2013.01); *G06T 17/20* (2013.01)

(58) Field of Classification Search
None
See application file for complete search history.

(56) References Cited

U.S. PATENT DOCUMENTS

| | | | |
|---|---|---|---|
| 5,384,752 A | * | 1/1995 | Duren et al. ............... 367/38 |
| 5,465,323 A | | 11/1995 | Mallet |
| 5,594,807 A | | 1/1997 | Liu |

(Continued)

FOREIGN PATENT DOCUMENTS

| | | |
|---|---|---|
| WO | WO 99/41676 | 8/1999 |
| WO | WO 2008/005690 | 1/2008 |
| WO | WO 2011/077227 | 6/2011 |

OTHER PUBLICATIONS

J. L. Mallet "Space-Time Mathematical Framework for Sedimentary Geology", Mathematical Geology, vol. 36, No. 1, Jan. 2004, pp. 1-32.*

(Continued)

*Primary Examiner* — Omar Fernandez Rivas
*Assistant Examiner* — Kibrom K Gebresilassie
(74) *Attorney, Agent, or Firm* — Pearl Cohen Zedek Latzer Baratz LLP

(57) ABSTRACT

A method, apparatus and system for, in a computing system, perturbing an initial three-dimensional (3D) geological model using a 3D vector field. A coherent 3D vector field including 3D vectors may be generated where each 3D vector of the 3D vector field is associated with a node of the initial 3D geological model and has a magnitude within a range of uncertainty of the node of the initial 3D geological model associated therewith. The coherent 3D vector field may be applied to the initial 3D geological model associated therewith to generate an perturbed 3D model. The perturbed 3D model may differ from the initial 3D geological model by a displacement defined by the 3D vector field associated with nodes having uncertain values. The perturbed 3D model may be displayed.

26 Claims, 17 Drawing Sheets

(56) References Cited

U.S. PATENT DOCUMENTS

| | | | |
|---|---|---|---|
| 5,671,136 | A | 9/1997 | Willhoit |
| 6,106,561 | A | 8/2000 | Farmer |
| 6,138,076 | A * | 10/2000 | Graf et al. .................. 702/14 |
| 7,412,363 | B2 | 8/2008 | Callegari |
| 7,446,765 | B2 | 11/2008 | Dugge |
| 7,480,205 | B2 * | 1/2009 | Wei .................. 367/37 |
| 7,711,532 | B2 * | 5/2010 | Dulac et al. ................. 703/10 |
| 7,844,402 | B2 | 11/2010 | Klein et al. |
| 7,869,954 | B2 | 1/2011 | den Boer et al. |
| 7,970,593 | B2 | 6/2011 | Roggero et al. |
| 8,150,663 | B2 | 4/2012 | Mallet |
| 8,274,859 | B2 | 9/2012 | Maucec et al. |
| 8,600,708 | B1 | 12/2013 | Mallet et al. |
| 8,711,140 | B1 | 4/2014 | Mallet |
| 8,743,115 | B1 * | 6/2014 | Mallet et al. ............... 345/424 |
| 2003/0018436 | A1 * | 1/2003 | Stark .................. 702/14 |
| 2003/0023383 | A1 * | 1/2003 | Stark .................. 702/14 |
| 2004/0122640 | A1 * | 6/2004 | Dusterhoft .................. 703/10 |
| 2005/0114831 | A1 | 5/2005 | Callegari et al. |
| 2008/0021684 | A1 * | 1/2008 | Dulac et al. .................. 703/9 |
| 2008/0232694 | A1 | 9/2008 | Sulatycke |
| 2008/0273421 | A1 | 11/2008 | Koren et al. |
| 2009/0157322 | A1 | 6/2009 | Levin |
| 2010/0156920 | A1 | 6/2010 | Shin et al. |
| 2010/0245347 | A1 | 9/2010 | Dorn et al. |
| 2010/0299117 | A1 * | 11/2010 | Bjerkholt .................. 703/2 |
| 2011/0015910 | A1 | 1/2011 | Ran et al. |
| 2011/0054857 | A1 | 3/2011 | Moguchaya |
| 2011/0115787 | A1 | 5/2011 | Kadlec |
| 2012/0037379 | A1 | 2/2012 | Hilliard et al. |
| 2013/0204598 | A1 | 8/2013 | Mallet |
| 2013/0231903 | A1 * | 9/2013 | Li et al. .................. 703/2 |
| 2013/0262052 | A1 * | 10/2013 | Mallet et al. .................. 703/2 |

OTHER PUBLICATIONS

J. L. Mallet "Numerical Earth Models" 2008, pp. 1-148.*

R. Moyen, J. L. Mallet, T. Frank, B. Leflon, & J. J. Royer, "3D-Parameterization of the 3D Geological Space—The Geochron Model" pp. 1-9, 2004.*

T. Frank "Advanced Visualization and Modeling of Tetrahedral Meshes" pp. 1-140, 2006.*

U.S. Appl. No. 14/059,099, filed Oct. 21, 2013, Mallet et al.

U.S. Appl. No. 14/189,505, filed Feb. 25, 2014, Mallet.

U.S. Appl. No. 13/862,680, filed Apr. 15, 2013, Tertois et al.

U.S. Appl. No. 14/260,760, filed Apr. 24, 2014, Mallet et al.

U.S. Appl. No. 61/896,760, filed Oct. 29, 2013, Dulac et al.

U.S. Appl. No. 14/211,744, filed Mar. 14, 2014, Mallet.

U.S. Appl. No. 14/485,018, filed Sep. 12, 2014, Hugot et al.

"Geomodeling Releases VisualVoxAT™ 6.2 Software—Introducing the Geobody Paintbrush," New Release, Sep. 24, 2007, printed from http://www.geomodeling.com/news_22.htm; on Oct. 5, 2009.

GoCAD Suite 2.5 2007 User Guide: Parts 1-12, published Sep. 15, 2007.

La Brunye et al., "New 3D flattened space for seismic interpretation," SEG Houston 2009 International Exposition and Annual Meeting, pp. 1132-1136.

O'Malley et al., "Towards Robust Structure-Based Enhancement and Horizon Picking in 3-D Seismic Data," Proceedings of the 2004 IEEE Computer Society Conference on Computer Vision and Pattern Recognition (CVPR '04), 2004, vol. 2, pp. 482-489.

Smith et al., "Susan—A New Approach to Low Level Image Processing," International Journal of Computer Vision, 1997, vol. 23, Iss. 1, pp. 45-78.

Souche, "Integration of fault models into unstructured grids and geo-chronological space," 24$^{th}$ GOCAD Meeting, Jun. 2004.

Zeng et al., "Stratal Slicing and Seismic Facies Imaging," Bureau of Economic Geology, The University of Texas at Austin, 1998. (only Abstract submitted).

Notice of Allowance issued for U.S. Appl. No. 12/791,370, mailed on Jul. 22, 2013.

Office Action issued for U.S. Appl. No. 12/791,370, mailed on Nov. 26, 2012.

Office Action issued for U.S. Appl. No. 14/059,099, mailed on Jun. 16, 2014.

Notice of Allowance issued for U.S. Appl. No. 12/791,352 mailed Dec. 6, 2013.

Office Action issued for U.S. Appl. No. 12/909,981 mailed Aug. 19, 2013.

Notice of Allowance issued for U.S. Appl. No. 12/909,981 mailed Jan. 27, 2014.

Office Action issued for U.S. Appl. No. 14/211,744, mailed on Jun. 3, 2014.

Office Action issued for U.S. Appl. No. 14/260,760, mailed on Jul. 9, 2014.

* cited by examiner

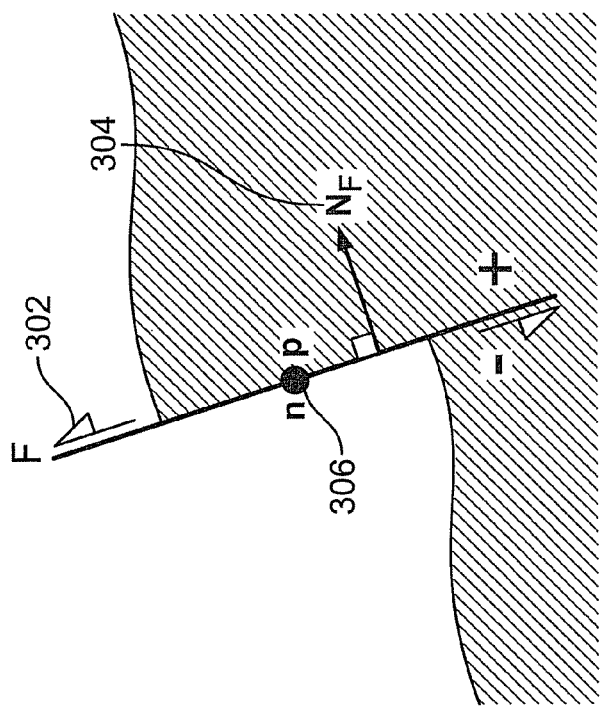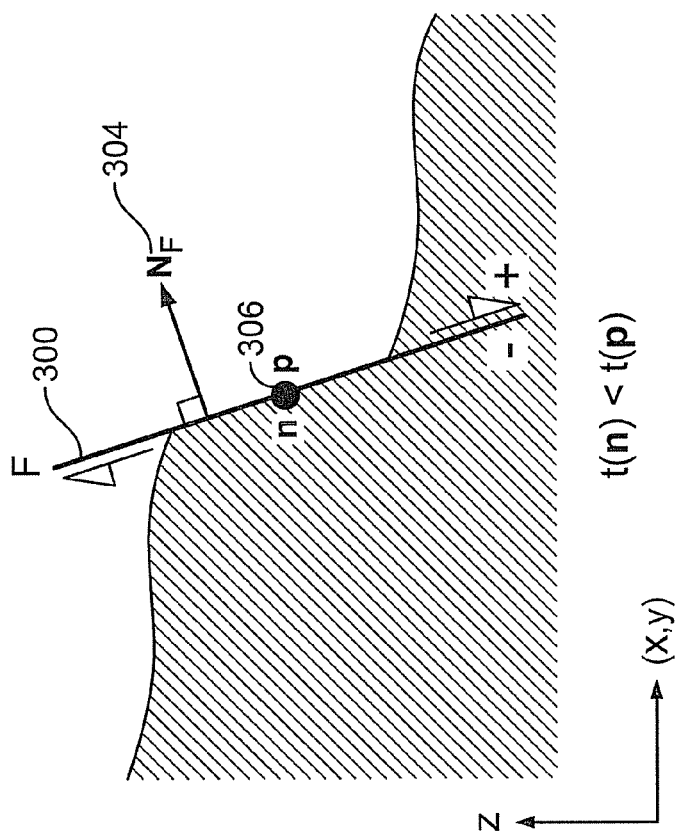

SYSTEMS AND PROCESSES FOR BUILDING MULTIPLE EQUIPROBABLE COHERENT GEOMETRICAL MODELS OF THE SUBSURFACE

CROSS-REFERENCE TO RELATED APPLICATIONS

This application is a continuation application of U.S. patent application Ser. No. 12/791,370, filed Jun. 1, 2010, now U.S. Pat. No. 8,600,708, which in turn claims the benefit of prior U.S. Provisional Patent Application No. 61/182,804, filed Jun. 1, 2009, both of which are incorporated by reference herein in their entirety.

FIELD OF THE INVENTION

The invention pertains to the general field of modeling stratified terrains in the subsurface.

More precisely, new techniques are proposed for the purpose of modeling the geological horizons and the fault network. Contrary to other methods, the proposed new methods allow the geological consistency of the geometry of these horizons and faults to be guaranteed. Moreover, the proposed modeling technique allows the geometrical uncertainties to be taken into account and to stochastically generate a plurality of equiprobable models honoring coherency constraints.

BACKGROUND OF THE INVENTION

There are many sources of uncertainties in modeling geological data. Uncertainties may include, for example, the following:

The location of each point in a subsurface terrain may have an uncertainty approximately proportional to the wavelength of the received seismic signals reflected from the subsurface point. Since the wavelengths of recorded seismic signals are often approximately 30 meters, the magnitude of the uncertainty of each subsurface point in such a case may be approximately 60 meters, a significant value.

The locations of sampling points on horizons and faults may be derived based on an estimate of seismic velocities. In practice, seismic velocities may only be known approximately. As a consequence, the locations of the sampling points derived therefrom are uncertain.

A particular type of sampling point on horizons called "well markers" is located at the intersections of well paths and horizons or faults. However, the geometry of the well path that defines these well markers may only be known approximately. As a consequence, the location of well markers is uncertain, which in turn causes the location of the horizons intersected thereby to be uncertain.

When seismic data is uncertain, a model computed using the data may also be uncertain.

There is a great need in the art for a mechanism to accurately model seismic data, which itself includes inherently inaccurate information.

SUMMARY OF THE INVENTION

Embodiments of the invention provide a system and method for modeling stratified terrains of a geological subsurface including geological horizons and fault networks. The geological coherency of the geometry of horizons and faults may be preserved. Moreover, embodiments of the invention provide modeling techniques that account for geometrical uncertainties in modeling data. In one embodiment of the invention, a plurality of equiprobable coherent models may be generated, each model corresponding to a different one of a plurality of equal probable solutions to uncertain data.

The geometry of a subsurface may be represented by an implicit function for example t(x,y,z) representing the geological time of deposition of the particle of sediment which corresponds to the current geological location (x,y,z). Horizons typically correspond to level surfaces of t(x,y,z) and faults typically correspond to the discontinuities of t(x,y,z). According to some embodiments of the invention, the following may be achieved:

optimal scaling of the geological-time function;
modeling geological properties, for example, the style of faults (e.g., normal or reverse faults);
Removing erroneous or "pathological" data from geological models such as local maxima and minima values of the geological-time function on level surfaces, which correspond to non-realistic geological horizons;
Generating a plurality of equiprobable coherent geometrical models, which may be derived by coherent stochastic perturbations of a preferred geometrical model; and
Displaying the results of stochastic perturbations.

In an embodiment of the invention, a computing system or one or more processor(s) may perturb an initial three-dimensional (3D) geological model using a 3D vector field. The for example coherent 3D vector field including 3D vectors may be generated where each 3D vector of the 3D vector field may be associated with a node of the initial 3D geological model and has a magnitude within a range of uncertainty of the node of the initial 3D geological model associated therewith. The coherent 3D vector field may be applied to the initial 3D geological model associated therewith to generate a perturbed or alternative 3D model. The perturbed 3D model may differ from the initial 3D geological model by a displacement defined by the 3D vector field associated with nodes having uncertain values. The perturbed 3D model may be displayed, stored, transmitted, etc.

In an embodiment of the invention, the computing system or processor(s) may apply separately one or more additional different 3D vector fields to the initial 3D geological model to generate a plurality of perturbed 3D models. The processor may generate the 3D vector field to be coherent such that the divergence of the 3D vector field is greater than (−1). The processor may generate the 3D vector field to be coherent such that for any infinitely small polyhedral volume having vertices and faces in the initial 3D geological model, the vertices are never displaced across any of the polyhedron faces. The processor may generate the 3D vector field to be equal to the gradient of a 3D scalar field. The processor may represent the 3D vector field at the nodes of a first mesh and represent the initial 3D geological model by a second mesh, wherein the processor displaces the nodes of a second mesh by applying the 3D vector field to the initial 3D geological model. The processor may generate the initial 3D geological model to have three dimensions and to generate the 3D vector field associated with each node of the 3D geological model to be defined by three values, each of which corresponds to a different one of the three dimensions of the 3D geological model. In some embodiments, the uncertainty at the nodes of the initial 3D geological model corresponds to uncertainty of a location of a fault. In other embodiments, the uncertainty at the nodes of the initial 3D geological model corresponds to uncertainty of a seismic velocity field. The uncertainty at the nodes may be proportional to the wavelength of data reflected from a subsurface geological feature. A receiving unit may receive a set of data reflected from a subsurface geological feature, wherein the initial 3D geological model uses the reflected set of data to model the subsurface geological feature. The processor may generate the vector field to be a combination of two or more distinct vector fields, each of which is associated with a different type of uncertainty. The processor may define each of the nodes of the initial 3D geological model to hold or be associated with a first parameter proportional to geological time and may perturb a set of the nodes by associating or adding a second parameter to each node, wherein the derivative of the second parameter relative to the first parameter is greater than (−1).

In an embodiment of the invention, a computing system or processor(s) may identify erroneous points in a geological model. A set of points of the geological model may be determined at which a geological-time function has a maximum or minimum value in a set of local regions. The model may be displayed on a user interface. The model may include symbols indicating the location of each point in the set of points. Input may be accepted from a user. The set of points may be refined according to input received from a user by adding or removing points in the set of points. A model generated using the refined set of points may be displayed to the user.

In an embodiment of the invention, a computing system may refine a first geological model. A first set of nodes may be identified at which a geological-time function has a local maximum or minimum value in the first geological model. A second set of nodes may be generated corresponding to the first set of nodes. The values of the geological-time function at the second set of nodes may be different than the values of the geological-time function at the first set of nodes. In the first geological model, the values at the first set of nodes may be replaced with the values at the second set of nodes. The first geological model in which the values of the first set of nodes are replaced with the values at the second set of nodes may be displayed.

In an embodiment of the invention, a computing system may generate a model by defining a combination of geological properties of the model. For each node of the model a value may be defined for each of a plurality of distinct geological properties associated with the model including, for example, the geological time. For each location of the model a linear combination of the values of the plurality of geological properties at neighboring nodes may be generated. The model may be displayed.

In an embodiment of the invention, a computing system, in a 3D subsurface model, may rescale a function of time of when a geological structure was originally formed in the Earth. A monotonically increasing function may be generated. A rescaled geological time function may be generated by applying a rescaling function to the monotonically increasing function. A 3D model of the structure may be displayed when it was originally formed. The 3D model may be defined by the rescaled geological time function in one of the three dimensions of the model.

In an embodiment of the invention, a computing system may model a probability of leakage across a fault in a model. For each fault node associated with the modeled fault, two or more nodes may be identified that are substantially adjacent to the fault node and that are located on opposite sides of the fault from each other. A region of the model representing a subsurface structure having hydrocarbons may be identified. The probability of leakage across the modeled fault may be determined for each fault node based on whether or not the two or more nodes are determined to be located in the identified region of the model. The probability of leakage associated with each fault node may be stored.

BRIEF DESCRIPTION OF THE DRAWINGS

The principles and operation of the system, apparatus, and method according to embodiments of the present invention may be better understood with reference to the drawings, and the following description, it being understood that these drawings are given for illustrative purposes only and are not meant to be limiting.

FIGS. 3A and 3B are schematic illustrations of normal fault and a reverse fault, respectively;

Figure 1:
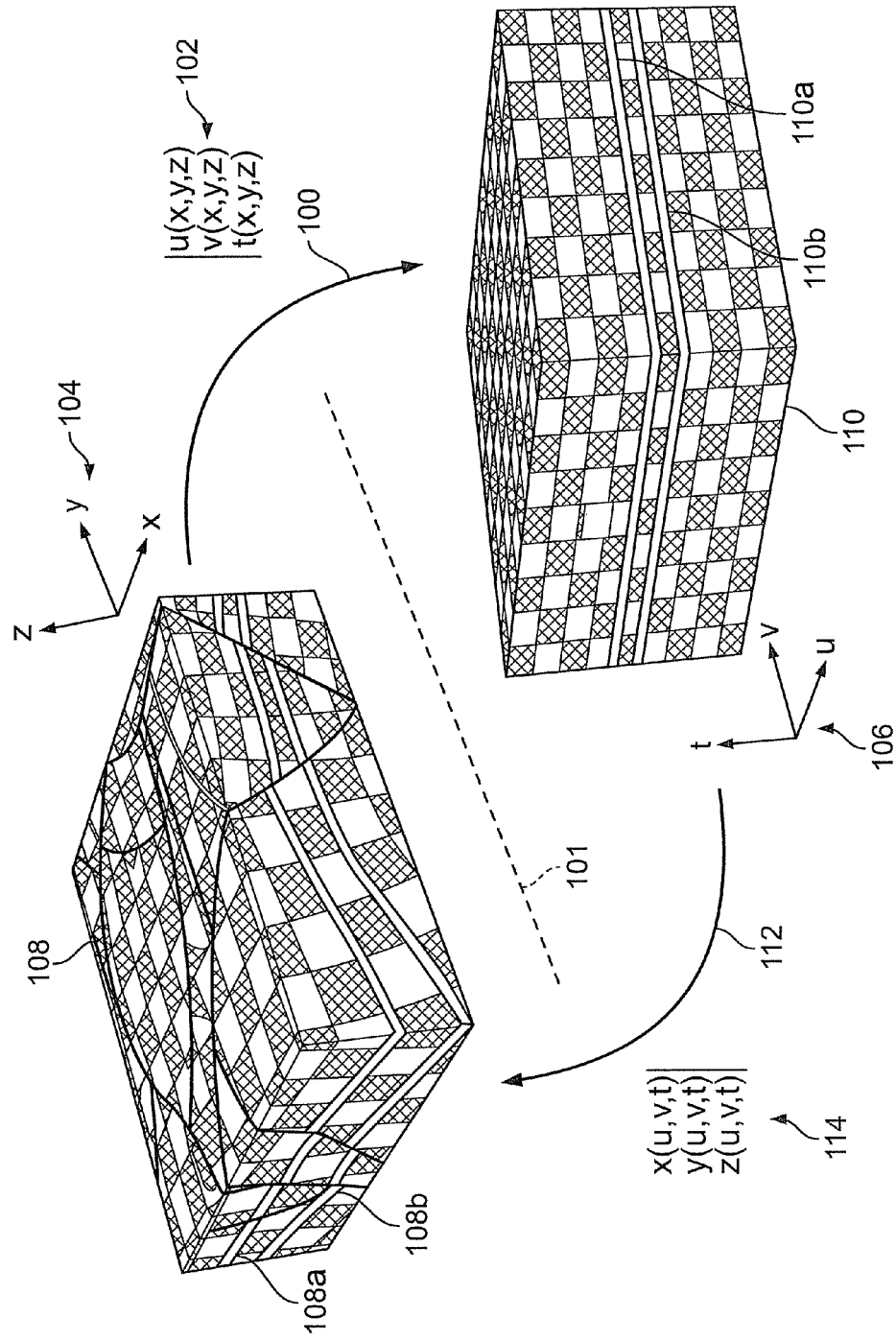
FIG. 1 is a schematic illustration of a uvt-transformation between two 3D spaces.

For simplicity and clarity of illustration, elements shown in the drawings have not necessarily been drawn to scale. For example, the dimensions of some of the elements may be exaggerated relative to other elements for clarity. Further, where considered appropriate, reference numerals may be repeated among the drawings to indicate corresponding or analogous elements throughout the serial views.

DETAILED DESCRIPTION

For the sake of clarity and for the purpose of simplifying the presentation of embodiments of the invention, the following preliminary definitions are given, although other definitions may be used:

Geological-Time

A particle of sediment in a geological terrain may be observed at a location in the subsurface. The location of the particle may be mathematically represented or modeled, e.g., by a vector, (x,y,z), in a three-dimensional (3D) space, such as the Cartesian coordinate system (of course, when modelling such particles, the position of many particles may be modeled together as for example a cell). When modeled, a data structure such as a node or cell may represent particles. The time when the particle of sediment was originally deposited may be referred to as the "geological-time" and may be represented or modeled, e.g., as a geological-time function of the current location of the particle, t(x,y,z). When used herein, a "current" location for a particle (or data structure representing one or more particles) or subsurface feature may mean the location of the item in the present day, relative to geological time. The actual geological-time of the deposition of particles may be difficult to determine and may be replaced, e.g., by any arbitrary monotonic increasing function of the actual geological-time. It is a convention to use an arbitrary increasing function, but similarly an arbitrary monotonic decreasing function may be used. The monotonic function may be referred to as the "pseudo-geological-time". Geological-time and pseudo-geological-time are referred to interchangeably herein.

Horizon, Fault and Unconformity

In stratified layers, horizons, faults and unconformities may be curvilinear surfaces which may be for example characterized as follows.

A horizon, H(t), may be a surface corresponding to a plurality of particles of sediment which were deposited approximately at substantially the same geological-time, t.

A fault may be a surface of discontinuity of the horizons that may have been induced by a relative displacement of terrains on both sides of such surfaces. In other words, the geological-time (t) of deposition of the sediments is discontinuous across each fault. Faults may cut horizons and may also cut other faults.

An unconformity may be a surface of discontinuity of the horizons that may have been induced by for example an erosion of old terrains replaced by new ones. In other words, similarly to faults, the geological-time (t) of deposition of the sediments is discontinuous across each unconformity. When discussed herein, unconformities are treated as faults: as a consequence, in this patent application, faults may include both real faults and unconformities. Alternatively, unconformities may be surfaces bounding a sequence of sedimentary layers and one specific geological-time function may be assigned to each such sequence.

Reference Horizons and Control-Points

The geological domain may be characterized by a series of "reference horizons" $\{H(t_1), H(t_2), \ldots, H(t_n)\}$, which may be separate geological layers with significantly distinct physical properties and associated with distinct geological-times of deposition $\{t_1, t_2, \ldots, t_n\}$, respectively. When discussed herein, the horizons are implicitly assumed to be sorted according to their geological-times of deposition so that $H(t_1)$ is assumed to correspond to the older sediments and $H(t_n)$ to the younger. In other words, the deposition time $t_i$ of $H(t_i)$ is older than the deposition time $t_{i+1}$ of $H(t_{i+1})$. In practice, each reference horizon $H(t_i)$ is observed on a set of sampling points referred to as "control-points" at which the geological-time function may approximate $t_i$ as closely as possible. Control-points may be a set of points generated from seismic data and well data which have been identified, e.g., automatically by a computer and/or manually by a user, as representing to the same horizon, fault, or other geological structure.

Level Surface

The geological domain may be defined in a 3D space by a given function of geological-time, t(x,y,z). The geological-time function t(x,y,z) may be monotonic, i.e., the gradient of the geological-time never vanishes and the function has no local maximum or minimum values. A level surface, $H(t_0)$, may be the set of points where the geological-time t(x,y,z) is equal to a given numerical value, $t_0$. Therefore, if the geological-time t(x,y,z) represents a pseudo-geological-time of deposition, then the level surface $H(t_0)$ of t(x,y,z) may be a geological horizon.

Various mechanisms are currently used for modeling sub-surface geological terrains:

Discrete-Smooth-Interpolation (DSI)

Discrete-Smooth-Interpolation (DSI) is a method for interpolating or approximating values of a function f(x,y,z) at nodes of a 3D mesh, M, while honoring a given set of constraints. The DSI method allows properties of structures to be modeled by embedding data associated therewith in a (e.g., 3D Euclidean) modeled space. The function f(x,y,z) may be defined by values at the nodes of the mesh, M. The DSI method allows the values of f(x,y,z) to be computed at the nodes of the mesh, M, so that a set of one or more (e.g., linear) constraints are satisfied.

Constraints are typically classified by one of the following types:

1) "Soft" constraints may require the function f(x,y,z) to approximate a constraint. For example, a soft constraint may be that f(x,y,z) takes a given value at a given sampling point. Since this constraint is "soft", f(x,y,z) may take a least squares approximation of the given value;
2) "Hard" constraints may require that the function f(x,y,z) exactly honors the constraints. For example, a hard constraint may include inequality constraints; and
3) "Smoothness" constraints may require that the function f(x,y,z) varies as smoothly as possible while honoring the soft and hard constraints.

Examples of DSI constraints include, for example:

The Control-Point constraint which may require that, at a given location $(x_0,y_0,z_0)$ the value of $f(x_0,y_0,z_0)$ is equal to a given value $f_0$;

The Control-Gradient constraint specifying that, at a given location $(x_0,y_0,z_0)$ the gradient of $f(x_0,y_0,z_0)$, $(\nabla fx_o, \nabla fy_o, \nabla fz_o)$, is equal to a given vector $G_0$;

The Gradient-Direction constraint specifying that, at a given location $(x_0,y_0,z_0)$, the gradient of $f(x_0,y_0,z_0)$, $(\nabla fx_o, \nabla fy_o, \nabla fz_o)$, is parallel to a given vector $D_0$; and The Delta constraint specifying that, given two locations $(x_0,y_0,z_0)$ and $(x_1,y_1,z_1)$ in the studied domain, the difference between $f(x_0,y_0,z_0)$ and $f(x_1,y_1,z_1)$ may either be equal to, lesser than, or greater than, a given value D.

GeoChron Model

When a layer of particles was deposited during a certain time period in the past, the layer typically had uniform properties, such as particle density, porosity, etc. However, through time, the layers erode and are disrupted by faults, tectonic motion or other sub-surface movements, which result in uneven and discontinuous layers. As compared to the uniform layers of the past, the discontinuous layers of the present are difficult to model. Accordingly, the "GeoChron" model has recently been developed to operate between two 3D spaces. The 3D spaces or models may be, for example:

A 3D space, G, representing a model of the current subsurface features (e.g., the current modeled locations of particles of sediment in the terrain). The modeled location of each particle may be represented by the coordinates (x,y,z), where (x,y) may describe the geographical coordinates of the particle (e.g., latitude and longitude) and (z) may describe the altitude or distance below a surface level; and A 3D space, G*, representing modeled locations of particles of sediment at the time when the particles were originally deposited. The modeled location of each particle may be represented by the coordinates (u,v,t) where (t) may be the geological-time of deposition of the particle and (u,v) may be the paleo-geographical coordinates of the particle at geological time (t).

The GeoChron model defines a transformation between the two 3D spaces. The transformation may be referred to as a "uvt-transformation". The GeoChron model applies the forward uvt-transformation to transform the current model (a model of the subsurface features current in time) in G-space to the original deposition model in G*-space and applies the inverse uvt-transformation to transform the original deposition model in G*-space to the current model in G-space. Accordingly, the GeoChron model may execute complex computations on the original deposition model in G*-space where geological properties are typically uniform and simple to manipulate relative to the discontinuous current model in G-space. Once the original deposition model is sufficiently accurate, the GeoChron model may transform the model back to the current time domain to generate the current model.

Reference is made to FIG. 1, which schematically illustrates a uvt-transformation between the two 3D spaces G and G* (separated by dashed line 101).

The "forward" or "direct" uvt-transformation 100 defines parametric functions 102 $\{u(x,y,z), v(x,y,z), t(x,y,z)\}$, which transform each point (x,y,z) of the geological G-space 104 to a point $\{u(x,y,z), v(x,y,z), t(x,y,z)\}$ in the depositional G*-space 106. The forward uvt-transformation 100 may be represented, for example, as follows:

$$(x, y, z) \xrightarrow{UVT} \{u(x, y, z), v(x, y, z), t(x, y, z)\} \quad [1]$$

The forward uvt-transformation 100 transforms each horizon H(t) 108a and 108b of model 108, in the G-space 104, into a level horizontal plane H*(t) 110a and 110b of model 110, respectively, in the G*-space 106. In the G*-space 106, horizons 110a and 110b of model 110 are simply the images of level surfaces of the function t(x,y,z) representing the geological-time at location (x,y,z) in the G-space. That is, since a horizon models a set of particles of sediment that was uniformly deposited in time, each horizon is constant in time when the particles modeled thereby were originally deposited (i.e., in G*-space 106). Therefore, each of horizons 110a and 110b in G*-space 106 may be uniquely defined by a single time, (t).

Conversely, the "inverse" or "reverse" uvt-transform 112 defines parametric functions 114 $\{x(u,v,t), y(u,v,t), z(u,v,t)\}$, which transform each point (u,v,t) of the depositional G*-space 106 to a point $\{x(u,v,t), y(u,v,t), z(u,v,t)\}$ in the geological G-space 104. The inverse uvt-transformation 112 may be represented, for example, as follows:

$$(u, v, t) \xrightarrow{UVT^{-1}} \{x(u, v, t), y(u, v, t), z(u, v, t)\} \quad [2]$$

In practice, such a reverse transformation is restricted to a part G*0 of the G*-space called the holostrome and corresponding to the particles of sediment which can actually be observed today in the G-space.

Using the forward uvt-transform 100, e.g., defined in equation (1), and the inverse uvt-transform 112, e.g., defined in equation (2), any geological property may be modeled in one of the two spaces (G-space 104 or G*-space 106) and the result of the property modeled in the one space may be transferred to the other space (G*-space 106 or G-space 104, respectively). In practice, a geological property is typically modeled in the space where modeling the property is the simplest.

Modeling the Horizons

The following modeling process may generate the geological-time function t(x,y,z) in the geological domain of interest (e.g., the domain being modeled, which may be generated automatically or may be selected by a user, as described herein). An approximation method, such as for example, the DSI method or a radial approximation method may be used.

1) The geological domain of interest may be covered by a 3D mesh $M_1$ including adjacent 3D polyhedral cells whose edges are tangent to fault surfaces but do not cross these fault surfaces. In a preferred embodiment, the cells may include tetrahedra or hexahedra shaped cells, although other shapes may be used.
2) The geological-time function, t(x,y,z), is assumed to be fully defined at the vertices (i.e., the nodes) of mesh $M_1$. The values of the time function t(x,y,x) sampled at the vertices of the cell containing the point (x,y,z) may be used to locally (e.g., linearly) approximate the geological-time function, t(x,y,x).
3) A "control-points" constraint may be used to require that, for each sampling point (x,y,z) located on a reference horizon $H(t_i)$, the geological-time function t(x,y,z) will be approximately equal to a constant value, $t_i$.
4) Constraints may be used to require that the geological-time function t(x,y,z) is as smooth as possible.
5) The approximation method may then be applied to compute the values of t(x,y,z) at the vertices of mesh $M_1$ while honoring the requirements of the aforementioned constraints. For example, the DSI method or any other equivalent approximation method may be used.

The geological-time function t(x,y,z) is initially defined only at the vertices of mesh $M_1$. The geological-time function t(x,y,z) for other points (x,y,z), e.g., located inside a cell of mesh $M_1$, may be locally approximated from the defined values of t(x,y,z) at the vertices.

Figure 2:
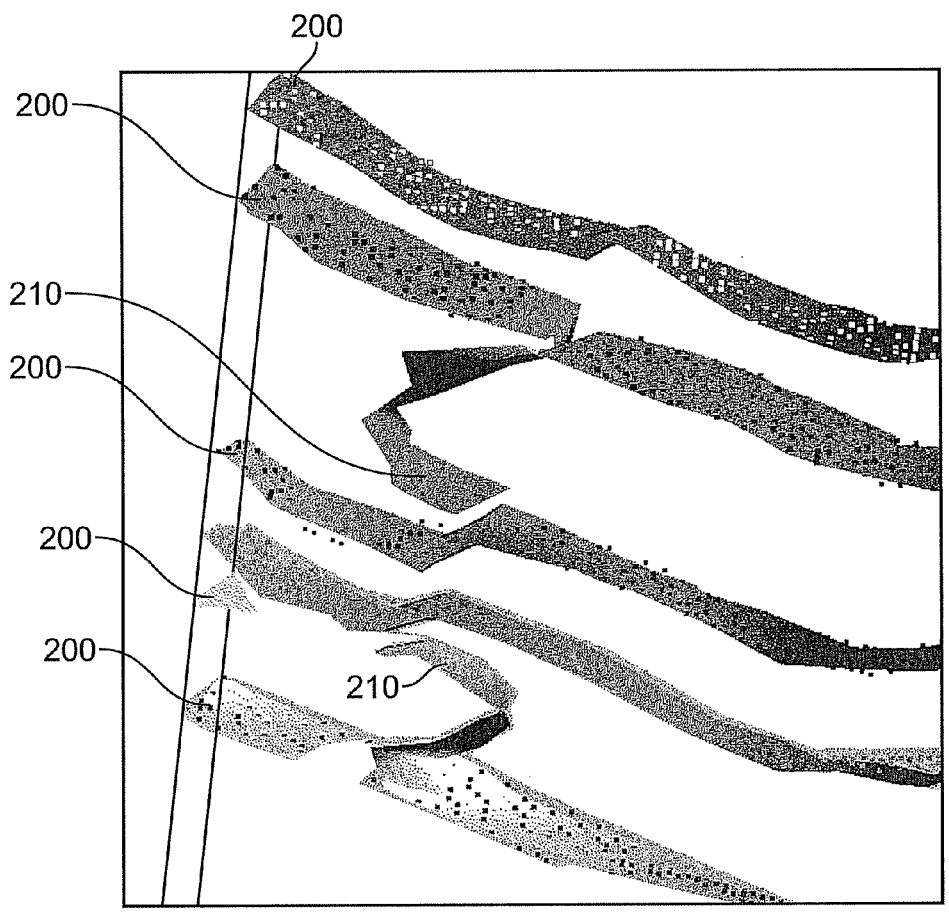
FIG. 2 is a schematic illustration of a plurality of horizons.

Although this process models the geological-time function t(x,y,z), problems may arise in the time function. Since each horizon represents a set of particles that were uniformly deposited in time (at the time of deposition), each horizon should be a level surface across which the geological-time function is substantially constant. The geological-time function t(x,y,z) preferably has no local maximum or minimum values. A local maximum or minimum value at a point implies that the gradient of the geological-time function vanishes at these points, which in turn implies that the geological-time stops at these points, a clear violation of the forward moving principle of time. The aforementioned process of steps for modeling horizons may provide such a violation. Due to outlier data and rapid lateral variations in the thickness of geological layers, the process may generate a geological-time function t(x,y,z) having local maximum or minimum on horizons (i.e., level surfaces). Reference is made to FIG. 2, which schematically illustrates a plurality of horizons $H(t_i)$ 200 generated by this process. Since each horizon $H(t_i)$ represents a layer of particles that were uniformly deposited in time, in G-space each horizon should be a level surface across which the geological-time function t(x,y,z) should be constant. However, the horizons $H(t_i)$ 200 in FIG. 2 are not level surfaces. The horizons $H(t_i)$ 200 include bumps 210 generated by the local maxima and minima in the geological-time function t(x,y,z), which may render this geological-time function incorrect.

Accordingly, there is a great need in the art for a mechanism to model a valid geological-time function, t(x,y,z), that does not include local maximum or minimum in the studied domain.

GeoChron Model for Faults

Figure 6A:
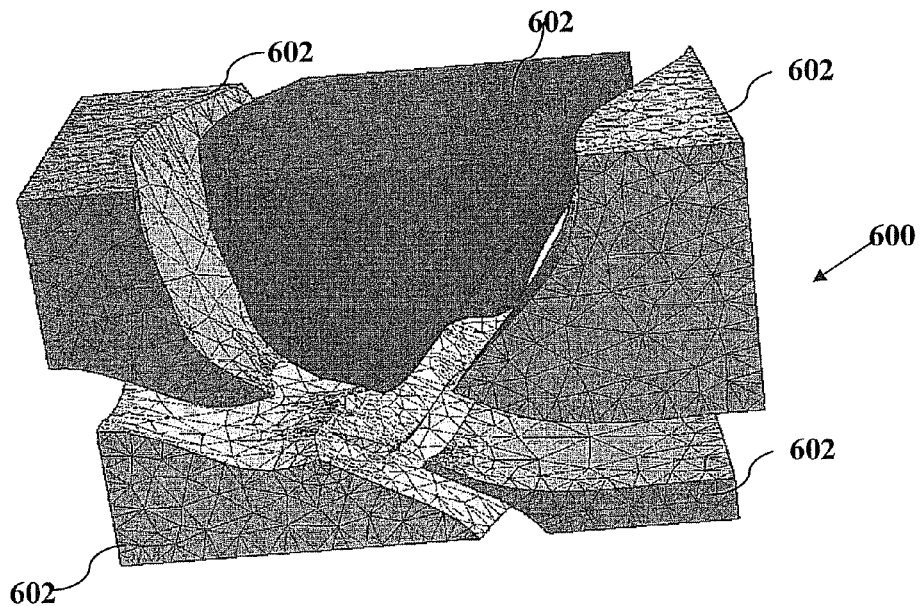
FIGS. 6A and 6B are schematic illustrations of exploded and assembled perspective views of a mesh, respectively, according to an embodiment of the invention.
Figure 6B:
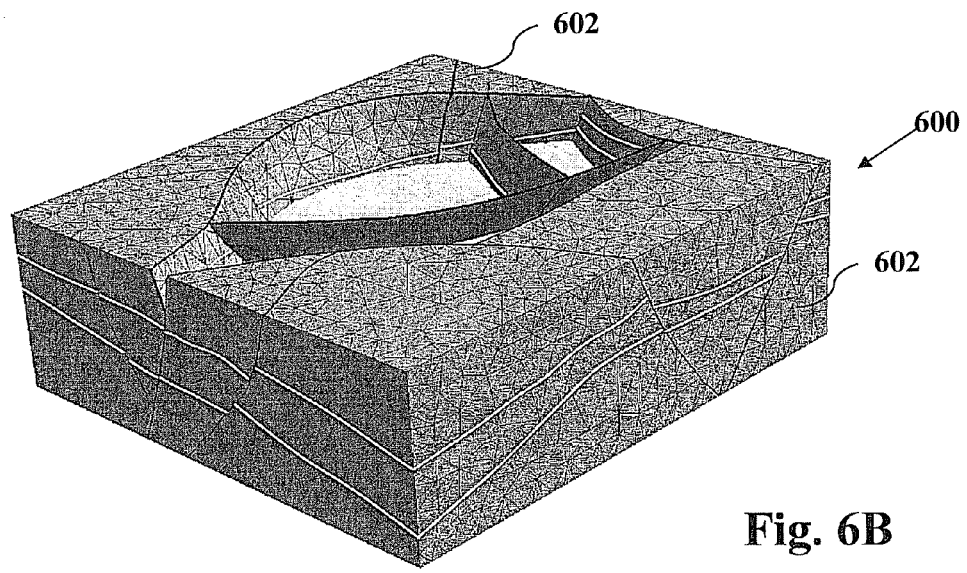
Figure 6C:
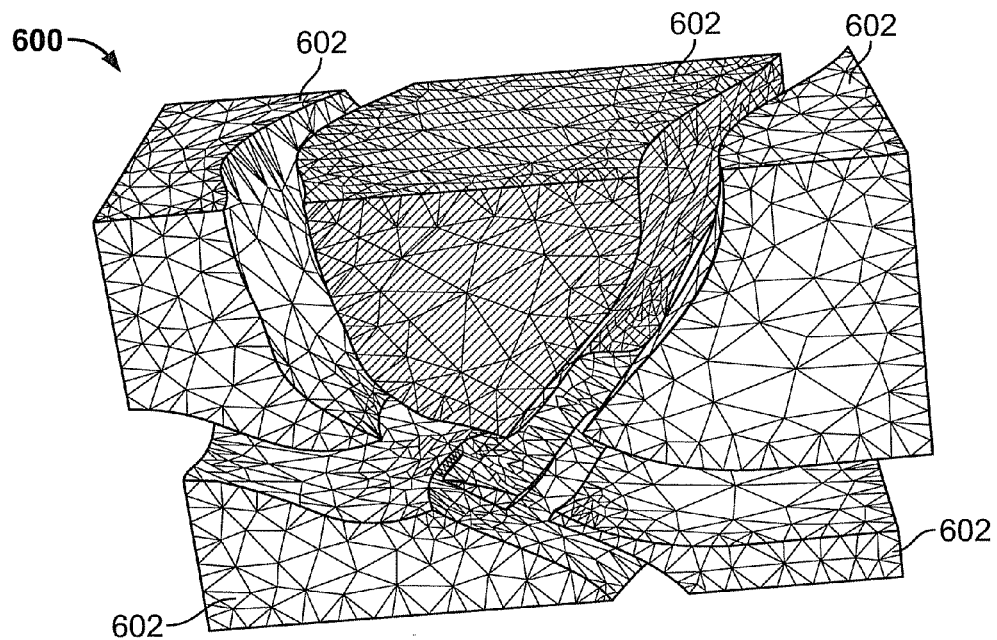
FIGS. 6C and 6D are alternate views of the illustrations of FIGS. 6A and 6B, respectively.
Figure 6D:
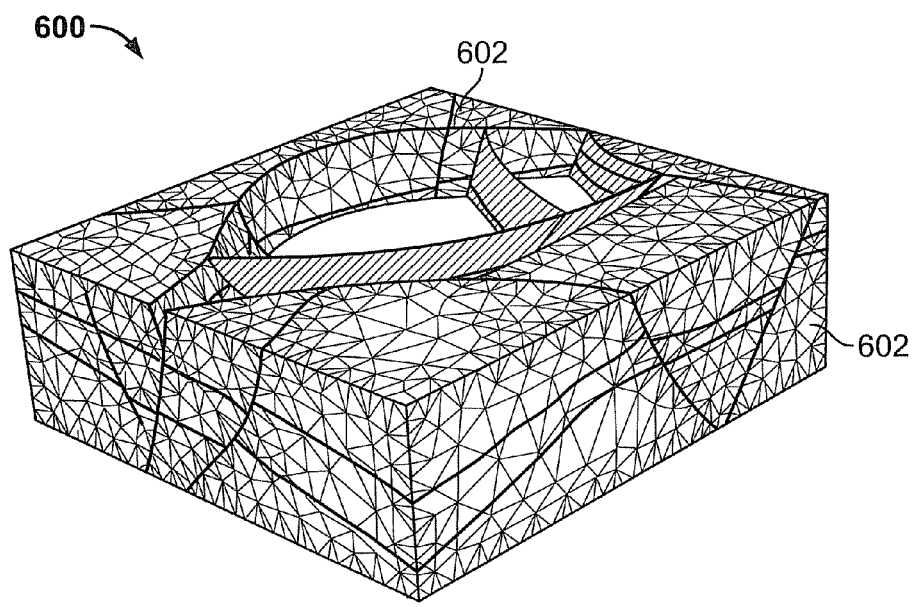

To model discontinuities in a geological-time function t(x, y,z) across faults a discontinuous mesh $M_1$ may be used. As shown in FIGS. 6A and 6B, a mesh 600 may be discontinuous, for example, in the following sense:

Edges of cells in the mesh $M_1$ may be tangential to fault surfaces but may not cross these fault surfaces.

Collocated vertices of adjacent cells on both sides of a fault may be duplicated in order to store distinct values of geological properties such as, for example, t(x,y,z) at these vertices for each side of the fault. Therefore, discontinuity in geological properties across the fault may be modeled.

In a subsurface terrain, there are many types of faults, for example, branching faults, crossing faults, normal faults, reverse faults, etc. Current modeling mechanisms do not describe the structural behavior of faults. Accordingly, there is a great need in the art for a mechanism to model not only the location of faults, but the structural behavior of faults themselves. Accordingly, there is now provided with embodiments of this invention an improved mechanism to model both the location of faults and the structural behavior of faults themselves (e.g., as discussed in the section entitled "Unified Modeling of a Geological-Time Function Integrating Multiple Sources of Information") for effectively overcoming the aforementioned difficulties and longstanding problems inherent in the art.

Geometrical Uncertainties and Preferred-Model

There are many sources of uncertainties in modeling geological data. When geological data is uncertain, a model computed using the data may be uncertain. For models having an uncertain property (e.g., the seismic velocity), a plurality of different models may be generated, each alternative model having a different one of the possible solutions to the uncertain property. Typically, each alternative model is generated by applying different perturbations to an initial model. Alternative models may be generated according to principles of perturbation theory and are thereby referred to as 'perturbed' models and the disturbance applied to the initial model are referred to as a 'perturbation'.

Modeling Uncertainties on a Surface-Based Model

Common approaches to modeling the subsurface include building a set of surfaces corresponding to faults and reference horizons. For example, these surfaces may include faces or portions of adjacent polyhedra cells. A model may be "perturbed" by, for example, moving each node (n) in the model, for example, by amount $e(x_n,y_n,z_n|m)$ in direction D(n). To perturb such a geometric model, the following steps have been proposed.

1) Select a random number (m) to be used as a "seed" by a random function generator.
2) For each surface S of a model (where S may be a horizon or a reference horizon):
   a. Define a mesh M to be the set of nodes corresponding to vertices of polygonal facets of S.
   b. Use a stochastic simulator to generate an equiprobable occurrence $e(x_n,y_n,z_n|m)$ of a scalar field modeling the magnitude of the perturbation at location $(x_n,y_n,z_n)$ of node (n) belonging to mesh M.
   c. For each node (n) of M:
      i. Choose a constant (non stochastic) direction of perturbation D(n)
      ii. Move the node in the direction of D(n) with a magnitude of displacement equal to $e(x_n,y_n,z_n|m)$.
3) As far as a new stochastic occurrence of the geometric model is required, return to step (1)
4) Stop Models perturbed by this process are often geologically incorrect or "incoherent". For example:

Faults may collide;
Horizons may cross each other; and
The connection between faults and horizons may have gaps.

From a structural geological perspective, such incorrect occurrences render the models difficult to use.

Modeling Uncertainties on Horizons of a GeoChron Model

Geological horizons having uncertainties may be modeled as level surfaces of a geological-time function t(x,y,z). For example, the geological horizons may be modeled using the GeoChron model as discussed in the section entitled "Modeling the Horizons." The following steps are proposed to stochastically model the uncertainties related to the position of horizons:

1) Generate a model of the geological horizons using a geological-time function t(x,y,z) defined at nodes of a 3D mesh $M_1$.
2) Select a random number (m) to be used as a "seed" by a random function generator.
3) Use a stochastic simulator to generate an equiprobable occurrence e(x,y,z|m) of an error, i.e., the magnitude of the perturbation for the occurrence, (m), affecting the pseudo-geological-time at any node of the mesh $M_1$ in the studied domain.
4) At each node of the mesh, compute the pseudo-geological-time t(x,y,z|m) associated with the model (m) as follows:

$$t(x,y,z|m)=t(x,y,z)+e(x,y,z|m)$$

5) If a new equiprobable model of stochastic horizons is needed, return to step (2) above. If no new equiprobable model of stochastic horizons is needed, proceed to step (6).
6) Stop Models perturbed by this process are often geologically incorrect. For example, the resulting geological-time function t(x,y,z|m) may have local minima or maxima across horizons. As a consequence, some "horizons" corresponding to level surfaces of t(x,y,z|m) may include closed surfaces around these local minima or maxima.

Modeling Uncertainties on Faults of a GeoChron Model

Faults having uncertainties may be modeled by generalizing the aforementioned process described in the section entitled, "Modeling Uncertainties on a Surface-Based Model", for example as follows.

1) For each fault F:
   a. Assume that F includes of a set of polygonal (e.g., triangular) facets.
   b. Define a set $M_F$ to be a set of vertices of the triangles of F.
   c. Assume that each vertex (n) in $M_F$ may be perturbed in a given constant direction D(F).
2) Cover the studied domain with a 3D mesh M made of tetrahedral cells, such that the mesh M contains $M_F$.
3) Select a random number (m) to be used as a "seed" by a random function generator.
4) Build a copy M(m) of the 3D mesh M.
5) For each fault F:
   a. Define the direction of the stochastic displacement v(n|m) of each vertex (n) of F in the direction of D(F). Define the magnitude of the stochastic displacement v(n|m) of each vertex (n) of F as a random spatially-correlated scalar function e(n|m). For example, v(n|m)=e(n|m)●D(F), where the symbol "(e●D)" represents the product of a scalar (e) by a vector (D). For each tetrahedron cell $T(n_1,n_2,n_3,n_4)$ in M, apply a constraint to require, for any displacement of nodes $n_1$, $n_2$, $n_3$ and $n_4$ by $v(n_1|m) \bullet D(F)$, $v(n_2|m) \bullet D(F)$, $v(n_3|m) \bullet D(F)$, $v(n_4|m) \bullet D(F)$, respectively, that the sign of the volume of tetrahedron cell t (i.e., (+) and (−)) preferably does not change. Accordingly, the cells of a tetrahedral mesh are not inverted.
b. Approximate $v(n|m)$ on M in 3D for each n and m.
c. Move the nodes n of M according to the 3D approximation of $v(n|m)$. If a node n is located on both the fault F and on another fault P, e.g., on which F branches, the direction vector D(F) may be projected onto fault P before the nodes are moved. This will prevent the nodes n from modifying the general shape of P.
6) If a subsequent stochastic occurrence, (m), is needed, repeat step (3) above to generate a new equiprobable model of stochastic horizons. Otherwise, proceed to step (7).
7) Stop Some steps are taken in this process to ensure the new equiprobable models are geologically correct. For example, as described above in step 5(b), an approximation constraint may be used to ensure volumes of tetrahedral cells do not change sign. A post processing of the interpolation result, as described above in step 5(d), may be used to ensure that the displacement vector for fault branchings is projected onto main faults. However, this process may still suffer from the following drawbacks:
  Only a mesh composed of tetrahedral cells, not a general mesh with other types of cells, may be used because the process requires a tetrahedral tessellation of the studied domain.
  A single (constant) predefined direction of displacement D(f) is used for each fault.
  Since the direction of displacement is constant, projections of displacement vectors at fault branchings are made after approximation. This may result in abrupt changes in the shape of branching faults near main faults.

Modeling Uncertainties on Horizons of a Potential Field Model

Another mechanism for modeling uncertainties in geological horizons uses potential fields. This mechanism has several drawbacks:
  Initially, a "covariance" function defining the stochastic behavior of the horizons may be estimated. However, there is typically insufficient data collected in seismic surveys to accurately estimate the covariance function.
  When modeling a complex network of hundreds of faults, modeling each fault may be impractical.
  Taking into account the uncertainty of faults and fault positioning may be difficult.
  Ensuring that the horizons corresponding to level surfaces of the potential field are open surfaces may be difficult. Due to outlier data or due to rapid lateral variations of the thickness of geological layers, some level surfaces of the potential field may have local maxima or minima.

The aforementioned techniques allow the inherent uncertainty in seismic data to be modeled. If a model is uncertain, a unique solution is typically indeterminate at one or more nodes of the model and at best, a range of possible solutions having an equal probability of being correct may be determined at each node. These techniques propose perturbing the model for each equal probability solution.

Each node may have a different level of uncertainty. The greater the uncertainty of a node, the greater the difference between equal probability solutions. For example, if the location of a first fault defined on a first node is highly uncertain, the possible locations of the first node may span a great distance. Conversely, if the location of a second fault defined on a second node is highly certain, then the possible locations of the second node will be bound to a small region. Accordingly, to generate a new model, each node, n, may be moved by a different distance, $e(n|m)$, based on the level of uncertainty at that node.

A plurality of models having equal probability of occurrence is generated to view each possible solution to an uncertain problem, where such information of the possible solutions would otherwise have been lost. However, these mechanisms still discard significant data. These mechanisms move all nodes of a fault surface F in the same (non-stochastic) direction, D(F), i.e., in one dimension. However, since uncertainties, e.g., fault location or other parameters, occur in three dimensions and are typically not limited to one, moving all nodes of a surface in only one dimension may neglect the uncertainties of other dimensions. Accordingly, information pertaining to alternative equal probability solutions for uncertainties in other dimensions will never be displayed to a user.

Accordingly, there is a great need in the art for a mechanism to model equal probable solutions for uncertainties in greater than one dimension, while preserving the geological coherency of these solutions.

For simplicity and clarity of illustration, embodiments of the invention are described in two separate sections (elements from each may of course be combined in some embodiments).
  The first section, entitled 'Generating a Coherent Preferred Model', describes mechanisms which may be used according to embodiments of the present invention to generate a structurally coherent "preferred-model" of horizons and faults.
  The second section, entitled 'Modeling Uncertainty Related To Geological-Time Function', describes mechanisms which may be used according to embodiments of the present invention to generate a series of equiprobable geometrical models including of coherent perturbations of the preferred-model.

Embodiments of methods for processing subsurface data are described herein. Typically, input data to these methods includes, for example, seismic data, well data, acoustic data, or other data, which may be used by processes described herein, and other known processes, to model subsurface geological features.

Generating a Coherent Preferred Model

Rescaling the Geological Time Function

Geological-time values associated with reference horizons are typically chosen arbitrarily, for example, where geological-time values increase as the assumed deposition time increases or alternatively, where geological-time values decrease as the assumed deposition time increases. However, choosing these reference values arbitrarily may cause numerical instabilities induced, e.g., by the presence of strong variations of thickness between adjacent layers bounded by reference horizons. Embodiments of the invention include rescaling an initial geological-time function $t(x,y,z)$ based on for example arbitrary reference values. For example, the rescaled geological-time function $t(x,y,z)$ may be defined so that the norm of the gradient of the rescaled geological-time function $t(x,y,z)$ remains, on average, approximately constant in the studied domain.

The initial "guess" or geological-time function based on arbitrary reference values $t_0(x,y,z)$ may be rescaled by a rescaling function $F(t_0)$ to generate a rescaled geological-time function $t=F(t_0)$, e.g., described as follows.

$$t(x,y,z)=F(t_0(x,y,z)) \quad [3]$$

The rescaling function $F(t_0)$ may transform the initial geological-time function $t_0(x,y,z)$ into a rescaled geological-time $t(x,y,z)$. In one embodiment of the invention, the norm of the gradient of the rescaled geological-time function may be, on average, approximately equal to a given positive constant, g. The constant, g, may be, for example, 1, although other values may be used.

The gradient of the rescaled geological time $t(x,y,z)$ may be derived at any location $(x,y,z)$ from the gradient of the initial geological time $t_0(x,y,z)$, for example as follows:

$$\text{grad } t(x,y,z)=F'(t_0(x,y,z)) \bullet (\text{grad } t_0(x,y,z)) \quad [4]$$

where $F'(t_0)$ represents the derivative of $F(t_0)$ and "$(a \bullet v)$" represents the product of a scalar (a) by a vector (v).

If the norm of the gradient of the refined geological-time function, $\|\text{grad } t(x,y,z)\|$, is chosen to be equal to 1, on average, then equation [4] simplifies to the following equation:

$$F'(t_0(x,y,z))=1/\|\text{grad } t_0(x,y,z)\| \text{ on average} \quad [5]$$

For the sake of clarity, the following notations are used here:
$t(i)=t_i$
$t_0(i)=t_0 i$
$D(i)=$ the average of the ratio $\{1/\|\text{grad } t_0(x,y,z)\|\}$ over the reference horizon $H(t_0 i)$ Using this notation, equation [5] may be rewritten, approximately, as:

$$F'(t_0 i)=D(i) \quad [6]$$

Accordingly, an optimal rescaling function $F(t_0)$ may be defined by solving differential equation [6] by numerical integration. To solve differential equation [6] numerically, numerical techniques may be used, which are known in the art such as, for example, a Euler method or a Runge-Kutta method.

In one embodiment of the invention, the following steps may be used to transform initial geological times $\{t_0 1, t_0 2, \ldots, t_0 n\}$ of the initial arbitrary geological-time function $t_0(x,y,z)$ of the reference horizons into optimally rescaled times $\{t_1, t_2, \ldots, t_n\}$ of the rescaled geological time $t(x,y,z)$ (other operations or series of operations may be used in different embodiments).

1) initialize $i=1$;
2) initialize $t(1)$=arbitrary geological time (e.g., $t(1)=0$);
3) $t(i+1)=t(i)+\{t0(i+1)-t0(i)\}*(D(i+1)+D(i))/2$;
4) $i=i+1$;
5) if($i<=n$) return to step (3), otherwise proceed to step (6); and
6) Stop.

Embodiments of the invention provide a system and method for improving the accuracy of a model, for visualizing geological data, by providing a more realistic geological-time function of the data. The geological-time function may be rescaled so that the norm of its gradient remains, on average, approximately constant or uniform throughout the model. Input data to the model may include seismic waves that after being transmitted by a transmitter (e.g., transmitter 190 in FIG. 10) are received by a receiving device (e.g., receiver 120 in FIG. 10). A processor may input the collected data to compute a geological-time function coinciding therewith. However, the geological-time function may be inaccurate (e.g., the level set of the geological-time function which represents a reference horizon may be greater than a predetermined distance from data points) at points computed using data collected, which were reflecting for example from regions in the subsurface having large gradients in thickness between adjacent layers bounded by reference horizons. To minimize such inaccuracies of the geological-time function, a rescaling function may be applied to an arbitrary monotonically increasing geological-time function to generate a regularly increasing function of time. The rescaled geological-time function may be stored (e.g., as data 155 in memory 150 of FIG. 10) and used to generate models, as described for example, in the sections entitled, "Modeling Uncertainties on Horizons", "Modeling Uncertainty Related to the Positioning of Particles of Sediment", and "Modeling Uncertainty on Faults and Horizons Jointly". Models generated by the rescaled geological-time function may be more accurate than conventional models generated by an arbitrary geological-time function, which is not optimally scaled. Accordingly, a more accurate visualization of the subsurface terrain may be presented to a user (e.g., on display 180 of FIG. 10).

Unified Modeling of a Geological-Time Function Integrating Multiple Sources of Information The geometry of geological subsurfaces, defined by a geological-time function $t(x,y,z)$, is both complex and poorly known, for example, as a result of limited and sparse data provided by heterogeneous sources of information. Due to a lack of generality, methods known in the art typically use only part of all the available information to model the subsurface, thereby neglecting other important sources of information.

In contrast to methods known in the art, embodiments of the invention provide a system and method for integrating multiple sources of information to model a geological-time function in a unified way.

Sources of information frequently used for modeling geological-time functions, e.g., with level surfaces correspond to geological horizons, may include, for example, the following:

Sampling points: Each reference horizon $H(t_i)$ may be defined by a set $SH(t_i)$ of sampling points $\{s_1, s_2, \ldots\}$ located on horizon $H(t_i)$. For example, these sampling points $\{s_1, s_2, \ldots\}$ may be generated by methods known in the art such as by "auto-picking", in which the sampling points are automatically extracted from a given seismic cube (or cell, node, vertex, edge, column or other feature of the mesh). To use the sampling point information, the model may specify that, for any sampling point (s) in a set $SH(t_i)$, the geological-time function $t(x,y,z)$ is equal to $(t_i)$ at location (s). Sampling point information is typically the most basic source of information and is often the only source of information taken into account by conventional methods of modeling the geological-time function. According to embodiments of the invention, sampling point information is just one of the multiple sources of information that may be used to model the geological-time function.

Geometry of Faults: In a subsurface terrain, there are different types of faults, for example, normal faults and reverse faults, etc. Conventional modeling mechanisms typically model spatial characteristics of the subsurface terrain, but do not model the structural behavior of faults. Embodiments of the invention provide a mechanism to model not only the location of faults, but also the structural behavior of faults themselves.

The geological-time function is typically discontinuous across faults. Such discontinuities may be located and faults may be spatially modeled. However, faults are complex structures with many properties. Simply locating the faults in a subsurface may neglect the geological behavior of the faults. For example, fault surfaces are rarely exactly vertical and, depending on the relative location of an arbitrary horizon $H(t_0)$ on both sides of a fault, the fault may be a normal fault or a reverse fault. Reference is made to FIGS. 3A and 3B, which schematically illustrate a normal fault 300 and a reverse fault 302, respectively. Consider the vector $N_F$ 304 which is, on average, orthogonal to a fault F 300 or 302 and such that its vertical component is positive. Such a vector $N_F$ 304 allows the positive and negative sides of fault F 300 or 302 to be defined as follows: across the surface of faults F 300 and 302 in the direction of vector $N_F$ 304, the side of fault 300 or 302 changes from negative to positive. Two points (n) and (p) are collocated at any arbitrary fault point 306 along fault F 300 or 302 and on the negative and positive side of F, respectively. The geological-time function of the points, t(n) and t(p), may be defined. The geological behavior of the faults 300 or 302 may be determined as follows:

If t(p) is greater than t(n), then F is a "normal" fault 300;
If t(p) is less than t(n), then F is a "reverse" fault 302.

Normal faults 300 and reverse faults 302 may be alternatively defined, for example, replacing collocated cells for collocated points 306 p and n in the definition above.

Figure 4:
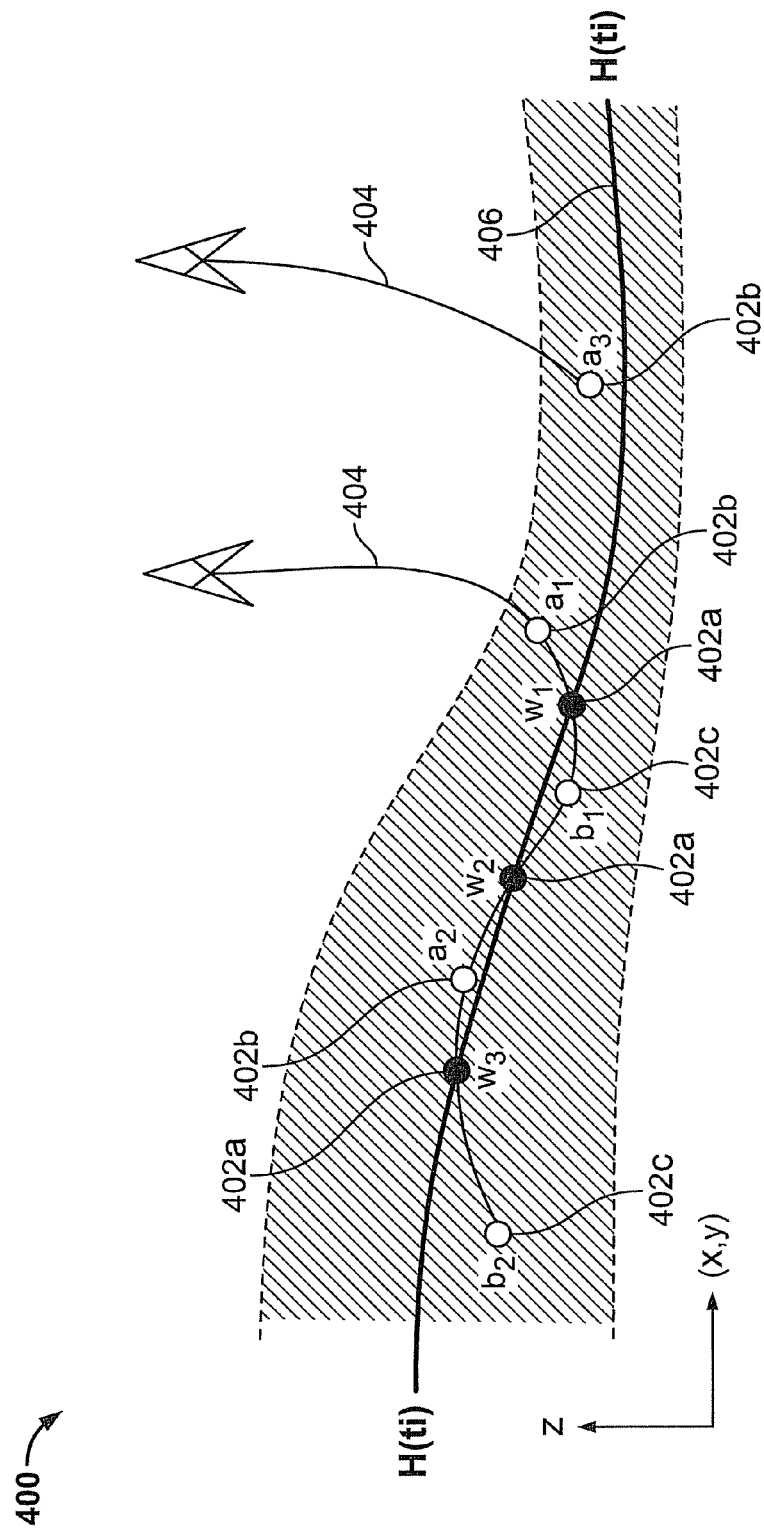
FIG. 4 is a schematic illustration of sampling points along well paths in a model according to an embodiment of the invention.

Geometry of Well Paths: Reference is made to FIG. 4, which schematically illustrates sampling points 402a, 402b, and 402c in a model 400. As shown in FIG. 4, any sampling point 402a, 402b, or 402c on a well path 404 may be classified, for example, into one of the following categories, depending on the location of the sampling point 402a, 402b, and 402c relative to a reference horizon $H(t_i)$ 406 corresponding to a given geological-time $(t_i)$, for example, as follows:

a set $WH(t_i)$ of sampling points $\{w_1, w_2, \ldots\}$ 402a located at intersections of the well path 404 with horizon $H(t_i)$ 406, i.e., well markers,
a set $AH(t_i)$ of sampling points $\{a_1, a_2, \ldots\}$ 402b located above the horizon $H(t_i)$ 406, and
a set $BH(t_i)$ of sampling points $\{b_1, b_2, \ldots\}$ 402c located below the horizon $H(t_i)$ 406.

In practice, such a classification of sampling points 402a, 402b, and 402c is typically determined by geologists based on observations of the nature of the terrains along well paths although other automated mechanisms may also be used. Conventional modeling tools typically only use sampling points corresponding to set $WH(t_i)$ 402a that coincide with well markers and not sampling points 402b and 402c corresponding to sets $AH(t_i)$ and $BH(t_i)$, located above and below the well path 404, respectively. Sampling points 402b of sets $AH(t_i)$ and 402c $BH(t_i)$ located above and below the well path 404 may be used to define the location of horizon $H(t_i)$ 406. One current method merges sets $AH(t_i)$ with $WH(t_i)$, but neglects using information related to the set $BH(t_i)$ of sampling points below the horizon. Without the information related to the set $BH(t_i)$ of sampling points below the horizon, the modeling mechanism typically generates a horizon with an inaccurate (e.g., "bumpy") surface. The inaccurate surface of the horizon $H(t_i)$ may require the modeling mechanism to execute an additional processing step to correct and smooth the surface of horizon $H(t_i)$. For example, heuristic iterative post-processing steps may be executed, which may strongly depend on assumptions which are difficult to honor in practice. According to an embodiment of the invention, information relating to the geometry of well paths may be used, for example, in connection with other sources of information, to model the geological-time function. In one embodiment of the invention, the information relating to the geometry of well paths 404 may include information from the sets $WH(t_i)$ 402a, $AH(t_i)$ 402b and $BH(t_i)$ 402c of sampling points that coincide with, are located above, and are located below the horizon $H(t_i)$ 406, respectively.

Figure 5:
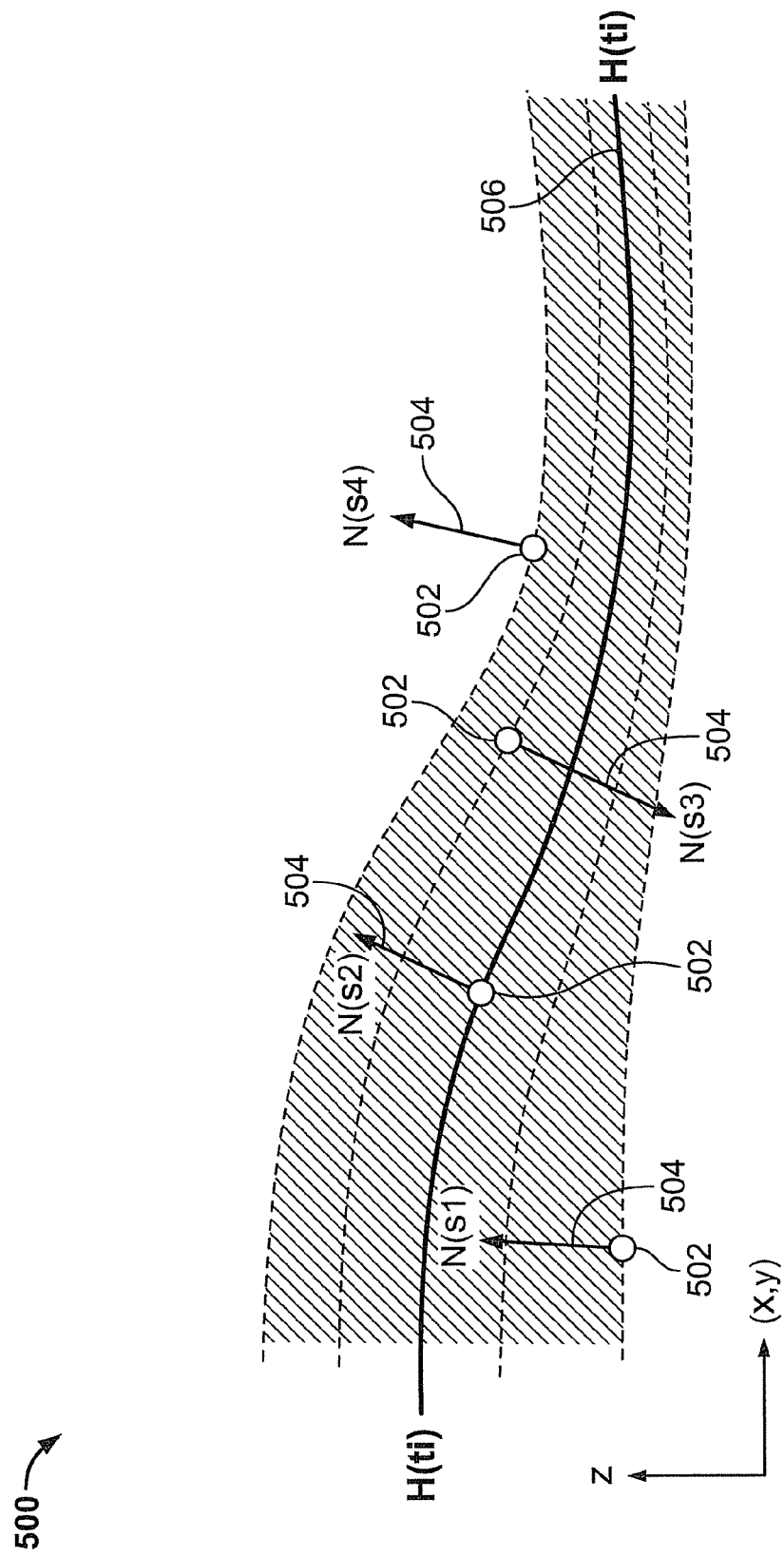
FIG. 5 is a schematic illustration of the geometry of a horizon according to an embodiment of the invention.

Geometry of Horizons: Reference is made to FIG. 5, which schematically illustrates the geometry of a horizon 506 of a model 500, e.g., defined by the orientation of normal vectors 504 of the horizon 506 at sampling points 502 thereof. A normal vector 504, N(s), which is orthogonal to the horizon 506 and coincides with a sampling point (s) 502, may be defined for each sampling point 502 in a set of sampling points $S_N = \{s_1, s_2, \ldots\}$. In one embodiment of the invention, the sampling points (s) 502 and the corresponding normal vectors N(s) 504 may be selected by the geologist or user, for example, who may view the model 500 on a graphical user interface (e.g., displayed on a monitor or display) and select sampling points (s) 502 and the normal vectors N(s) 504 by entering model coordinates or selecting one or more points or directions using a keyboard, mouse or other input device. In another embodiment of the invention, the sampling points (s) 502 and the normal vectors N(s) 504 thereof may be extracted automatically by a computing device (e.g., from a given seismic cube). In still another embodiment of the invention, the normal vectors N(s) 504 may be measured at sampling location (s) 502 along a well path, as is known in the art.

One current method describes using normal vectors N(s) for modeling by equating the gradient of the geological-time function with normal vectors N(s) at the locations of sampling points (s). This requires the module $\|N(s)\|$ and the orientation of normal vectors N(s) to be known. However, the module $\|N(s)\|$ is typically unknown and, according to one current method, choosing an arbitrary value for the module $\|N(s)\|$ may jeopardize the approach. Furthermore, the orientation of normal vectors N(s) is often uncertain and using an incorrect orientation for a normal vector N(s) at just a single sampling point (s) of the set of sampling points $S_N$ is sufficient to trigger devastating effects, thereby generating an inaccurate geological-time function. According to an embodiment of the invention, the gradient of the geological-time function may be parallel to a given normal vector N(s) 504 at any sampling point (s) 502 in the set of sampling points $S_N$. In this embodiment, neither the orientation of normal vectors N(s) 504 nor the corresponding module $\|N(s)\|$ are used and may be chosen arbitrarily for each sampling point 504 of $S_N$. For example, contrary to one current method, FIG. 5 shows that the normal vector $N(s_3)$ 504 at one sampling point 502 may be oriented in a different direction relative to normal vectors $N(s_1)$, $N(s_2)$ and $N(s_4)$ at each different sampling point 502 ($s_1$), ($s_2$,) and ($s_4$,), respectively.

Other possible sources of information may be used to model a geological-time function.

For example, information may be used relating to seismic travel times, i.e., the time in which seismic rays travel to reach a given horizon $H(t_i)$. Seismic travel times may be calculated using both the geometry of the rays and the seismic velocity field.

Embodiments of the invention include modeling a geological-time function t(x,y,z) using one or more of the following sources of information, as described above, and possibly other information:

Sets of sampling points $\{SH(t_1), SH(t_2), \ldots\}$ on reference horizons $\{H(t_1), H(t_2), \ldots\}$;

Fault types (e.g., reverse faults 302 or normal faults 300); Sets {WH(t$_1$), WH(t$_2$), . . . }, {AH(t$_1$), AH(t$_2$), . . . } and {BH(t$_1$), BH(t$_2$), . . . } corresponding to sampling points 402a, 402b, and 402c, respectively, along well paths 404, which coincide with, are located above, and are located below the horizon H(t$_i$) 406, respectively;

A set of sampling points S$_N$ such that, for any sampling point (s) 502 in S$_N$ a normal vector N(s) 504 orthogonal to the horizons 506 is given. By definition, N(s) is called the "normal vector" at location (s); and Other information, such as seismic travel times, which may be translated into linear combinations of the values of the geological-time function at the nodes of a given mesh.

Embodiments of the invention provide a system and method for integrating multiple independent sources of information and simultaneously modeling a geological-time function t(x,y,z) using each of the information sources together. A plurality of distinct geological properties, e.g., corresponding to each of the multiple different information sources, may have value(s) at given sampling locations. Each of the plurality of distinct geological properties may be defined by a linear function or relationship, such as equality or inequality. The plurality of geological properties may be combined by defining a linear system of the linear functions for all or some of the distinct geological properties. The solution of such a linear system may be defined by the values of the linear functions at each node of the mesh M$_1$. The geological-time function may be generated using one or more of the linear equations at each node. Since the plurality of distinct geological properties are combined into a linear system, all of the multiple independent data corresponding to sources of information may be applied simultaneously, in a single execution of the modeling procedure. The geological-time function t(x,y,z) is thereby restricted at the same time to meet all of the multiple geological properties.

The geological-time function may be generated or determined using a combination of geological constraints being simultaneously applied, for example, as follows (other operations or series of operations may be used, and the exact set of steps shown below may be varied).

1) The geological domain (e.g., that covers the physical space from which seismic data is collected) may be covered by a corresponding mesh M$_1$. Reference is made to FIGS. 6A and 6B, which schematically illustrate exploded and assembled perspective views of a mesh 600, respectively. Mesh 600 includes a plurality of cells 602. In the views of FIGS. 6A and 6B, cells 602 are tetrahedral cells, although other types of polyhedral cells such as hexahedral cells may be used. Mesh 600 may be generated, for example, as is known in the art.

2) The geological-time function t(x,y,z) may be fully defined by its values at the vertices of mesh M$_1$. The geological-time function may be generated at an arbitrary point (x,y,z) by locally approximating known values of the geological-time function sampled at the nodes of M$_1$ neighboring the point (x,y,z). Moreover, the mesh M$_1$ may be generated so that discontinuities of the geological-time function t(x,y,z) across the faults are permitted (e.g., as shown in FIG. 6).

3) For each reference horizon H(t$_i$) corresponding to particles of sediment deposited at a given geological-time (t$_i$):
   a) For each sampling point location (s) of the set SH(t$_i$), apply a "control-points" constraint, which may require the geological-time function t(x,y,z) to be approximately equal to (t$_i$) at location (s).
   b) For each sampling point location (w) of the set WH(t$_i$), apply a "control-points" constraint, which may require the geological-time function t(x,y,z) to be approximately equal to (t$_i$) at location (w).
   c) For each sampling point location (a) of the set WA(t$_i$), apply an inequality constraint, which may require the geological-time function t(x,y,z) to be greater than (t$_i$) at location (w).
   d) For each sampling point location (b) of the set WB(t$_i$), apply an inequality constraint, which may require the geological-time function t(x,y,z) to be less than (t$_i$) at location (w). The control-point constraints of steps (3a) and (3b) and the inequality constraints of (3c) and (3d) are typically linear and, as a consequence, may be used together as a linear system of constraints to model the geological-time function.

4) For each sampling point location (s) in the set S$_N$, an additional or alternative constraint may be applied to model the geological-time function, specifying that, at location (s), the gradient of the geological-time function may be approximately parallel to the given vector N(s). That is, the cross product of the gradient of the geological-time function with N(s) may substantially vanish (i.e., go to zero). Such a constraint may be represented as a linear function and, as a consequence, may be used together in a linear system with other constraints for modeling the geological-time function.

5) For each fault F whose type (normal or reverse) is given:
   a) sample F with a set of pairs of points (n,p) collocated on the negative and positive sides of F, respectively.
   b) for each pair of sampling points (n,p), add one of the two following inequality constraints:
      i) If the fault F is a normal fault, then apply an inequality constraint specifying that geological-time at location (p) should be greater than geological-time at location (n); and
      ii) If the fault F is a reverse fault, then apply an inequality constraint specifying that geological-time at location (p) should be lower than geological-time at location (n).
   Other constraints or different sets of constraints may be used. The inequality constraints of steps (5bi) and (5bii) are typically linear functions and, as a consequence, may be used together in a linear system with other constraints for modeling the geological-time function.

6) Other source of information may be represented by a linear function and translated into linear combinations of the values of the geological-time function at the nodes of M$_1$ for use as a constraint together in a linear system with other constraints for modeling the geological-time function.

7) Additional constraints may be applied to specify that, e.g., over the entire studied domain, the geological-time function t(x,y,z) should vary as smoothly as possible between each node or cell of M$_1$ and any neighboring node or cell when there is no fault therebetween.

8) The DSI method or any other equivalent approximation method may then be applied to compute the values of the geological-time function t(x,y,z) at each node of mesh M$_1$ as solution of the linear system of equations and inequalities induced by the constraints. Since the value of the geological-time function t(x,y,z) at each node is derived from linear equations and inequalities at each node, the geological-time function is modeled based on the constraints from multiple sources of information which define the linear equations and inequalities of the system.

9) Stop

In step (7) above, a "smoothness constraint" may be used, defined, for example, by one or more of the following (other constraints may be used):

Smoothness constraint #1: In the neighborhood of each cell of mesh $M_1$, the gradient of t(x,y,z) is constrained to be as constant as possible;

Smoothness constraint #2: In the neighborhood of each node of mesh $M_1$, the function t(x,y,z) is constrained to vary linearly, as much as possible;

Smoothness constraint #3: In the neighborhood of each node of mesh $M_1$, the function t(x,y,z) is constrained to be as close as possible to a harmonic function.

Each of these smoothness constraints is preferably linear so that the constraint may be easily implemented in the DSI method or any other equivalent approximation method to further constrain the values of the geological-time function t(x,y,z) at each node of mesh $M_1$. Alternatively, the constraints may be non-linear and may be approximated as a linear function or used with an algorithm enabling non-linear constraints.

A plurality of geological constraints may be selected from the group consisting of the occurrence of sampling points, the geometry of faults, the geometry of well paths, the geometry of horizons, and/or seismic travel times by executing the operations of corresponding steps 3-6, respectively (other constraints may be used). If any of these geological constraints is undesirable, the corresponding step in the aforementioned process may be skipped. In one embodiment, a user may select which of the geological constraints are used. In one embodiment, there may be a default constraint to generate a model and additional constraints may be optionally selected by the user.

Figure 7:
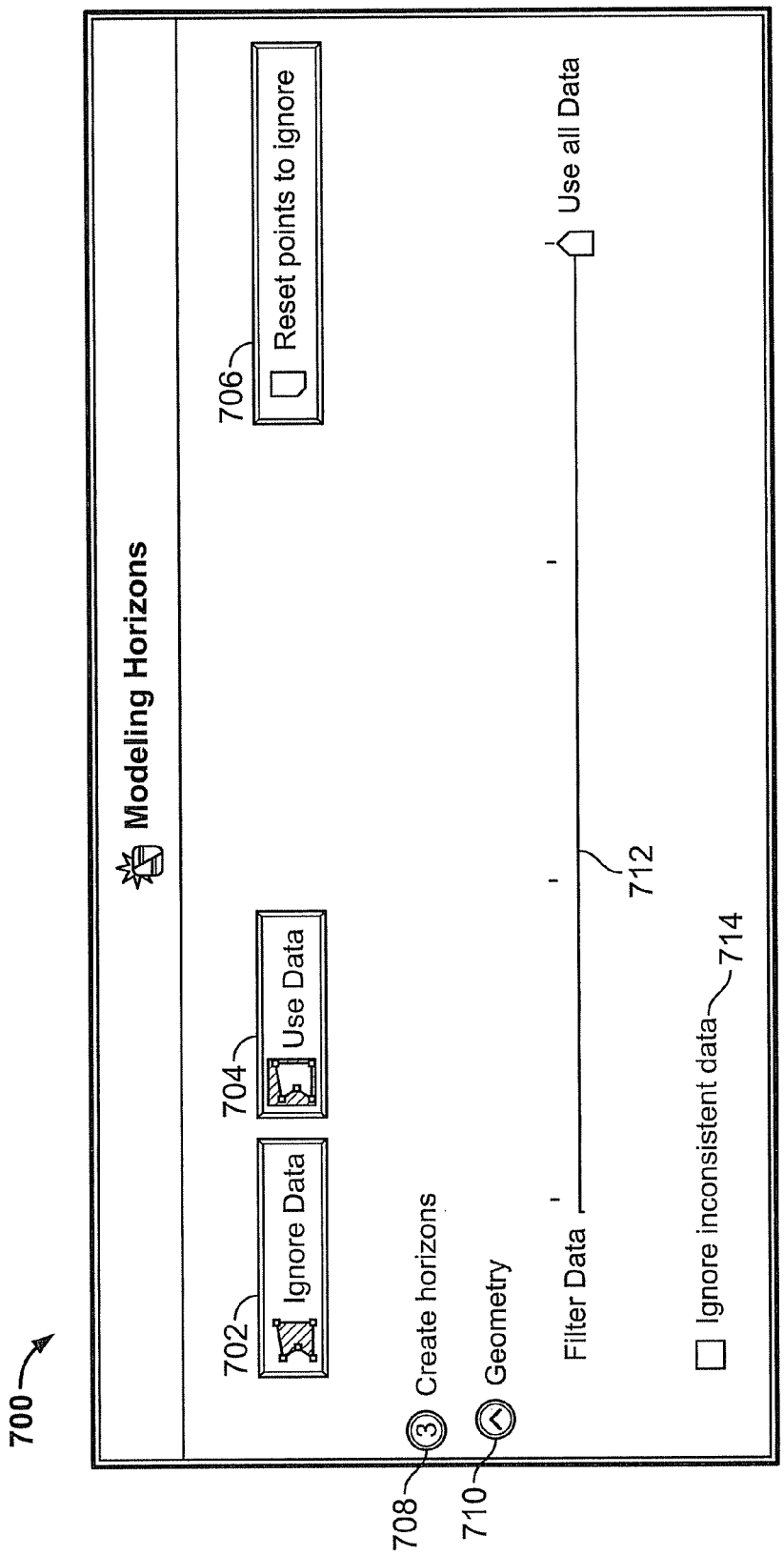
FIG. 7 is a schematic illustration of a graphical user interface for accepting user input according to an embodiment of the invention.

Reference is made to FIG. 7, which schematically illustrates a graphical user interface 700 for accepting user input according to an embodiment of the invention. A user may operate an input device (e.g., input device 165 of FIG. 10), such a mouse or keyboard. The user may select a subset of the sampling data representing a horizon to be decimated or removed from the set of sampling data $F_{sp}$ if, for example, the sampling data is redundant, erroneous, or otherwise undesirable.

Figure 10:
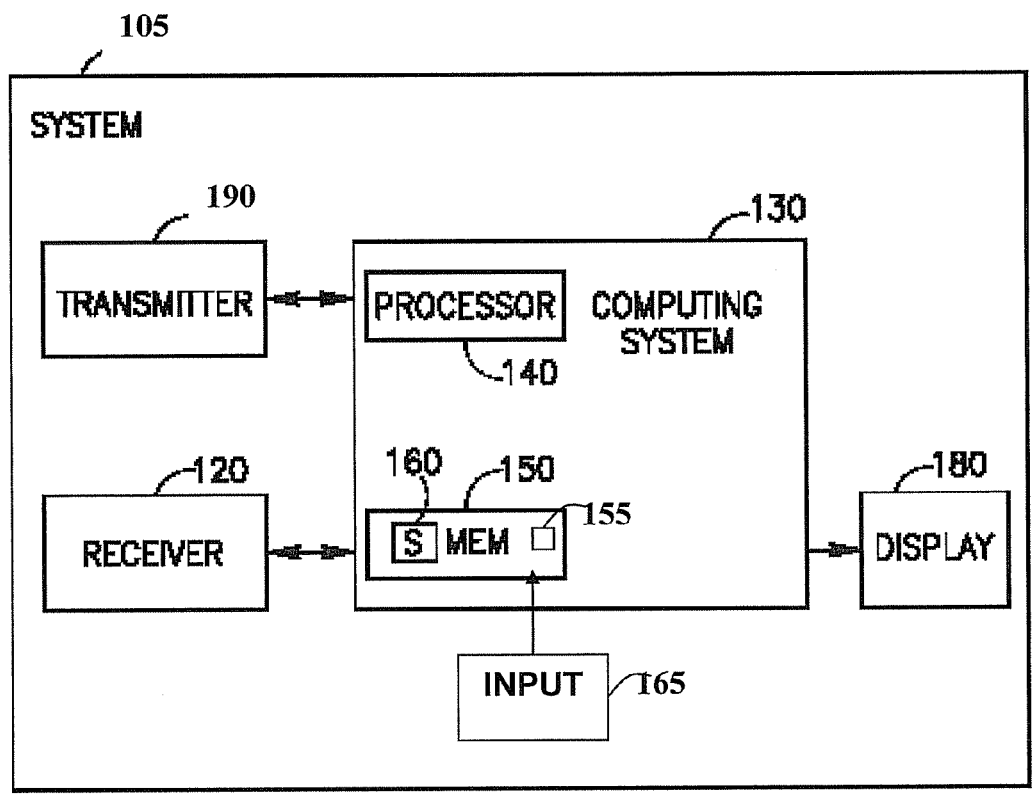
FIG. 10 is a schematic illustration of a system according to an embodiment of the invention.

The aforementioned process may be executed entirely automatically and/or based on user input, according to software instructions (e.g., in software 160 of FIG. 10) executed by a processor (e.g., processor 140 of FIG. 10). Typically, the process is initiated automatically when the processor receives data generated by an intermediate process. Alternatively, the process initiates by a command via an input device (e.g., controlled by a user). Alternatively or additionally, the user may control or modify the otherwise automated process or provide specific data replacing the data automatically generated or adding data thereto. The data provided by a user may relate to the structure of faults (e.g., normal or reverse) and/or other geophysical properties. Data related to geophysical properties of the model may be entered by a user moving pointing device (e.g., a mouse) to cause a computing system to manipulate a visualization of the model (e.g., on display 180 of FIG. 10). Alternatively, the user may enter values associated with geophysical and geological properties at nodes or regions of the model by entering such values in fields of a table, list, or other data structure. The geophysical and geological properties entered by a user may be automatically integrated by a processor as described herein to generate a model based on the data entered by the user.

Characterizing "Bubbles"

The studied geological domain may be defined by a monotonic geological-time function, t(x,y,z). A "bubble" may be a point of error where the geological-time function t(x,y,z) has a local minimum or maximum value on a horizon in the studied domain. A horizon is a surface composed of a set of particles of sediment that were uniformly deposited at the same geological-time. At the time of original deposition, each horizon (e.g., horizons 110a and 110b in uvt-space of FIG. 1) should be a level surface having a constant geological-time function. If the geological-time function has a local minimum or maximum, then a "bubble" or closed level surface (e.g., a ring, a torus, a multiple looped surface) may exist around that local minimum or maximum. From a geological perspective, a bubble or closed surfaces cannot represent valid horizons. Therefore, the geological time function should not have any points of maximum or minimum value on a horizon. However, conventional systems are known to generate these erroneous points.

Embodiments of the invention include one or more of detecting, displaying, and/or removing local minimum or maximum values of the geological-time function t(x,y,z)) on horizon surfaces in the studied domain.

Detecting "Bubbles"

To detect bubbles, e.g., points at which the geological-time function t(x,y,z) has a local minimum or maximum value on a horizon in the studied domain, the following steps may be executed (other steps or series of steps may be used, and the specific set of steps below may be modified in various embodiments).

1) Generate an initial geological-time function t(x,y,z) at the nodes of a given mesh $M_1$, for example as described herein.

2) Generate (e.g., determine) a set P of erroneous or "pathological" nodes of the mesh $M_1$ (e.g., nodes at which the geological-time function t(x,y,z) has a local minimum or maximum value). For each node (n) of mesh $M_1$, e.g., the following example process may be iteratively used to determine if t(x,y,z) has a local minimum or maximum value at the node (other processes may be used):

a. Determine the coordinates $(x_n, y_n, z_n)$ of the node (n);

b. Compute the maximum value, tmax(n), and the minimum value, tmin(n), of the geological-time function at any node of the mesh $M_1$ directly connected to node (n) by, e.g., any edge of the mesh $M_1$;

c. If $\{t(x_n,y_n,z_n) > tmax(n)\}$ or $\{t(x_n,y_n,z_n) < tmin(n)\}$, then add (n) to the set P of pathological nodes.

3) Stop.

Embodiments of the invention include identifying erroneous data such as a maximum value, tmax(n), and a minimum value, tmin(n), of the geological-time function in a neighborhood of a node (n). A neighborhood of node (n), may for example, be a local region in which e.g., any node directly connected to the node (n) by any edge, face, cell, or a predetermined number thereof defining a region of the mesh $M_1$. Alternatively, the neighborhood of node (n) may be a sphere of a predetermined radius, a region spanning predetermined coordinates, or any subspace of the modeled domain. The value of the geological-time function at each node is then compared to the local maximum and minimum values in the local area. If the value of the geological-time function at a node is within a range (tmin(n), tmax(n)) bounded by the local maximum and minimum values, then the node is properly defined and remains. However, if the geological-time value of a node is itself the local maximum or minimum, i.e., greater than the local maximum or less than the local minimum (e.g., and optionally if the node is equal to) the values at its neighboring nodes (excluding itself), then the node may be detected as such and added to a set of P of "pathological" nodes of the mesh $M_1$. These nodes may be displayed to investigate and/or removed to overcome the aforementioned problems associated therewith, as follows.

Visualizing or Displaying "Bubbles"

Due to for example erroneous data, rapid lateral variations of the thickness of geological layers, or other causes, a modeling process may generate bubbles. It may be important to visualize or display, and possibly to edit these bubbles.

To display and visualize bubbles, e.g., on a graphical user interface, the following steps may be executed (other operations or series of operations may be used, and the exact set of steps shown below may be varied).

1) Select the set P of erroneous or "pathological" nodes of the mesh $M_1$, e.g., where there are "bubbles."
2) Using any appropriate graphical user interface, e.g., of a computing device, display the set of nodes belonging to P with a predefined symbol, color, flag, or marker, etc. For example, each pathological node may be represented as a small red sphere.
3) For each node in P, focus the display on that node, or highlight that node, and offer the user the two following options (other options may be offered):
    a) If the user identifies (e.g., by inputting a selection into a computer) an erroneous sampled data point in the neighborhood of the pathological node, then the user may remove that sampled data from the data set used to model the geological-time function;
    b) If the user determines that additional nodes may be pathological, e.g., in a region of rapid variation of thickness in the neighborhood of the pathological node, then the user may refine the mesh $M_1$ in that neighborhood to better model the variations of the geological-time function.
4) Stop The symbols or markers used to indicate that nodes are local maxima or minima of the geological-time function may be overlaid on a spatial model of the corresponding nodes. In one embodiment, a user may select to have the indicating symbols turned on or off. The symbols may be shown by any color or shape (e.g., a red sphere or cube), or by any other deviation or change from the normal way the node is displayed (e.g., highlighting, size, etc.). In an alternate embodiment, multiple colors and symbols or changes may be used to indicate multiple categories of pathological nodes separated in different sets P and P'. For example, different sets P and P' may include the local maxima or minima nodes for regions of the mesh having different sizes, e.g., red dots may indicate the local maxima/minima nodes in P of a relatively small region (e.g., nodes sharing vertices) and blue dots may indicate the global maxima/minima nodes in P' on each horizon.

A user may refine or perfect the process by which bubbles are automatically detected, as described herein. A user may inspect the display and determine that a node should be added or removed from the set of pathological nodes in the set P. For example, if there is a great likelihood that local maxima or minima may occur in a specific region (e.g., due to a rapid variation in the thickness of layers), the user may highlight (e.g., by indicating with a pointing device or by otherwise entering data to a computer) or otherwise indicate that additional nodes may be extracted from the region. In one example, the highlighted region may be refined or divided into smaller sub-regions, each of which may have its own pathological nodes. A computing module may send a request for input from the user or provide a user input field in a graphical user interface, e.g., as shown in FIG. 7. The user may provide input data such as a command received by computer module to execute the aforementioned operations to detect pathological nodes, but this time for the selected or smaller sub-regions. Additional nodes detected to be local maxima or minima in each of the sub-regions may optionally be inspected for confirmation from the user and/or included in the set P of pathological nodes. In another embodiment, the user may highlight a problematic region (e.g., having many pathological nodes) and a processor may detect and remove pathological nodes in the highlighted region only, thereby restricting the model correction process to correct nodes in an isolated region and minimally varying the remainder of the model. For example, the user may highlight and combine two or more regions into a single combined region and execute the pathological node detection for the larger region. This process may eliminate pathological nodes selected for each region and only select or highlight a single pathological node for all regions combined, which has the relatively largest maximum or minimum value in the combined region.

Once a user believes the proper representation of nodes is displayed for a particular model, the user may proceed to remove the pathological nodes, for example as follows.

Removing "Bubbles" Automatically

Nodes at which the geological-time function has a maximum or minimum value in a local region are known to be erroneous. These pathological nodes or "bubbles" may be removed from a model or mesh, for example, according to the steps that follow (other operations or series of operations may be used, and the exact set of steps shown below may be varied).

1) Generate an initial geological-time function $t_0(x,y,z)$ at the nodes of a given mesh $M_1$, as described herein.
2) Select the set P of "pathological" nodes p of the mesh $M_1$ generated above.
3) Optionally, add or remove points in the set P of "pathological" nodes based on user input.
4) While P is not empty:
    a. For each node (p) of P, apply a "smoothness" constraint, e.g., defined by an equation of (p) specifying that, in a neighborhood of (p), the geological-time function $t(x,y,z)$ does not have a maximum or minimum;
    b. Generate a subsequent geological-time function $t(x,y,z)$ at the nodes of a given mesh $M_1$ by approximating the geological-time function $t(x,y,z)$ with the smoothness constraint and other constraints generated by other sources of information. For example, the DSI method or any other equivalent approximation method able to take into account smoothness constraints may be used.
    c. Re-compute the set P of "pathological" nodes of the mesh where there is a local maximum or minimum of $t(x,y,z)$. If P is not empty, repeat step 4.
5) Stop In step (3a) above, a "smoothness" constraint may be used, defined, for example, by one or more of the following (other definitions may be used in other embodiments):

Smoothness constraint #1: In the neighborhood of (p), the gradient of $t(x,y,z)$ is constrained to be as constant as possible;
Smoothness constraint #2: In the neighborhood of (p), the function $t(x,y,z)$ is constrained to vary linearly, as much as possible;

Smoothness constraint #3: In the neighborhood of (p), the function t(x,y,z) is constrained to be as close as possible to a harmonic function.

Removing pathological nodes (e.g., bubbles) may distort the resulting geological-time function t(x,y,z) and, consequently, the time function may be so smooth that it fits the associated geological data incorrectly. In such cases, the resulting geological-time function t(x,y,z) may be set to be a first approximation $t_0(x,y,z)$ of a corrected or refined geological-time function t(x,y,z) that better fits the data. It may be appreciated that by removing bubbles, the gradient of the first approximation geological-time function $t_0(x,y,z)$ typically never vanishes and its gradient $G_0(x,y,z)$ may be approximately oriented orthogonally to the reference horizons fit by a corrected geological-time function t(x,y,z). As a result, the angle between the gradient G(x,y,z) of the corrected geological-time function t(x,y,z) and the gradient $G_0(x,y,z)$ of the first approximation geological-time function $t_0(x,y,z)$ may be small, for example, less than a predetermined value. Based on this relationship, the following post-processing steps may be applied to refine a geological-time function t(x,y,z) that does not fit the data correctly (other operations or series of operations may be used, and the exact set of steps shown below may be varied):

1. Set an initial geological-time function t(x,y,z) obtained after removing bubbles to be equal to a first approximation $t_0(x,y,z)$ of the geological-time function;
   a. $t_0(x,y,z) = t(x,y,z)$ for all (x,y,z)
2. At any location in the studied geological domain:
   a. compute the gradient $G_0(x,y,z)$ of $t_0(x,y,z)$;
   b. apply the following inequality constraint:

$$G(x,y,z) \bullet G_0(x,y,z) > \|G_0(x,y,z)\|^2 \bullet \cos(A) \text{ for all } (x,y,z),$$

where the symbol "●" represents the dot product operation between the gradient G(x,y,z) of a corrected geological-time function t(x,y,z) and the gradient $G_0(x,y,z)$ of the first approximation geological-time function $t_0(x,y,z)$.

In the equation of step (2b) above, A may be a predetermined maximum angle between the gradients G(x,y,z) and $G_0(x,y,z)$. For example, angle A may be between [−60,−60] degrees.

The equation of step (2b) above may be linear relatively to the corrected geological-time function t(x,y,z), and accordingly, may be applied using a DSI inequality constraint. In one embodiment, the following post-processing steps may be applied, if needed, after the application of the bubble removal steps:

(I) Set the first approximation $t_0(x,y,z)$ to be equal to the resulting geological-time function t(x,y,z) obtained after bubble removal steps are applied;
(II) To compute the corrected geological-time function t(x,y,z), add the inequality constraint of step (2b) above to the process described in the section entitled "Unified Modeling of a Geological-Time Function Integrating Multiple Sources of Information."

Controlling the Quality of the Geological-Time Function

Once the geological-time function, t(x,y,z), is defined, the accuracy of the function may be measured and, if it is insufficient, the geological-time function, t(x,y,z) may be re-calculated and refined. In one embodiment, input data used for deriving the geological-time function, t(x,y,z), may be primarily composed of control-points $(x_i,y_i,z_i)$ at which the geological-time function is defined.

To control the quality of the geological-time function, t(x,y,z), of a model defined on a mesh $M_1$, the following process may be used (other operations or series of operations may be used, and the exact set of steps shown below may be varied).

1) For each control-point $(x_i,y_i,z_i)$:
   a. Retrieve the coordinate location $(x_i,y_i,z_i)$ of the control-point and the corresponding value $(t_i)$ of the geological-time function.
   b. Using values of t(x,y,z) previously computed at nodes of the mesh $M_i$, locally approximate the value $t(x_i,y_i,z_i)$ of the geological-time at the control-point $(x_i,y_i,z_i)$.
   c. Compute $G_i$, which is the module of the gradient of t(x,y,z) at location $(x_i,y_i,z_i)$.
   d. Compute the error $E_i = (t(x_i,y_i,z_i) - t_i)$
   e. Compute the absolute value of $E_i/G_i$ and set it equal to $D_i$ considered as an estimate of the distance between the control-point and the horizon $H(t_i)$ on which it should be located
2) Choose a 2D or 3D graphical user interface on a display device (e.g., display 180 of FIG. 10) and a color map, e.g., defining a one-to-one correspondence between a color $C_i$ and a distance $D_i$
3) Display each control-point $(x_i,y_i,z_i)$ on the graphical display device with the colored symbol $C_i$ of the color map corresponding to the distance $D_i$. For example, a control point may be represented by a small cube or a small sphere.
4) Stop Embodiments of the invention may include determining the accuracy of a geological-time function, t(x,y,z), of a model. An accuracy test is executed for the geological-time function, t(x,y,z), at each of a plurality of points, e.g., control points $(x_i,y_i,z_i)$.

In one embodiment of the invention, the geological-time function is known at nodes of mesh $M_1$. The known values of the geological-time function at the nodes (x,y,z) are approximated to determine the corresponding values of the geological-time function at control points $(x_i,y_i,z_i)$. The difference between the value $t_i$ of the geological-time function and the value approximated based on neighboring nodes is determined. If the difference is greater than a predetermined threshold then the geological-time function may be inaccurate. Each point at which this difference is greater than a predetermined threshold may be re-calculated by a processor repeating the steps above. Alternatively or additionally, if the difference between the geological-time function and the approximated corresponding values, for all points or a set of points in the model, is on average or in total greater than a predetermined threshold, the geological-time function of the entire model may be re-calculated.

Reconciling Seismic and Well Data

Typically, a set of control-points sampled on reference horizons may be automatically split into distinct subsets, for example, as follows:
   a subset, control-points derived from seismic cross sections or seismic cubes, (CPS), corresponding to points extracted on reference horizons observed on seismic cross sections or seismic cubes; and
   a subset, control-points observed on well paths, (CPW) corresponding to well markers at the intersection of well paths with reference horizons.

These set of control-points, sampled from the same geological horizons, but with respect to different sources of information, are typically distinct and have complementary properties:
   The seismic data corresponding to the set CPS is typically dense but the vertical positioning of reference horizons is often unknown because of geological uncertainties.

The well data corresponding to the set CPW typically provides precise positioning of the horizons but the set is very sparse in the studied domain.

As a consequence, there is generally a discrepancy between the positioning of the reference horizons when control-points from the CPS and CPW sets are used. Embodiments of the invention propose the following steps to reconcile this discrepancy.

In one embodiment of the invention, seismic data corresponding to the set CPS may be used to determine the shape of the reference horizons, while the well data corresponding to the set CPW may be used to determine the position of the reference horizons. Accordingly, a process may proceed as follows (other operations or series of operations may be used, and the exact set of steps shown below may be varied).

1) The geological domain of interest may be covered by a corresponding mesh $M_1$. In a preferred embodiment, the cells of $M_1$ may be tetrahedral cells (e.g., as shown in FIG. 6) or hexahedral cells, although other types of cells or polyhedral cells may be used. The mesh $M_1$ may be generated, as is known in the art.

2) The geological-time function $t(x,y,z)$ may be fully defined by its values at the vertices of mesh $M_1$. The geological-time function may be generated at an arbitrary point $(x,y,z)$ by locally approximating known values of the geological-time function sampled at the nodes of $M_1$ neighboring the point $(x,y,z)$.

3) A first approximation $t_s(x,y,z)$ of the geological-time function may be generated using the seismic data set CPS only and discarding the well data set CPW.

4) "Control-points" constraints may be applied to specify that, for each sampling point $(x,y,z)$ in the set CPW and located on a reference horizon $H(t_i)$, $t(x,y,z)=t_i$ where $t_i$ is the geological-time of $H(t_i)$.

5) Choose a dense set of points CG in the studied domain. These points may correspond to points where the final solution has the same shape (but not necessarily the same position) as the solution provided by the points of the set CPS. For example but not limited to, one can choose the centers of the cells of $M_1$.

6) For each point $(x_g, y_g, z_g)$ of CG:
   a. Compute the gradient $Gs(x_g, y_g, z_g)$ of $t_s(x,y,z)$ at location $(x_g, y_g, z_g)$. The direction of the gradient $Gs(x_g, y_g, z_g)$ is assumed to characterize the shape of the horizon going through $(x_g, y_g, z_g)$.
   b. apply a constraint specifying that the gradient $G(x_g, y_g, z_g)$ of $t(x,y,z)$ at location $(x_g, y_g, z_g)$ may be, approximately, parallel to the gradient $Gs(x_g, y_g, z_g)$.

7) Constraints may be used which specify that, over the studied domain, the geological-time function $t(x,y,z)$ be as smooth as possible.

8) For each fault F in which the type of fault, e.g., a normal fault or a reverse fault, is known:
   a. sample the fault F with a set of collocated points $n_i = n(x_i, y_i, z_i)$ on the negative side of the fault F and $p_i = p(x_i, y_i, z_i)$ on the positive side of the fault F;
   b. for each pair of sampling points $(n_i, p_i)$, according to the type of fault of fault F, apply the appropriate one of the following inequality constraints:
      If fault F is a normal fault, then add the constraint $t(p_i) > t(n_i)$
      If fault F is a reverse fault, then add the constraint $t(p_i) < t(n_i)$
   The inequality constraints may be, for example, "Delta" constraints in the DSI method or any other equivalent interpolation or approximation method able to take into account linear equality and inequality constraints.

9) The DSI method or any other equivalent approximation method may be applied to compute the values of the geological-time function $t(x,y,z)$ at the vertices of mesh $M_1$ so that the constraints defined above are honored. The multiple constraints may be combined and simultaneously applied to calculate the geological-time function, as described above.

10) Stop

In step (7) above, a "smoothness constraint" may be used, defined, for example, by one or more of the following (other constraints may be used):

Smoothness constraint #1: In the neighborhood of each node (n) of $M_1$, the gradient of $t(x,y,z)$ is constrained to be as constant as possible;

Smoothness constraint #2: In the neighborhood of each node (n) of $M_1$, the function $t(x,y,z)$ is constrained to vary linearly, as much as possible;

Smoothness constraint #3: In the neighborhood of each node (n) of $M_1$, the function $t(x,y,z)$ is constrained to be as close as possible to a harmonic function.

Each of these smoothness constraints is preferably linear so that the constraint may be easily implemented in the DSI method or any other equivalent approximation method to further constrain the values of the geological-time function $t(x,y,z)$ at each collocated point $n_i$ of mesh $M_1$. Alternatively, the constraints may be non-linear and may be approximated as a linear function or used with an algorithm enabling non-linear constraints.

According to an embodiment of the invention, control-points from a set of seismic data, CPS, and a set of well data, CPW, are used by a process to generate different reference horizons. In one embodiment of the invention, control-points from a set of seismic data CPS may be used to determine the shape of the reference horizons and control-points from a set of well data CPW may be used to determine the position of the reference horizons with similar shape (but different positioning) as those generated from the set CPS. Alternatively, other or overlapping sets of CPS and CPW may be used to generate different reference horizons and to determine the shape of the reference horizons.

Modeling Uncertainties on Horizons

In sedimentary geology, a horizon may be considered to be a surface including a set of particles of sediment that were uniformly deposited at the same geological-time. As with other subsurface features, a horizon may be represented in a computer system as data.

Each horizon should be a level surface onto which the geological-time function is constant.

If the geological-time function has a local minimum or maximum, then there exists mandatorily a closed level surface around that local minimum or maximum. From a geological perspective, closed surfaces cannot represent valid horizons: therefore, the geological time function should not have any local maximum or minimum.

Note that a geological-time function does not need to represent the exact geological-time: it simply needs to be an increasing function of the real (generally unknown) geological-time Conventional mechanisms for modeling uncertainties on horizons such as the "GeoChron" modeling mechanism described in the background of this invention, or any other equivalent mechanism, may yield "bubbles" or geological-time functions $t(x,y,z)$ with local minima and maxima for a given stochastic or uncertain occurrence (m). From a geological perspective, these minima and maxima are undesirable and may be removed. To remove these minima and maxima while minimally modifying the geometry of the horizons corresponding to level surfaces of t(x,y,z), the following operations are proposed (other operations or series of operations may be used, and the exact set of steps shown below may be varied):

1. Assume that a stochastic occurrence (m) of a geometrical model of a horizon is represented by a given geological-time function t(x,y,z|m) defined by its values at the nodes of a given 3D mesh $M_1$. The geological-time function t(x,y,z|m) may be built using a conventional algorithm.
2. At the nodes of mesh $M_1$, define a new function $t_0$(x,y,z).
3. Compute or find a set P of "pathological" nodes of the mesh $M_1$, e.g., where t(x,y,z|m) is locally minimum or maximum.
4. Let Q be an empty set of nodes. For each node (p) of P, add to Q the nodes of $M_1$ within a given distance or neighborhood of (p).
5. For each node ($n_1$) of mesh $M_1$ not in Q (e.g., represented by coordinates ($x_i,y_i,z_i$)), a constraint may be used specifying that the value of $t_0(x_i,y_i,z_i)$ may be approximately equal to $t(x_i,y_i,z_i)$, for example in a least squares sense. That is, a new value of the pathological node or region may be estimated from the value of other nodes in the mesh. For example, a "soft" (or "fuzzy") control node/point may be used.
6. While P is not empty, repeat the following steps (a) to (c):
    a. For each pathological node (p) of P, model $t_0$(x,y,z) by adding a local "smoothness" constraint at (p), for example, specifying that, in a neighborhood of (p), the function $t_0$(x,y,z) may not have any maximum or minimum value.
    b. Run an approximation mechanism (e.g., using a known approximation method able to take into account a local smoothness constraint) to generate the function $t_0$(x,y,z).
    c. Compute an updated set P of "pathological" nodes of the mesh $M_1$ where $t_0$(x,y,z) is locally minimum or maximum.
7. For each node ($n_i$) (with coordinates ($x_i,y_i,z_i$)) of the mesh $M_1$, replace value $t(x_i,y_i,z_i|m)$ by value $t_0(x_i,y_i,z_i)$.
8. Stop A "smoothness" constraint may include any requirement used to prevent $t_0$(x,y,z) from having a local maximum or minimum value at a pathological node p. For example, smoothness" constraint may include:

Smoothness constraint #1: In the neighborhood of (p), the gradient of $t_0$(x,y,z) is constrained to be as constant as possible;

Smoothness constraint #2: In the neighborhood of (p), the function $t_0$(x,y,z) is constrained to vary linearly, as much as possible;

Smoothness constraint #3: In the neighborhood of (p), the function $t_0$(x,y,z) is constrained to be as close as possible to a harmonic function.

As with other processes described herein, it is contemplated that modifications and combinations of this algorithm will readily occur to those skilled in the art, which modifications and combinations will be within the spirit of the invention.

Other constraints may be used.

A geological-time function represents the time when particles of sediment were originally deposited. A geological-time function need not represent the exact geological-time but may be an increasing function of the real (generally unknown) geological-time. Since each horizon represents a set of particles that were uniformly deposited in time (at the geological-time of deposition), each horizon should be a level surface on which the geological-time function is constant. Conventional mechanisms are known to generate geological-time functions having local maximum or minimum values, thereby violating the requirement that the horizons correspond to level surfaces of the geological-time function.

In one embodiment of the invention, a geological-time function, t(x,y,z), may be generated without (or with a substantially reduced number of) local maximum or minimum values in the 3D studied domain. That is, the geological-time function, t(x,y,z), may be substantially constant on a horizon, and substantially monotonic across different horizons.

In one embodiment of the invention, a computing module may be executed (for example, by a processor as described herein) to identify a first set of nodes having a local maximum or minimum value for the geological-time function, t(x,y,z), in a first geological model. The computing module may be executed to generate a second geological model having a second set of nodes corresponding to the first set of nodes. The second set of nodes may duplicate the first set of nodes or alternatively, may be rearranged. The modeling module may be executed to compute values for the geological-time function, t(x,y,z), of the second set of nodes that are different than the corresponding values for the first set of nodes. The new values for the geological-time function, t(x,y,z), are preferably not local maxima or minima values in the 3D modeled domain. For example, in order to generate a level horizon with a substantially constant geological-time function, the new values may substantially match the values of neighboring nodes in the horizon. In one example, the modeling module may be executed to compute the value for the geological-time function, t(x,y,z), of the second set of nodes by duplicating, approximating, or otherwise using the values of nodes in the first model that neighbor the nodes having a local maximum or minimum value. Once a new set of values for the geological-time function, t(x,y,z), are defined which do not have local maxima or minima values in the 3D domain, the new set of values may replace the original set of values in the first model for corresponding nodes. To generate a substantially continuous new geological-time function, t(x,y,z), values of this function at neighboring nodes may also be replaced by the modeling module to smooth differences in the geological-time function, t(x,y,z), between the initial and new values. The resulting geological-time function, t(x,y,z), with new substantially continuous values replaces any problematic local maxima and minima values in the initial model, thereby improving the accuracy of the model.

Other data or combinations of data and mechanisms to manipulate the data may be used by the modeling module to execute embodiments of the invention.

Modeling Uncertainty Related to the Positioning of Particles of Sediment

Seismic data may have multiple sources of uncertainty. For example, as discussed in the section entitled "Geometrical Uncertainties and Preferred-Model", seismic data includes inherent geological uncertainties such as the location of sediment particles and faults. Furthermore, conventional processing steps often rely on approximate calculations to process the seismic data adding computing uncertainties to the already geologically uncertain data. These computing uncertainties include, for example, errors induced by seismic processing and errors on variations of the seismic velocity field used in the time to depth conversion in seismic processing algorithms. Not all such errors may be present in models processed by embodiments of the invention, and other errors may be present.

Embodiments of the invention describe a system and method for perturbing an initial 3D geological model using a 3D vector field. A processor (e.g., processor 140 of FIG. 10) may generate a 3D vector field including 3D vectors. Each 3D vector of the 3D vector field may be associated with a node of the initial 3D geological model and has a magnitude within a range of uncertainty of the node of the initial 3D geological model associated therewith. The processor may apply the 3D vector field to the initial 3D geological model associated therewith to generate an alternative 3D model. The alternative 3D model may differ from the initial 3D geological model by a 3D vector at the nodes having uncertain values.

For any equiprobable stochastic occurrence (m) of the geometric model, the uncertainties of the seismic data may be modeled by a vector field $v(x,y,z|m)$. The vector field $v(x,y,z|m)$ for each instance of an equiprobable occurrence, (m), may be applied to the initial model $G_M$ (e.g., a "preferred model") to cause each node (e.g., modeling the location of a particle of sediment or other feature) located at point $(x,y,z)$ in the initial model $G_M$ to move to a new (e.g., stochastic) location $(x,y,z|m)$ in the perturbed model GM(m), for example, as follows:

$$(x,y,z|m)=(x,y,z)+v(x,y,z|m) \quad [7]$$

To generate a coherent perturbation of the initial model, the vector field $v(x,y,z|m)$ is preferably substantially continuous thereby avoiding generating voids or collisions between points of the model. To understand the coherency problem which may arise, replace equation [7] by equation [7a], for example, as follows:

$$(x,y,z|m)=(x,y,z)+s \bullet v(x,y,z|m) \quad [7a]$$

where "$(s \bullet v)$" represents the product of a scalar (s) by a vector (v) and where (s) is a scaling parameter in range [0,1]. When the vector fields are defined at a finite number of nodes, the vector fields being only evaluated at each incremental node, are typically not themselves continuous, but may approximate or coincide with a continuous vector field.

Consider an infinitely small element of volume $\Delta Vol(x,y,z)$ initially centered on location $(x,y,z)$ of the initial model, the internal points of which are perturbed according to equation [7a]. When (s) varies continuously from 0 to 1, the volume $\Delta Vol(x,y,z)$ may also vary continuously from an initial geometry in the initial model to a perturbed geometry in the perturbed model (e.g., the same results may be obtained by applying the perturbation $v(x,y,z|m)$ in equation [7] directly). However, if, during such a continuous transformation, the volume $\Delta Vol(x,y,z)$ vanishes for some value $s=s_0$ in [0,1], then the geologic material contained initially within $\Delta Vol(x,y,z)$ vanishes for that particular value $s_0$ of s. This is a physical impossibility. Therefore, coherent perturbations may preferably be defined such that, regardless of shape and dimension, an initial volume $\Delta Vol(x,y,z)$ does not vanish when the volume is perturbed. Similarly, a perturbation by a 3D vector field may be coherent if and only if any infinitely small polyhedron whose vertices are translated according to this vector field is transformed in such a way that each of its vertices never crosses any of the polyhedron faces. For example, if deformations induced by vector field $v(x,y,z|m)$ are small, it has been proven by the first inventor of this patent application that to ensure the coherency of the perturbation induced by vector field $v(x,y,z|m)$, it suffices that the divergence of the vector field $v(x,y,z|m)$ (e.g., div $\{v(x,y,z|m) =$ dvx/dx+dvy/dy+dvz/dz) is bounded to be greater than (−1) and less than (3/2) in the studied domain:

$$-1 < \text{div } \{v(x,y,z|m)\} < 3/2 \quad [8]$$

If the vector field $v(x,y,z|m)$ is sampled at the nodes of a mesh covering the 3D space, $v(x,y,z|m)$ may be approximated by a linear combination of the values of $v(x_i,y_i,z_i|m)$ corresponding to the values of $v(x,y,z|m)$ at the nodes of the mesh in the neighborhood of $(x,y,z)$. The divergence is a linear operator. To generate a "coherency" constraint specifying that $v(x,y,z|m)$ be defined by equation [7], for example, a finite difference linear approximation of the derivatives occurring in the definition of the divergence operator may be used.

For initial models having an uncertain property (e.g., the location of well markers or faults), embodiments of the invention include perturbing the initial model to generate and display a plurality of perturbed models, each perturbed model having a different arrangement of nodes, each arrangement having substantially the same probability of occurrence. Each perturbed model may be generated by applying a corresponding vector field. The applied vector fields typically cause the nodes of the initial model to move to corresponding new locations in the perturbed models. The vector fields are preferably substantially continuous (e.g., having few or no points of discontinuity). When the vector fields are defined at a finite number of nodes, the vector fields being only evaluated at each incremental node, are typically not themselves continuous, but may approximate or coincide with a continuous vector field. Discontinuous vector fields (e.g., coinciding with vector fields at points at which the vector fields are discontinuous) may themselves induce addition errors. In one example, when using a discontinuous vector field, initially neighboring nodes may be moved to non-neighboring locations, generating erroneous gaps in the perturbed model. In another example, discontinuous vector fields may move the nodes across faults or to collide with each other. By using substantially continuous vector fields to move nodes of the initial model, the perturbed model may avoid such errors induced by the vector fields themselves.

However, even when substantially continuous vector fields are applied to the initial model, uncertainties (e.g., errors) in the data of the initial model may carry over to the perturbed model. For example, a volume or neighborhood of the initial model may shrink, vanish to a point or reverse signs, when the substantially continuous vector fields are applied. The vector field is constrained so that, when applied to points of an initial positive volume, the volume never vanishes. In one embodiment of the invention, vector fields may be constrained by a function of the divergence of the vector fields. As shown in equation [8], the divergence of each vector field is bounded within a range of (−1, 3/2). Vector fields may be constrained by a function of the divergence of the vector fields, for example, by a computing module executing steps according to the description in the section entitled "Testing and Correcting Perturbations Vector Fields". Other constraints may be used to bound the vector fields to generate accurate perturbations of the initial model.

Testing and Correcting Perturbations Vector Fields

The plurality of vector fields $\{v(x,y,z|m_1), v(x,y,z|m_2), \ldots, v(x,y,z|m_n)\}$ may be tested and corrected to ensure the aforementioned coherence constraints are satisfied, for example, by a computing module executing the following steps (other operations or series of operations may be used, and the exact set of steps shown below may be varied):

Testing Phase
1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Use a stochastic simulator to generate an equiprobable occurrence $v(x,y,z|m)$ of a perturbation vector field by any known method:
4. Compute the divergence of $v(x,y,z|m)$ at each node or on each cell of the mesh $M_2$.
5. Determine:
    a. If the divergence is greater than $(-1)$ and lower than $(3/2)$ at each node or on each cell of the mesh $M_2$, proceed to step (6)
    b. Otherwise select one of the following:
        i. discard the occurrence $v(x,y,z|m)$, or
        ii. proceed to step (1) of the "Correcting Phase" below to correct $v(x,y,z|m)$.
6. If a subsequent equiprobable occurrence $v(x,y,z|m)$ exists, return to step (2) using this occurrence.
7. Stop When the vector field $v(x,y,z|m)$ is determined to violate the coherence constraint (e.g., in step 5b), the vector field may be discarded or corrected, e.g., according to the mode of operation of a computing module executing the aforementioned steps to either discard or correct the erroneous vector field. For example, a programmer or user may set a mode of operation of the computing module to establish how to resolve such an erroneous vector field $v(x,y,z|m)$ by either discarding or correcting the vector field.

Alternatively, the mode of operation to either discard or correct the erroneous vector field may be automatically selected in the computing module. In one embodiment, the selected mode of operation may depend on the extent to which the vector field $v(x,y,z|m)$ violates the coherence constraint. For example, if a vector field violates the coherence constraint at a single node or for a sufficiently small number of nodes and/or is within a predetermined acceptable range of error, the vector field may be weighted, ranked, or demoted accordingly. In one embodiment, the plurality of perturbed models may be displayed in an order corresponding to the rank of the vector field with which they were generated. In such embodiments, the computing module need not execute additional operations to correct each error of a vector field, but may, e.g., indicate by a marking of rank or the order with which the model is displayed, which models are correct, incorrect, and partially correct. For example, a first model displayed to a user may be generated by a vector field in which every node of the vector field satisfies the coherence constraint. The last model displayed to a user may be generated by a vector field in which few nodes satisfy the coherence constraint. There may for example be a maximum acceptable threshold of deviation beyond which vector fields are discarded.

In one embodiment of the invention, each vector field, which is applied to the initial model to generate a corresponding perturbed model may itself be displayed (e.g., on display 180 of FIG. 10), e.g., separately from or adjacent to the corresponding perturbed model.

Correcting Phase
When a vector field $v(x,y,z|m)$ is determined to violate a coherence constraint, as in step 5b(ii) above, the vector field $v(x,y,z|m)$ may be corrected to satisfy the constraint, for example, by the following steps executed by a computing module (other operations or series of operations may be used, and the exact set of steps shown below may be varied):
1. Accept a vector field $v(x,y,z|m)$ determined to violate a coherence constraint.
2. Create a copy $v_0(x,y,z|m)$ of the vector field $v(x,y,z|m)$
3. For each node (n) of mesh $M_2$, determine the coordinate location $(x_n,y_n,z_n)$ and apply a constraint specifying that a new value of $v(x_n,y_n,z_n|m)$ interpolated at this location may be approximately equal to $v_0(x_n,y_n,z_n|m)$, for example, in a least squares sense. For example, a "soft" (or "fuzzy") control node may be used.
4. At each node of $M_2$ or on each cell of $M_2$, apply a constraint specifying that new values of $v(x,y,z|m)$ satisfy the inequality [8]. For example, the DSI method (e.g., as described in [MAL02] and [MAL08]) or any other equivalent approximation method may be used to take these inequalities into account as two inequality constraints.
5. A smoothness constraint may be applied specifying that the new values of $v(x,y,z|m)$ be as smooth as possible in the modeled domain.
6. For example, the DSI method or any other equivalent approximation method may be used to compute the new values of $v(x,y,z|m)$ at the nodes of mesh $M_2$ while satisfying the constraints above.
7. Stop In step (5) above, a "smoothness constraint" may be used, defined in the neighborhood of each node (n) of mesh $M_2$, for example, by one or more of the following:
   Smoothness constraint #1: In the neighborhood of (n), the gradient of the x, y and z components of $v(x,y,z|m)$ are constrained to be as constant as possible;
   Smoothness constraint #2: In the neighborhood of (n), the x, y and z components of $v(x,y,z|m)$ are constrained to vary linearly, as much as possible;
   Smoothness constraint #3: In the neighborhood of (n), the x, y and z components of $v(x,y,z|m)$ are constrained to be as close as possible to a harmonic function.

Generating a Vector Field of Coherent Perturbations Associated with a Fault

Faults or unconformities are generally observed and sampled on seismic cross sections or automatically extracted from seismic cubes. Since faults often appear "fuzzy" on seismic cross sections, the exact location of faults may be uncertain and thus, it may be difficult to position faults at an exact location on a 3D mesh $M_1$ of a geological model.

According to embodiments of the invention, when the position of a fault is uncertain, a plurality of vector fields may be generated, each of which may be applied to an initial model of the fault, which in turn generates a plurality of perturbed fault models. The applied vector fields may be generated for example, by the following steps executed by a computing module (other operations or series of operations may be used, and the exact set of steps shown below may be varied).
1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Generate a vector field $v(x,y,z|m)$ to be built in the 3D studied domain for each equiprobable stochastic occurrence (m) such that:
    a. $v(x,y,z|m)$ is defined by sampling values at the nodes of mesh $M_2$, b. at any location (x,y,z) in the 3D studied domain, the value of v(x,y,z|m) may be locally approximated from the values sampled at the nodes of mesh $M_2$ in the neighborhood of (x,y,z).
4. Using a stochastic generator known in the art, generate an equiprobable occurrence $v_F(x,y,z|m)$ of a vector field modeling the equiprobable stochastic occurrence (m) of the uncertainty at point (x,y,z) defined on the surface of fault F. The vector field $v_F(x,y,z|m)$ may be generated at each of a set of given sampling points $S_F=\{(x_1,y_1,z_1), \ldots,(x_q,y_q,z_q)\}$ located on fault F. Any stochastic simulator or processing module may be used to generate the equiprobable occurrence $v_F(x,y,z|m)$.
5. For each sampling location $(x_f,y_f,z_f)$ in set $S_F$, apply a constraint specifying that the value of $v(x_f,y_f,z_f|m)$ approximated at location $(x_f,y_f,z_f)$ may be approximately equal to $v_F(x_f,y_f,z_f|m)$, for example in a least squares sense but not limited thereto. For example, a "soft" (or "fuzzy") control node/point may be used.
6. For each node (n) of $M_2$ having a coordinate location $(x_n,y_n,z_n)$ greater than a predetermined distance from fault F, apply a constraint specifying that the value of $v(x_n,y_n,z_n|m)$ approximated at location $(x_n,y_n,z_n)$ may be approximately equal to a null vector, for example in a least squares sense but not limited thereto. For example, a "soft" (or "fuzzy") control node/point may be used.
7. If F is a secondary fault which branches from a main fault $F_{main}$ along a common border B, then:
    a. Build a set $S_B$ of sampling points close to B; and
    b. For each point b of $S_B$ whose coordinates are $(x_b,y_b,z_b)$, apply a constraint specifying that the dot product of $v(x_b,y_b,z_b|m)$ with the normal vector of $F_{main}$ at location $(x_b,y_b,z_b)$ vanishes (i.e., approximates zero (0)). Accordingly, the secondary faults are perturbed in a direction of the main fault $F_{main}$ and move along the main fault $F_{main}$ without altering the general fault shape. Such a constraint is linear and may be taken into account by the DSI method or another approximation method.
8. At each node of $M_2$ or on each cell of $M_2$, apply a constraint on v(x,y,z|m) specifying that inequality [8] is satisfied. For example, if the DSI method is used to approximate v(x,y,z|m), then the constraint [8] may be expressed as two inequality constraints.
9. Smoothness constraints may be applied to specify that v(x,y,z|m) should be as smooth as possible.
10. For example, the DSI method or any other equivalent approximation method may be used to compute the new values of v(x,y,z|m) at the nodes of mesh $M_2$ while satisfying the constraints above.
11. If a subsequent equiprobable occurrence (m*) exists, return to step (2) to generate a subsequent v(x,y,z|m*) with the occurrence (m*).
12. Stop In step (9) above, a "smoothness constraint" may be used, defined in the neighborhood of each node (n) of mesh $M_2$, for example, by one or more of the following (other constraints may be used):
    Smoothness constraint #1: In the neighborhood of (n), the gradient of the x, y and z components of v(x,y,z|m) are constrained to be as constant as possible;
    Smoothness constraint #2: In the neighborhood of (n), the x, y and z components of v(x,y,z|m) are constrained to vary linearly, as much as possible;
    Smoothness constraint #3: In the neighborhood of (n), the x, y and z components of v(x,y,z|m) are constrained to be as close as possible to a harmonic function.

To alter the initial model to generate each of a plurality of perturbed models, vectors of the vector field v(x,y,z|m) may be applied to corresponding nodes of the initial model. According to embodiments of the invention, the vector field v(x,y,z|m) is three-dimensional. That is, the vectors of the vector field v(x,y,z|m) may have a different direction in a 3D space. Accordingly, when the three-dimensional vector field v(x,y,z|m) is applied to the initial model, nodes of the initial model may be moved in different directions in the 3D space. In conventional methods, nodes of the initial model were moved in the same directions (i.e., restricted to 1 dimension) of the 3D space. As an unfortunate consequence, if a first fault F is moved, which initially branches on a second fault, the perturbed faults are likely to have a geologically unacceptable shape close to the branching. According to the process described, since each node may be moved in a different direction, the first fault may be moved in continuous parts. For example, nodes close to or within a small predetermined neighborhood of the branching of the first fault and the second fault may be moved in the direction of the second fault, sliding along the length of the second fault, so that the first and second faults remain smooth. The direction of displacement for the remaining portion of the first fault varies continuously from the direction of the second fault to the chosen displacement direction for the first fault further away from the branching. Using a smoothly varying vector field v(x,y,z|m) to move individual nodes of an initial model in different directions may preserve the relative structures of the initial model, e.g., such as networks of branching faults, while executing random perturbations of the remainder of the model.

Applying a vector field v(x,y,z|m) to corresponding nodes of the initial model may cause corresponding nodes in the perturbed model to "move", "slide", or "rotate" relative thereto, thereby transforming modeled geological features represented by nodes and cells of the initial model to a new location in the perturbed model.

Generating a Vector Field of Coherent Perturbation Associated with Seismic Velocity The location (x,y,z) of a particle of sediment in a geological model (e.g., the node, cell, vertex, or coordinate location) may be determined using an approximation of seismic velocity S(x,y,z). Seismic velocity S(x,y,z) typically has a significant amount of uncertainty, which in turn causes the location (x,y,z) of the particle of sediment to be modeled with uncertainty.

An error function, r(x,y,z|m), may be defined. The error function, r(x,y,z|m), may represent relative error of the seismic velocity S(x,y,z) at location (x,y,z) for an occurrence (m) of the geometric model. The error function, r(x,y,z|m), may represent the relative error of the seismic velocity, for an occurrence (m), for example, as follows:

$$r(x,y,z|m)=\Delta S(x,y,z|m)/S(x,y,z) \qquad [9]$$

where S(x,y,z) is a measure of seismic velocity and $\Delta S(x,y,z|m)$ is a measure of the error associated with the seismic velocity S(x,y,z). Typical values for the magnitude of the relative error of the seismic velocity are, for example, in a range of from approximately ±3% to approximately ±10%. The uncertainty of seismic velocity may, for example, depend on the depth (z) associated with the location (x,y,z).

u(x,y,z) may represent a unit vector substantially tangential to a seismic ray passing through (x,y,z); h(x,y,z) may represent a thickness in direction u(x,y,z) of a thin layer passing through (x,y,z); and $\Delta h(x,y,z|m)$ may represent an error associated with the thickness h(x,y,z). Accordingly, the error function, r(x,y,z|m), may also represent the relative error of the thickness, which may for example be represented as follows:

$$\Delta h(x,y,z|m)/h(x,y,z)=r(x,y,z|m) \qquad [10]$$

Combining equation [9] and equation [10], an equality is established between the relative error of the seismic velocity and the relative error of the thickness of a layer. Accordingly, adding a (positive or negative) random error $\Delta S(x,y,z|m)$ to the seismic velocity $S(x,y,z)$ is equivalent to moving the particle of sediment (x,y,z) in direction u(x,y,z) to a new location (x,y,z|m). The particle of sediment (x,y,z) may be moved, for example, according to the following equation:

$$(x,y,z|m)=(x,y,z)+v(x,y,z|m) \qquad [11a]$$

$$\text{where } v(x,y,z|m)=e(x,y,z|m)\bullet u(x,y,z) \qquad [11b]$$

where the symbol "(e●u)" represents the product of a scalar (e) by a vector (u) and where e(x,y,z|m) is a scalar function of random error at (x,y,z) for an occurrence (m). The first inventor of this patent application proved that:

the error e(x,y,z|m) may be determined for example, according to equation [12] as follows.

$$\text{grad } e(x,y,z|m)\bullet u(x,y,z)=r(x,y,z|m) \qquad [12]$$

where the symbol "●" represents the dot product operation between two vectors, grad(e) and u, and where the dot product of the gradient {grad e(x,y,z|m)} of the error e(x,y,z|m) and the given direction u(x,y,z) of a seismic ray is equal to the relative error r(x,y,z|m) defined by equation [9] or [10]; and the perturbation induced by equations [11a] and [11b] may be sufficiently coherent if the following inequality is satisfied:

$$-1<r(x,y,z|m)<3/2 \qquad [13]$$

A "coherent" perturbation may include any perturbation that meets one or more predetermined criteria. These predetermined criteria may relate, for example, to fundamental physical laws or properties of the data. For example, predetermined criteria may include, entropy of the system increases as time increases, time functions monotonically increase, points on one side of a fault remain on the same side of the fault and do not cross the fault as time changes, faults remain separate but may branch, horizons remain separated by a continuous gap, the connections between faults and horizons are separated by no gap or a minimal gap. Alternatively or additionally, these predetermined criteria may relate, for example, to knowledge a user may have of the geophysical terrain being modeled. For example, the user may know (based on parallel computations or independent information) that a fault is either normal or reverse, branches, or crosses another fault. The user may add this information to before or after data is processed for example as one or more constraints on the data, as described herein.

A plurality of equiprobable coherent vector fields $\{v(x,y,z|m_1), v(x,y,z|m_2), \ldots, v(x,y,z|m_n)\}$ for perturbing models according to the uncertainty induced by seismic velocity may be generated, for example, by the following steps executed by a computing module (e.g., executed by processor 140 described herein in reference to FIG. 10). Other operations or series of operations may be used, and the exact set of steps shown below may be varied.

1. Determine the unit vector field u(x,y,z) which may be approximately tangential to a seismic ray that passes through the corresponding point (x,y,z). Seismic ray tracing techniques may be used to determine the vector field u(x,y,z). In another embodiment, if the horizons are approximately horizontal, then u(x,y,z) may be constant and equal to the unit vertical vector.
2. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
3. Select a random number (m) to be used as a "seed" by a random function generator.
4. For each node of $M_2$, using a stochastic random function generator, an occurrence r(x,y,z|m) may be numerically generated satisfying equation [13]. For example, r(x,y,z|m) may be a uniform random function with values in range $[R_1,R_2]$ where $R_1$ is greater than or equal to (-1) and $R_2$ is lesser than (3/2).
5. Create a new function e(x,y,z|m), such that:
   a. e(x,y,z|m) is defined by sampling points at the nodes of mesh $M_2$,
   b. at any location (x,y,z), the value of e(x,y,z|m) can be locally interpolated from the values sampled at the nodes of mesh $M_2$ in the neighborhood of (x,y,z).
6. At each node of $M_2$ or on each cell of $M_2$, define e(x,y,z|m) by equation [12], for example, by applying a constraint that e(x,y,z|m) satisfies the equation, e.g., in a least squares sense. For example, the DSI method or any other suitable method may be used to approximate e(x,y,z|m) while taking this constraint into account as directional gradient constraint.
7. For each sampling location $(x_s,y_s,z_s)$, e.g., at well markers, where the geometric error may be substantially negligible, apply a control-point constraint, for example, specifying that:

$$e(x_s,y_s,z_s|m)=\text{null vector} \qquad [14]$$

8. If no control-point constraint is applied at step (7), then choose (e.g., at least) one arbitrary minimum error point $(x_s,y_s,z_s)$ and apply a control-point constraint according to equation [14].
9. Smoothness constraints are applied to specify that e(x,y,z|m) should be as smooth as possible in any predefined specific sense over the entire mesh $M_2$.
10. The DSI method or any other equivalent interpolation method known in the art is then applied to compute the values of e(x,y,z|m) at the vertices of mesh $M_2$ according to the constraints above.
11. At each node location $(x_n,y_n,z_n)$ of mesh $M_2$, use equation [11b] to compute the value $v(x_n,y_n,z_n|m)$ to assign to that node, for example, as follows:

$$v(x_n,y_n,z_n|m)=e(x_n,y_n,z_n|m)\bullet u(x,y,z) \qquad [15]$$

where the symbol "(e●u)" represents the product of a scalar (e) by a vector (u).
12. If a subsequent equiprobable occurrence (m*) exists, return to step (3) to generate a subsequent v(x,y,z|m*) with the occurrence (m*).
13. Stop In step (9) above, any "smoothness constraint" may be used, defined in the neighborhood of each node (n) of mesh $M_2$, for example, by one or more of the following (other constraints may be used):

Smoothness constraint #1: In the neighborhood of (n), the gradient of e(x,y,z|m) is constrained to be as constant as possible;

Smoothness constraint #2: In the neighborhood of (n), the function e(x,y,z|m) is constrained to vary linearly, as much as possible;

Smoothness constraint #3: In the neighborhood of (n), the function e(x,y,z|m) is constrained to be as close as possible to a harmonic function.

As described herein, the vector field v(x,y,z|m) may be a three-dimensional field that may be applied to the initial model to move individual nodes of the initial model in different directions in a 3D space.

In this embodiment, the magnitude of the displacement vector, $e(x_n,y_n,z_n|m)$, is a measure of uncertainty, i.e., error, at the individual node (e.g., as shown in equations [15]). Accordingly, the magnitude of the displacement of each node may correspond to (e.g., be bounded by) the error associated with that node. For example, nodes associated with geological points that have relatively small uncertainty, e.g., at well markers, are moved by a small or negligible distance for all occurrences (m). Conversely, nodes associated with geological points that have relatively high uncertainty are moved, for at least some occurrences of (m), by relatively large distances. Although each node may be moved by a different value for each occurrence (m), the error at each node defines the range of distances the individual node may be moved for all occurrences of $(m_1, m_2, \ldots)$.

In one embodiment, the direction of the displacement vector is in the direction of the unit vectors u(x,y,z) (e.g., as shown in equations [15]). As described above in reference to equations [9] and [10], moving the point (x,y,z) in direction u(x,y,z) may be equivalent to varying the error in the seismic velocity S(x,y,z) of the node. Thus, applying a three-dimensional vector field of unit vector u(x,y,z), for example, associated with a function e(x,y,z|m), to perturb an initial model may move an individual point in different directions in a 3D space according to the uncertainty of the error in the seismic velocity S(x,y,z) at that point.

The uncertainty or error at each node may be stored in a memory (e.g., memory 150 of FIG. 10) and retrieved by a processor (e.g., processor 140 of FIG. 10). The processor may use the error at each node to calculate the corresponding displacement vector, as described herein. The displacement vector generated by the processor may be stored in the memory for later use.

Combining a Plurality of Perturbation Vector Fields

Perturbations by vector field are determined based on the uncertainty related to a geological property of the model. In one example, the location of a fault in the model may be uncertain. As described in the section entitled 'Generating a Vector Field of Coherent Perturbation Associated With a Fault,' a vector field may be generated corresponding to the uncertainty in the location of the fault. In another example, the seismic velocity of model data is uncertain. As described in the section entitled 'Generating a Vector Field of Coherent Perturbations Associated with Seismic Velocity,' a vector field may be generated corresponding to the uncertainty of the seismic velocity of the model data.

In one embodiment of the invention, multiple distinct vector fields, each corresponding to uncertainty of a distinct geophysical problem, may be combined to generate a single vector field. The single combined vector field may therefore correspond to the combined uncertainties of multiple distinct geophysical problems. When the combined vector field is applied to an initial model, the model is perturbed based on all the possible solutions to multiple different geophysical problems.

A particle of sediment at a location (x,y,z) in an initial model may be moved to a new location (x,y,z|m,s) for an occurrence (m) according to equation [7] duplicated here, as follows:

$$(x,y,z|m,s)=(x,y,z)+v(x,y,z|m,s) \qquad [7]$$

where an index (s) represents a specific source of uncertainty.

In geophysical data, there are typically many sources of uncertainties $\{s_1, s_2, \ldots, s_q\}$ that affect the geometry of the initial model. For example:
- $s_1$ may correspond to the uncertainty associated to a fault $F_1$
- $s_2$ may correspond to the uncertainty associated to a fault $F_2$
- ...
- $s_q$ may correspond to the uncertainty associated with seismic velocity To model the combined uncertainty associated with all the sources of uncertainties $\{s_1, s_2, \ldots, s_q\}$, a combined vector field, v(x,y,z|m), is generated. The combined vector field, v(x,y,z|m), may be, for example, the sum of the individual vector fields associated with each sources:

$$v(x,y,z|m)=v(x,y,z|m,s1)+v(x,y,z|m,s2)+ \ldots +v(x,y,z|m,sq) \qquad [16]$$

To generate a combined vector field that is coherent, for example, the following steps may be executed by a computing module (other operations or series of operations may be used, and the exact set of steps shown below may be varied):

1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Generate a series of equiprobable vector fields $\{v(x,y,z|m,s_1), v(x,y,z|m,s_2), \ldots, v(x,y,z|m,s_q)\}$ modeling the occurrence (m) of uncertainties for each source of uncertainty $\{s_1, s_2, \ldots, s_q\}$, respectively, e.g., using a stochastic simulator. For example the level of uncertainty of the sources may be a measure of the extent to which each affects the location of a point (x,y,z) corresponding to each particle of sediment in the initial model. These vector fields may be sampled at each node of $M_2$.

It may be appreciated that, for example:
   a. It is preferred, but not required, that each vector field v(x,y,z|m,s) satisfy equation [8].
   b. Any stochastic simulator may be used to generate $v(x_n,y_n,z_n|m,s)$ at each node location $(x_n,y_n,z_n)$ of mesh $M_2$.
4. Create a new vector field v(x,y,z|m) such that:
   a. v(x,y,z|m) is defined by sampling points at the nodes of mesh $M_2$,
   b. At any location (x,y,z), the value of v(x,y,z|m) may be locally approximated from the values sampled at the nodes of mesh $M_2$ in a neighborhood of (x,y,z).
   c. v(x,y,z|m) is defined as the sum of the perturbation fields $\{v(x,y,z|m,s1), v(x,y,z|m,s2), \ldots, v(x,y,z|m,s_q)\}$, e.g., according to equation [16].
5. Compute the divergence of v(x,y,z|m) at each node or on each cell of the mesh $M_2$
6. If there is a node or a cell where the divergence is lower than (−1) or greater than (3/2):
   a. discard v(x,y,z|m), or
   b. proceed to step (1) of the "Correcting Phase" of the section entitled "Testing and Correcting Perturbations Vector Fields" to correct v(x,y,z|m).
7. If a subsequent equiprobable occurrence v(x,y,z|m) may be generated, return to step (2) above using the new occurrence.
8. Stop

Rapid Generation of Occurrences of a Perturbation Vector Field

A perturbation vector field $v(x,y,z|m)$ corresponding to a given source of uncertainty may have multiple independent stochastic occurrences $\{v(x,y,z|m_1), v(x,y,z|m_2), \ldots, v(x,y,z|m_n)\}$, each of which affect the location of particles of sediment corresponding to an initial model of the subsurface. Assume that each of these independent occurrences satisfies equation [8] substantially duplicated, as follows:

$$-1 < \text{div}(v(x,y,z|m_i)) < 3/2 \text{ for all } i \text{ in } \{1,2,\ldots,n\} \qquad [17]$$

A vector field $w(x,y,z|m)$ may be defined to include blending coefficients $B_i(m)$ (e.g., random variables), e.g., as follows:

$$w(x,y,z|m) = B_1(m) \bullet v(x,y,z|m_1) + \ldots + Bn(n) \bullet v(x,y,z|m_n) \qquad [18]$$

where the symbol "$(B_i \bullet v)$" represents the product of a scalar $(B_i)$ by a vector $(v)$.

The divergence operator is a linear operator. The blending coefficients $B_i(m)$ may be defined such that equations [19a] and [19b] are satisfied:

$$0 \le B_i(m) \le 1 \qquad [19a]$$

$$B_1(m) + B_2(m) + \ldots + B_n(m) = 1 \qquad [19b]$$

Evaluating equations [15], [19a] and [19b], the vector field $w(x,y,z|m)$ satisfies the following inequality:

$$-1 < \text{div}(w(x,y,z|m)) < 3/2 \qquad [20]$$

As a consequence, $w(x,y,z|m)$ may be defined by $v(x,y,z|m)$. In practice, equation [18] provides a very fast way to generate stochastic occurrences of $v(x,y,z|m) = w(x,y,z|m)$.

To generate a series of coherent perturbation vector fields $v(x,y,z|m)$, for example, the following steps may be executed by a computing module (other operations or series of operations may be used, and the exact set of steps shown below may be varied):

1) Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2) Generate a series of equiprobable vector fields $\{v(x,y,z|m_1), v(x,y,z|m_2), \ldots, v(x,y,z|m_n)\}$ that satisfy equation [17], for example, using a stochastic simulator.
3) Select a random number (m) to be used as a "seed" by a random function generator.
4) Generate random blending coefficients $\{B_1(m), B_2(m), \ldots, B_n(m)\}$ that satisfy equations [19a] and [19b].
5) At each node $(x_n, y_n, z_n)$ of mesh $M_2$, compute $v(x_n, y_n, z_n|m)$, for example, as follows:

$$v(x_n,y_n,z_n|m) = B_1(m) \bullet v(x_n,y_n,z_n|m_1) + \ldots + B_n(n) \bullet v(x_n,y_n,z_n|m_n)$$

where the symbol "$(B_i \bullet v)$" represents the product of a scalar $(B_i)$ by a vector $(v)$.
6) If a subsequent equiprobable occurrence may be generated, return to step (3) above using the new occurrence.
7) Stop

Modeling Uncertainty Related to the Positioning of Particles of Sediment (a Gradient Scalar Field Approach)

As previously described, a three-dimensional vector field $v(x,y,z)$ may move each node of an initial model in different directions in a 3D space. Accordingly, the three components $v_x$, $v_y$, and $v_z$ of $v(x,y,z)$ are typically stored for each node. However, in another embodiment of the invention, a gradient of a scalar field $f(x,y,z)$ may be used instead of the three-dimensional vector field $v(x,y,z)$. The gradient of scalar field $f(x,y,z)$ is a three-dimensional vector field grad $f(x,y,z)$ whose components are equal to the partial derivatives of $f(x,y,z)$ relative to x, y and z, respectively. Furthermore, the scalar field $f(x,y,z)$ may have only a single scalar value, $f(x_n,y_n,z_n)$, stored for each node (n) whose coordinates are $(x_n,y_n,z_n)$. Therefore, the gradient of a scalar field $f(x,y,z)$ may be used to generate three-dimensional vector field perturbations of the initial model while significantly reducing the effective amount of data stored for the vector fields (e.g., by 2/3).

Accordingly less computational resources may be used when the vector field $v(x,y,z|m)$ is derived from a scalar field $f(x,y,z|m)$, for example, as follows:

$$v(x,y,z|m) = \text{grad} f(x,y,z|m) \qquad [21]$$

where {grad f} represents the gradient of $f(x,y,z|m)$

It is well known that the divergence of $v(x,y,z|m)$ is equal to the Laplacian $\Delta f(x,y,z|m)$ of $f(x,y,z|m)$:

$$\text{div}(v(x,y,z|m)) = \Delta f(x,y,z|m) \qquad [22]$$

Therefore, for the gradient of the scalar field $f(x,y,z)$ to honor the inequality [8], the function $f(x,y,z)$ may be built in such a way that its Laplacian belongs to the range $[-1, 3/2]$ at any location in the studied domain:

$$-1 < \Delta f(x,y,z|m) < 3/2 \qquad [23]$$

A plurality of scalar fields $\{f(x,y,z|m_1), f(x,y,z|m_2), \ldots, f(x,y,z|m_n)\}$ may be generated that satisfy equation [23]. These scalar fields may be tested and corrected to ensure that when the three-dimensional gradients of the scalar fields are applied to an initial model, the plurality of perturbed models generated are coherent, for example, by a computing module executing the following steps:

Testing and Correcting a Perturbations Scalar Field

A plurality of scalar fields $\{f(x,y,z|m_1), f(x,y,z|m_2), \ldots, f(x,y,z|m_n)\}$ may be tested and corrected to ensure the aforementioned coherence constraints are satisfied, for example, by a computing module executing the following steps (other operations or series of operations may be used, and the exact set of steps shown below may be varied):

Testing Phase
1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Use a stochastic generator to generate an equiprobable occurrence $f(x,y,z|m)$ of a perturbation scalar field.
4. Compute the Laplacian of $f(x,y,z|m)$ at each node or on each cell of mesh $M_2$ and determine:
   a. If the Laplacian is greater than $(-1)$ and lower than $(3/2)$ everywhere, then proceed to step (5)
   b. Otherwise proceed according to one of the following:
      i. discard $f(x,y,z|m)$, or
      ii. proceed to step (1) of the "Correcting Phase" of this section to correct $f(x,y,z|m)$.
5. If a subsequent equiprobable occurrence $f(x,y,z|m)$ may be generated, return to step (2) above using the new occurrence
6. Stop Correcting Phase When a perturbation scalar field $f(x,y,z|m)$ is determined to violate equation [23], as in step 4b(ii) above, the scalar field $f(x,y,z|m)$ may be corrected to satisfy equation [23], for example, by the following steps executed by a computing module (other operations or series of operations may be used, and the exact set of steps shown below may be varied):

1. Accept a scalar field $f(x,y,z|m)$ determined to violate equation [23].
2. Create a copy $f_0(x,y,z|m)$ of the scalar field $f(x,y,z|m)$
3. For each node (n) of mesh $M_2$, determine the coordinate location $(x_n,y_n,z_n)$ and apply a constraint specifying that a new value of $f(x_n,y_n,z_n|m)$ approximated at this location may be approximately equal to $f_0(x_n,y_n,z_n|m)$, for example, in a least squares sense. For example, a "soft" (or "fuzzy") control node may be used.
4. At each node of $M_2$ or on each cell of $M_2$, apply a constraint specifying that new values of $f(x,y,z|m)$ satisfy equation [23]. For example, the DSI method or any other equivalent approximation method may be used to approximate $f(x,y,z|m)$ with equation [23] taken into account as an inequality constraint.
5. A smoothness constraint may be applied specifying that the new values of $f(x,y,z|m)$ be as smooth as possible in the modeled domain.
6. For example, the DSI method or any other equivalent approximation method may be used to compute the new values of $f(x,y,z|m)$ at the nodes of mesh $M_2$ while satisfying the equation [23] and any additional constraints.
7. Stop In step (5) above, a "smoothness constraint" may be used, defined in the neighborhood of each node (n) of mesh $M_2$, for example, by one or more of the following (other smoothness constraints may be used):

Smoothness constraint #1: In the neighborhood of (n), the gradient of $f(x,y,z|m)$ is constrained to be as constant as possible;

Smoothness constraint #2: In the neighborhood of (n), the function $f(x,y,z|m)$ is constrained to vary linearly, as much as possible;

Smoothness constraint #3: In the neighborhood of (n), the function $f(x,y,z|m)$ is constrained to be as close as possible to a harmonic function.

Generating a Gradient Scalar Field of Coherent Perturbations Associated with a Fault Faults are generally observed and sampled on seismic cross sections or automatically extracted from seismic cubes. Since faults often appear "fuzzy" on seismic cross sections, the exact location of faults may be uncertain and thus, it may be difficult to position faults at an exact location on a 3D mesh $M_1$ of a geological model.

According to embodiments of the invention, when the position of a fault is uncertain gradients of a plurality of scalar fields may be generated, each of which may be applied to an initial model of the fault, which in turn generates a plurality of perturbed fault models. The applied gradient scalar fields may be generated for example, by the following steps executed by a computing module (other operations or series of operations may be used, and the exact set of steps shown below may be varied).

1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Generate a new scalar field $f(x,y,z|m)$ to be built in the 3D studied domain for each equiprobable stochastic occurrence (m) such that:
    a. $f(x,y,z|m)$ is defined by sampling values at the nodes of mesh $M_2$,
    b. at any location $(x,y,z)$ in the 3D studied domain, the value of $f(x,y,z|m)$ may be locally approximated from the values sampled at the nodes of mesh $M_2$ in the neighborhood of $(x,y,z)$.
4. Generate an equiprobable occurrence $v_F(x,y,z|m)$ of a vector field modeling the equiprobable stochastic occurrence (m) of the uncertainty at point $(x,y,z)$ defined on the surface of fault F. The equiprobable occurrence $v_F(x,y,z|m)$ of a vector field may be generated using for example a stochastic simulator. The vector field $v_F(x,y,z|m)$ may be generated at each of a set of given sampling points $S_F=\{(x_1,y_1,z_1),\ldots,(x_q,y_q,z_q)\}$ located on fault F. Any suitable stochastic simulator or processing module may be used to generate the equiprobable occurrence $v_F(x,y,z|m)$.
5. For each sampling location $(x_f,y_f,z_f)$ in set $S_F$, apply a constraint specifying that the value of the gradient of $f(x_f,y_f,z_f|m)$ approximated at location $(x_f,y_f,z_f)$ may be approximately equal to $v_F(x_f,y_f,z_f|m)$, for example in a least squares sense. For example, a "soft" (or "fuzzy") control node/point may be used.
6. For each node (n) of $M_2$ having a coordinate location $(x_n,y_n,z_n)$ greater than a predetermined distance from fault F, apply a constraint specifying that the gradient of $f(x_n,y_n,z_n|m)$ approximated at location $(x_n,y_n,z_n)$ may be approximately equal to a null vector, for example in a least squares sense. For example, a "soft" (or "fuzzy") control node/point may be used.
7. If F is a secondary fault which branches from a main fault $F_{main}$ along a common border B, then:
    a. Build a set $S_B$ of sampling points close to B; and
    b. For each point b of $S_B$ whose coordinates are $(x_b,y_b,z_b)$, apply a constraint specifying that the dot product of the gradient of $f(x_b,y_b,z_b|m)$ with the normal vector of $F_{main}$ at location $(x_b,y_b,z_b)$ vanishes. Accordingly, the secondary faults are perturbed in a direction of the main fault $F_{main}$ and move along the main fault $F_{main}$ without altering the general fault shape. Such a constraint is linear and may be taken into account by the DSI method or an equivalent approximation method.
8. At each node of $M_2$ or on each cell of $M_2$, apply on $f(x,y,z|m)$ a constraint specifying that inequality [23] is satisfied. For example, if the DSI method is used to approximate $f(x,y,z|m)$, then the constraint may be expressed as two inequality constraints.
9. Smoothness constraints may be applied to specify that $f(x,y,z|m)$ should be as smooth as possible in the neighborhood of each node (n) of the mesh $M_2$.
10. For an arbitrary point $(x_0,y_0,z_0)$ within the studied domain, apply a control-point constraint specifying that $f(x,y,z|m)$ may be equal to a given arbitrary value $f_0$ at the location $(x_0,y_0,z_0)$. For example $(x_0,y_0,z_0)$ may be a point close to the center of the model and $f_0$ may be a null value.
11. For example, the DSI method or any other equivalent approximation method may be used to compute the new values of $f(x,y,z|m)$ at the nodes of mesh $M_2$ while satisfying the constraints above.
12. If a subsequent equiprobable occurrence $(m^*)$ exists, return to step (2) to generate a subsequent $f(x,y,z|m^*)$ with the occurrence $(m^*)$.
13. Stop In step (9) above, a "smoothness constraint" may be used, defined in the neighborhood of each node (n) of mesh $M_2$, for example, by one or more of the following (other constraints may be used):

Smoothness constraint #1: In the neighborhood of (n), the gradient of f(x,y,z|m) is constrained to be as constant as possible;

Smoothness constraint #2: In the neighborhood of (n), the function f(x,y,z|m) is constrained to vary linearly, as much as possible;

Smoothness constraint #3: In the neighborhood of (n), the function f(x,y,z|m) is constrained to be as close as possible to a harmonic function.

Combining a Plurality of Perturbation Scalar Fields

Perturbations by gradient scalar fields are determined based on the uncertainty related to a geological property of the model. Similarly to the description in the section entitled "Combining a Plurality of Perturbation Vector Fields," multiple distinct gradient scalar fields, each corresponding to the uncertainty of a distinct geophysical problem, may be combined to generate a single gradient scalar field. The single combined gradient scalar field may therefore correspond to the combined uncertainties of multiple distinct geophysical problems. When the combined gradient scalar field is applied to an initial model, the model is perturbed based on all the possible solutions to multiple different geophysical problems.

A particle of sediment at a location (x,y,z) in an initial model may be moved to a new location (x,y,z|m,s) for an occurrence (m) according to equation [7]. In geophysical data, there are typically many sources of uncertainties $\{s_1, s_2, \ldots, s_q\}$ that affect the geometry of the initial model. For example:

$s_1$ may correspond to the uncertainty associated to a fault $F_1$
$s_2$ may correspond to the uncertainty associated to a fault $F_2$
...
$s_q$ may correspond to the uncertainty associated with seismic velocity To model the combined uncertainty associated with all the sources of uncertainties $\{s_1, s_2, \ldots, s_q\}$, a combined scalar field f(x,y,z|m) may be generated. The combined scalar field, f(x,y,z|m), may be, for example, the sum of the individual vector fields associated with each source:

$$f(x,y,z|m)=f(x,y,z|m,s_1)+f(x,y,z|m,s_2)+\ldots+f(x,y,z|m,s_q) \quad [24]$$

To generate a combined vector field that is coherent, for example, the following steps may be executed by a computing module (other operations or series of operations may be used, and the exact set of steps shown below may be varied):

1. Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.
2. Select a random number (m) to be used as a "seed" by a random function generator.
3. Generate a series of equiprobable scalar fields $\{f(x,y,z|m,s_1), f(x,y,z|m,s_2), \ldots, f(x,y,z|m,s_q)\}$ having gradients that model the occurrence (m) of uncertainties for each source of uncertainty $\{s_1, s_2, \ldots, s_q\}$, respectively, e.g., using a stochastic simulator. For example the level of uncertainty of the sources may be a measure of the extent to which each affects the location of a point (x,y,z) corresponding to each particle of sediment in the initial model. These scalar fields may be sampled at each node of $M_2$.

It may be appreciated that, for example:
   a. It is preferred, but not required, that each scalar field f(x,y,z|m,s) satisfy equation [23].
   b. Any stochastic simulator may be used to generate $f(x_n,y_n,z_n|m,s)$ at each node location $(x_n,y_n,z_n)$ of mesh $M_2$.

4. Create a new scalar field f(x,y,z|m) such that:
   a. The scalar field f(x,y,z|m) is defined by sampling points at the nodes of mesh $M_2$,
   b. At any location (x,y,z), the value of f(x,y,z|m) may be locally approximated from the values sampled at the nodes of mesh $M_2$ in a neighborhood of (x,y,z).
   c. The scalar field f(x,y,z|m) is defined as the sum of the perturbation fields $\{f(x,y,z|m,s1), f(x,y,z|m,s2), \ldots, f(x,y,z|m,sq)\}$, e.g., according to equation [24].
5. Compute the Laplacian of f(x,y,z|m) at each node or on each cell of the mesh $M_2$.
6. If there is a node or a cell where the Laplacian is lower than (−1) or greater than (3/2):
   a. discard f(x,y,z|m), or
   b. Or proceed to step (1) of the "Correcting Phase" of the section entitled "Testing and Correcting Perturbations Scalar Fields" to correct f(x,y,z|m).
7. If a new equiprobable coherent occurrence of f(x,y,z|m) may be generated, return to step (2) above using the new occurrence.
8. Stop Rapid Generation of Occurrences of a Perturbation Scalar Field A scalar field f(x,y,z|m) may have multiple independent stochastic occurrences $\{f(x,y,z|m_1), f(x,y,z|m_2), \ldots, f(x,y,z|m_n)\}$, each of which may affect the modeled location of particles of sediment corresponding to an initial model of the subsurface, for example, according to equations [7] and [21]. Assume that each of these independent occurrences honors the coherency equation [23] substantially duplicated, as follows:

$$-1<\Delta f(x,y,z|m_i)<3/2 \text{ for all } i \text{ in } \{1,2,\ldots,n\} \quad [25]$$

A scalar field F(x,y,z|m) may be defined to include blending coefficients $B_i(m)$ (e.g., random variables), e.g., as follows:

$$F(x,y,z|m)=B_1(m)\bullet f(x,y,z|m_1)+\ldots+B_n(n)\bullet f(x,y,z|m_n) \quad [26]$$

where the symbol "$(B_i\bullet f)$" represents the product of a scalar $(B_i)$ by a vector (f).

It is well known that the Laplacian operator is a linear operator. Therefore, if the blending coefficients $B_i(m)$ are defined such that equations [19a] and [19b] are satisfied (e.g., as described in pages 519-525 of [MAL02]):

$$0 \leq B_i(m) \leq 1 \quad [19a]$$

$$B_1(m)+B_2(m)+\ldots+B_n(m)=1 \quad [19b]$$

then the scalar field F(x,y,z|m) satisfies the following coherency inequality:

$$-1<\text{div}(F(x,y,z|m))<3/2 \quad [27]$$

As a consequence, F(x,y,z|m) may be used as a stochastic occurrence f(x,y,z|m) of the scalar field. In practice, equation [26] provides a very fast way to generate stochastic occurrences of f(x,y,z|m)=F(x,y,z|m) and, as a consequence, stochastic occurrences v(x,y,z|m) may be rapidly generated as gradients of F(x,y,z|m).

To generate a series of coherent perturbation scalar fields f(x,y,z|m), for example, the following steps may be executed by a computing module (other operations or series of operations may be used, and the exact set of steps shown below may be varied):

1) Cover a 3D geological domain of interest by a mesh $M_2$. Mesh $M_2$ is preferably continuous across faults. $M_2$ may be a regular mesh having substantially identically shaped (e.g., hexahedron or tetrahedron) cells.

2) Generate a series of equiprobable vector fields $\{f(x,y,z|m_1), f(x,y,z|m_2), \ldots, f(x,y,z|m_n)\}$ that satisfy equation [25], for example, using a stochastic simulator.

3) Select a random number (m) to be used as a "seed" by a random function generator.

4) Generate random blending coefficients $\{B_1(m), B_2(m), \ldots, B_n(m)\}$ that satisfy equations [19a] and [19b].

5) At each node $(x_n, y_n, z_n)$ of mesh $M_2$, compute $F(x_n, y_n, z_n|m)$, for example, as follows:

$$f(x_n,y_n,z_n|m) = B_1(m) \bullet f(x_n,y_n,z_n|m_1) + \ldots + B_n(n) \bullet f(x_n,y_n,z_n|m_n)$$

where the symbol "$(B_i \bullet f)$" represents the product of a scalar $(B_i)$ by a vector $(v)$.

6) If a subsequent equiprobable occurrence may be generated, return to step (3) above using the new occurrence.

7) Stop

Modeling and Visualizing Global Uncertainty Related to the Geometry of the Subsurface Modeling Uncertainty on Faults and Horizons Jointly In the description above, for each stochastic occurrence (m), horizons and faults may be modeled separately. To generate horizons and faults simultaneously or together, for example, the following steps may be executed by a computing module (other operations or series of operations may be used, and the exact set of steps shown below may be varied):

1. Generate a plurality of geological-time functions $\{t(x,y,z|m_{t1}), t(x,y,z|m_{t2}), \ldots, t(x,y,z|m_{tm})\}$, each of which may be defined at nodes of a given 3D mesh $M_1$. For example, the plurality of geological-time functions may be generated according to the section entitled "Modeling Uncertainties on Horizons."

2. Generate a series of equiprobable stochastic coherent vector fields $\{v(x,y,z|m_{v1}), v(x,y,z|m_{v2}), \ldots, v(x,y,z|m_{vk})\}$. For example, the vector fields may be generated according to the sections entitled "Testing and Correcting Perturbations Vector Fields" and "Rapid Generation of Occurrences of a Perturbation Scalar Field."

3. For each stochastic occurrence $(m_t)$ in the sequence $\{m_{t1}, m_{t2}, \ldots, m_{tm}\}$:
   a. Randomly select a stochastic occurrence $(m_v)$ in the sequence $\{m_{v1}, m_{v2}, \ldots, m_{vk}\}$
   b. Build a copy $M_1(m_v)$ of $M_1$
   c. Move each node (n) of $M_1(m_v)$ to a new location $(x_n, y_n, z_n|m_v)$ of (n) derived from the initial location $(x_n, y_n, z_n)$ as follows:

$$(x_n,y_n,z_n|m_v) = (x_n,y_n,z_n) + v(x_n,y_n,z_n|m_v)$$

d. Set the value of each node (n) of $M_1(m_v)$ with coordinates, $(x_n, y_n, z_n)$, to be the values of sampling points of the geological-time function $t(x_n, y_n, z_n|m_t)$ previously computed.

4. Stop

For each pair $(m_t, m_v)$, the nodes (n) of mesh $M_1(m_v)$ have a random location and a random occurrence of the geological-time $t(x,y,z|m_t)$. Accordingly, each pair $\{M_1(m_v), t(x,y,z|m_t)\}$ may be used as a coherent stochastic model of both horizons and the faults.

Figure 8:
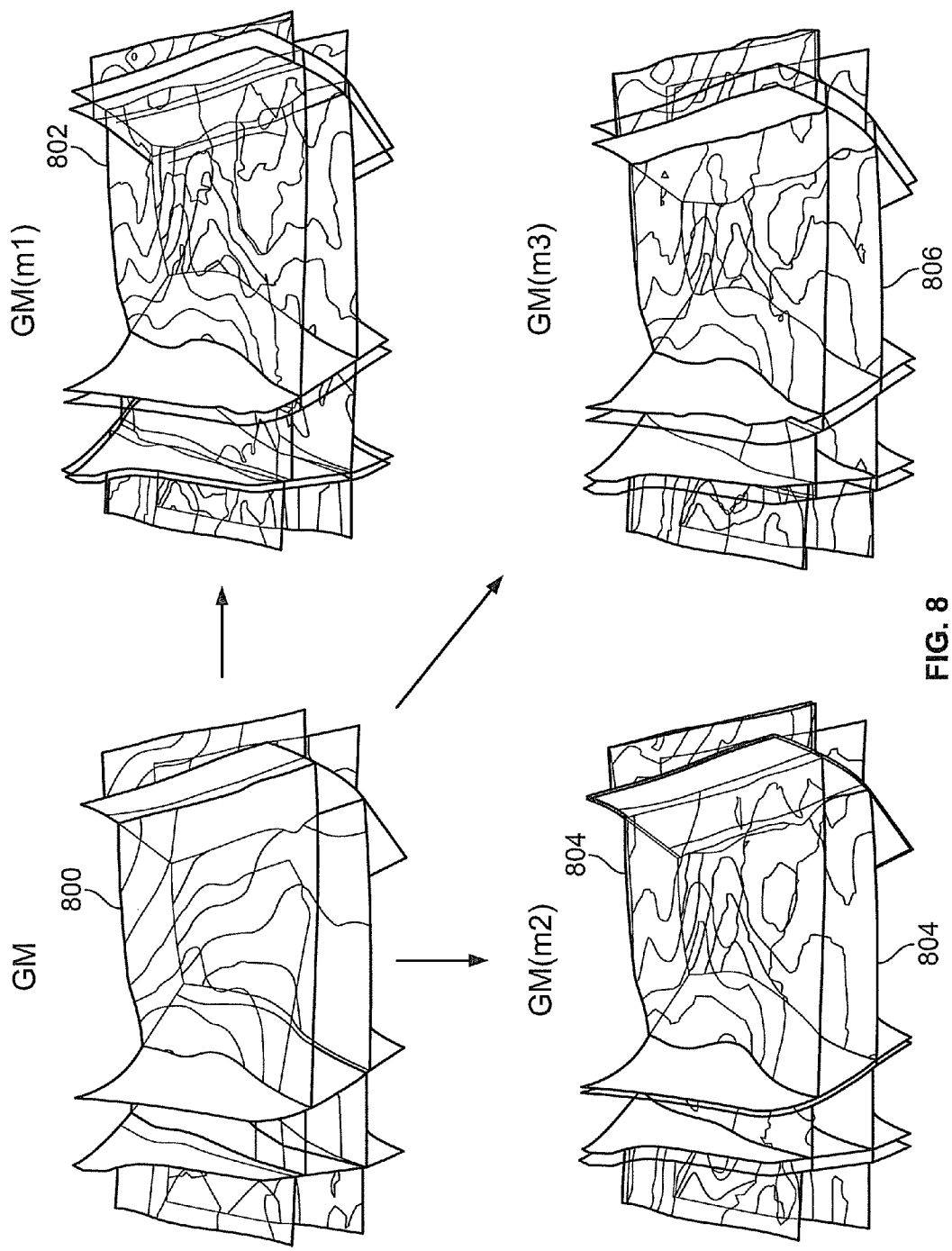
FIG. 8 is a schematic illustration of a display of a plurality of equiprobable perturbed models according to an embodiment of the invention.

Reference is made to FIG. 8, which schematically illustrates a display of a plurality of equiprobable perturbed models $GM(m_1)$ 802, $GM(m_2)$ 804, $GM(m_3)$ 806 generated from an initial model 800, according to an embodiment of the invention. The plurality of equiprobable perturbed models were generated according to embodiments of the process described in this section.

Modeling the Probability of Leakage Through Faults

Figure 9A:
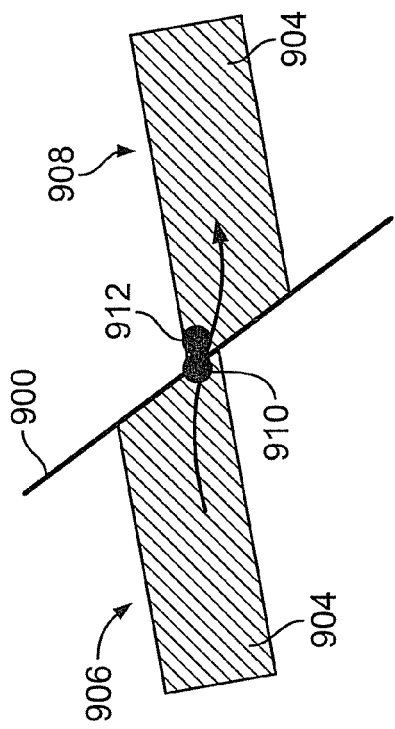
FIGS. 9A and 9B are schematic illustrations of faults across which hydrocarbon deposits may not and may leak, respectively, from one side of the fault to the other side of the fault according to an embodiment of the invention.
Figure 9B:
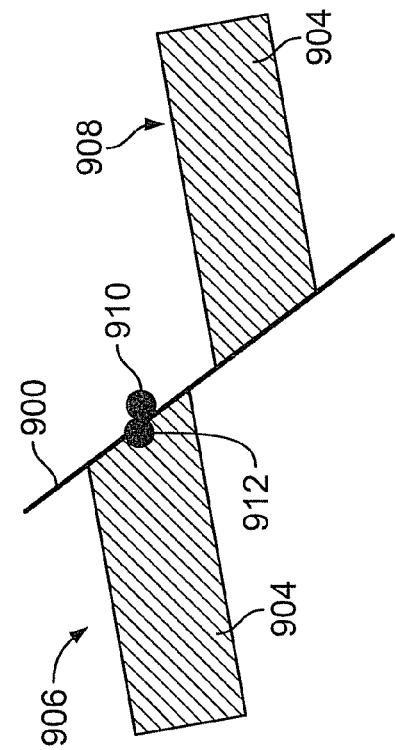

Reference is made to FIGS. 9A and 9B, which schematically illustrate faults 900 across which hydrocarbon deposits in a reservoir 904 may not leak and may leak, respectively, from one side of the fault 906 to the other side of the fault 908 according to an embodiment of the invention. Depending on the location of top and bottom horizons of a reservoir 904, the hydrocarbons located on one side of a fault F 906 may leak to the other side of F 908. Different occurrences of the equiprobable models, e.g., $GM(m_1)$, $GM(m_2)$, $GM(m_3)$, may be used to identify the probability of such leakage. Determining the probability of the leakage of hydrocarbons through a fault F 900 may inform reservoir engineers as to where to search for hydrocarbon sources, for example, as follows.

If the probability of leakage is low, then two wells may be drilled, one on each side of the fault F; and if the probability of leakage is high, then a single well may be drilled on one side of the fault F (e.g., eliminating the cost of building a second well on a second side of the fault F).

To model the probability of leakage, p(n), through a modeled fault F 900, for example, the following steps may be executed by a computing module, according to one embodiment of the invention (other operations or series of operations may be used, and the exact set of steps shown below may be varied):

1) Identify two sides of a fault F 900, side $F_0$ 906 and side $F_1$ 908.

2) Cover the fault F 900 with a fine 2D mesh $M_F$.

3) At each node (n) of mesh $M_F$ associated with the modeled fault F 900, attach a counter p(n) initialized to 0.

4) For each stochastic occurrence GM(m) of an equiprobable perturbation of the geometric model, for each node (n) of $M_F$:
   a. Consider the two points $(n_0)$ 910 and $(n_1)$ 912 collocated with fault node (n) and located on the sides $F_0$ 906 and $F_1$ 908 of fault F 900, respectively.
   b. If points $(n_0)$ 910 and $(n_1)$ 912 are both located in reservoir 904, then increment counter p(n) by one such that, for example, p(n)=p(n)+1

5) For each node (n) of $M_F$, divide p(n) by the total number of stochastic realizations GM(m)

6) Stop

The values p(n) may represent an estimate of the probability of leakage through fault F 900 at each node (n) of $M_F$. These values may be stored, for example, to be used by or displayed to a user. The values may be displayed as a color scale overlaying a model. The color scale may be normalized. Different probabilities or ranges of probabilities may correspond to different colors. Accordingly, a user may inspect the display to determine where there are relatively high or low probabilities of leakage through a fault F.

Visualizing the Probability of Leakage Through Faults

The probability of leakage p(n) determined above may be modeled as a 2D or 3D visualization for viewing on a user display. To generate a visualization of the probability p(n) of leakage through a fault F, for example, the following steps may be executed by a computing module (other operations or series of operations may be used, and the exact set of steps shown below may be varied):

1) Generate a 2D mesh $M_F$ covering the fault F such that each node (n) of mesh $M_F$ contains the value p(n) of the probability of leakage at the location of the node.

2) Using any appropriating graphing device (e.g., computer system 130 as described in FIG. 10), generate a (e.g., 2D or 3D) display with an appropriate visualization technique to view the variations of p(n) on F. For example, visualization technique may include:
drawing contour lines of p(n) onto F; and/or
painting F with colors such that each color corresponds to a given value of p(n).

3) Stop

In one embodiment, the model displaying the probability of leakage through F may be displayed together with the spatial model GM(m). For example, a model displaying the probability of leakage through F may be overlaid on, or adjacent to the spatial model GM(m), on a display such as display 180 of FIG. 10). Alternatively, the probability of leakage through F may be displayed separately from the spatial model GM(m). Other arrangements or combinations of the aforementioned models may be used.

Reference is made to FIG. 10, which schematically illustrates a system including a transmitter, receiver and computing system in accordance with an embodiment of the present invention. Methods disclosed herein may be performed using a system 105 of FIG. 10.

System 105 may include a transmitter 190, a receiver 120, a computing system 130, and a display 180. The aforementioned data, e.g., seismic data used to form intermediate data and finally to model subsurface regions, may be ascertained by processing data generated by transmitter 190 and received by receiver 120. Intermediate data may be stored in memory 150 or other storage units. The aforementioned processes described herein may be performed by software 160 being executed by processor 140 manipulating the data.

Transmitter 190 may transmit signals, for example, acoustic waves, compression waves or other energy rays or waves, that may travel through subsurface (e.g., below land or sea level) structures. The transmitted signals may become incident signals that are incident to subsurface structures. The incident signals may reflect at various transition zones or geological discontinuities throughout the subsurface structures. The reflected signals may include seismic data.

Receiver 120 may accept reflected signal(s) that correspond or relate to incident signals, sent by transmitter 190. Transmitter 190 may transmit output signals. The output of the seismic signals by transmitter 190 may be controlled by a computing system, e.g., computing system 130 or another computing system separate from or internal to transmitter 190. An instruction or command in a computing system may cause transmitter 190 to transmit output signals. The instruction may include directions for signal properties of the transmitted output signals (e.g., such as wavelength and intensity). The instruction to control the output of the seismic signals may be programmed in an external device or program, for example, a computing system, or into transmitter 190 itself.

Computing system 130 may include, for example, any suitable processing system, computing system, computing device, processing device, computer, processor, or the like, and may be implemented using any suitable combination of hardware and/or software. Computing system 130 may include for example one or more processor(s) 140, memory 150 and software 160. Data 155 generated by reflected signals, received by receiver 120, may be transferred, for example, to computing system 130. The data may be stored in the receiver 120 as for example digital information and transferred to computing system 130 by uploading, copying or transmitting the digital information. Processor 140 may communicate with computing system 130 via wired or wireless command and execution signals.

Memory 150 may include cache memory, long term memory such as a hard drive, and/or external memory, for example, including random access memory (RAM), read only memory (ROM), dynamic RAM (DRAM), synchronous DRAM (SD-RAM), flash memory, volatile memory, non-volatile memory, cache memory, buffer, short term memory unit, long term memory unit, or other suitable memory units or storage units. Memory 150 may store instructions (e.g., software 160) and data 155 to execute embodiments of the aforementioned methods, steps and functionality (e.g., in long term memory, such as a hard drive). Data 155 may include, for example, raw seismic data collected by receiver 120, instructions for building a mesh, instructions for partitioning a mesh, and instructions for processing the collected data to generate a model, or other instructions or data. Memory 150 may also store instructions to remove local maxima and minima points ("bubbles") from horizons of a model. Memory 150 may store a geological-time function, a model representing a structure when it was originally deposited (e.g., in uvt-space) and/or a model representing the corresponding structure in a current time period (e.g., in xyz-space). Memory 150 may store cells, nodes, voxels, etc., associated with the model and the model mesh. Memory 150 may also store forward and/or reverse uvt-transformations to transform current models in xyz-space to models in uvt-space, and vice versa. Memory 150 may store instructions to perturb an initial model and data associated with the plurality of perturbed models generated therefrom. Memory 150 may also store the three-dimensional vector fields (or one-dimensional scalar fields), which when applied to the nodes of the initial model (or when the gradient of the scalar field is applied to the nodes of the initial model), move the nodes of the initial model to generate one of the plurality of perturbed models. Applying a vector field to corresponding nodes of the initial model may cause the nodes to "move", "slide", or "rotate", thereby transforming modeled geological features represented by nodes and cells of the initial model. Data 155 may also include intermediate data generated by these processes and data to be visualized, such as data representing graphical models to be displayed to a user. Memory 150 may store intermediate data. System 130 may include cache memory which may include data duplicating original values stored. For example, memory 150 may store the set of erroneous or pathological nodes, P, (e.g., local maxima and minima points) which are removed from the horizons of models. Memory 150 may also store measures of error or uncertainty at the nodes of an initial model. Memory 150 may store measures of the divergence of vector fields to determine if the divergences are within a predetermined threshold according to equations [8] and [23]. Cache memory may include data duplicating original values stored elsewhere or computed earlier, where the original data may be relatively more expensive to fetch (e.g., due to longer access time) or to compute, compared to the cost of reading the cache memory. Cache memory may include pages, memory lines, or other suitable structures. Additional or other suitable memory may be used.

Computing system 130 may include a computing module having machine-executable instructions. The instructions may include, for example, a data processing mechanism (including, for example, embodiments of methods described herein) and a modeling mechanism. These instructions may be used to cause processor 140 using associated software 160 modules programmed with the instructions to perform the operations described. Alternatively, the operations may be performed by specific hardware that may contain hardwired logic for performing the operations, or by any combination of programmed computer components and custom hardware components.

Embodiments of the invention may include an article such as a computer or processor readable medium, or a computer or processor storage medium, such as for example a memory, a disk drive, or a USB flash memory, encoding, including or storing instructions, e.g., computer-executable instructions, which when executed by a processor or controller, carry out methods disclosed herein.

Display 180 may display data from transmitter 190, receiver 120, or computing system 130 or any other suitable systems, devices, or programs, for example, an imaging program or a transmitter or receiver tracking device. Display 180 may include one or more inputs or outputs for displaying data from multiple data sources or to multiple displays. For example display 180 may display visualizations of subsurface models including subsurface features, such as faults, horizons and unconformities. Display 180 may display an initial model as well as a plurality of models that are equiprobable perturbations of the initial model. The initial model and/or any of the plurality of perturbed models may be displayed one at a time, two at a time, or many at a time (e.g., the number selected by a user or automatically based on the difference between models or the total number of perturbed models). Display 180 may display the models in a sequence of adjacent models, through which a user may scan (e.g., by clicking a 'next' or 'previous' button with a pointing device such as a mouse or by scrolling through the models).

Input device(s) 165 may include a keyboard, pointing device (e.g., mouse, trackball, pen, touch screen), or cursor direction keys, for communicating information and command selections to processor 140. Input device 165 may communicate user direction information and command selections to the processor 140. For example, a user may use input device 165 to select one or more preferred models from among the plurality of perturbed models or to delete a non-preferred model (e.g., by pointing a 'select' or 'delete' button on a display 180 monitor adjacent to the model using a cursor controlled by a mouse or by highlighting and pressing a forward or delete key on a keyboard).

Processor 140 may include, for example, one or more processors, controllers or central processing units ("CPUs"). Software 160 may be stored, for example, in memory 150. Software 160 may include any suitable software, for example, DSI software.

Processor 140 may generate an initial model, for example, using data 155 from memory 150. A model may be generated without local maxima or minima on surfaces of horizons. In one embodiment, a model may simulate structural, spatial or geological properties of a subsurface region, such as, porosity or permeability through geological terrains.

Processor 140 may initially generate a three dimensional mesh, lattice, or collection of nodes that spans or covers a domain of interest. The domain may cover a portion or entirety of the three-dimensional space sought to be modeled. Processor 140 may automatically compute the domain to be modeled and the corresponding mesh based on the collected seismic data so that the mesh covers a portion or the entirety of the three-dimensional space from which geological data is collected (e.g., the studied subsurface region). Alternatively or additionally, the domain or mesh may be selected or modified by a user, for example, entering coordinates or highlighting regions of a simulated optional domain or mesh. For example, the user may select a domain or mesh to model a region of the Earth that is greater than a user-selected subsurface distance (e.g., 100 meters) below the Earth's surface, a domain that occurs relative to geological features (e.g., to one side of a known fault or riverbed), or a domain that occurs relative to modeled structures (e.g., between modeled horizons $H(t_1)$ and $H(t_{100})$). Processor 140 may execute software 160 to partition the mesh or domain into a plurality of three-dimensional (3D) cells, columns, or other modeled data (e.g., represented by voxels, pixels, data points, bits and bytes, computer code or functions stored in memory 150). The cells or voxels may have hexahedral, tetrahedral, or any other polygonal shapes, and preferably three-dimensional shapes. Alternatively, data may include zero-dimensional nodes, one-dimensional segments, two-dimensional facet and three-dimensional elements of volume, staggered in a three-dimensional space to form three-dimensional data structures, such as cells, columns or voxels. The cells preferably conform to and approximate the orientation of faults and unconformities. Each cell may include faces, edges and/or vertices. Each cell or node may correspond to one or more particles of sediment in the Earth (e.g., a node may include many cubic meters of earth, and thus many particles). As shown in FIG. 1, model 100 in G*-space 106, i.e., modeling seismic data as a function of geological time (the time the structures being modeled were originally deposited) may be generated using a regular mesh (e.g., having a uniform lattice or grid structure or nodes and cells). In contrast, model 108 of FIG. 1 may be generated using an irregular mesh (having an irregular lattice or arrangement or nodes or cells). Data collected by receiver 120 after the time of deposition in a current or present time period, faults and unconformities that have developed since the original time of deposition, e.g., based on tectonic motion, erosion, or other environmental factors, may disrupt the regular structure of the geological domain. Accordingly, an irregular mesh may be used to model current geological structures, for example, so that at least some faces, edges, or surfaces of cells are oriented parallel to faults and unconformities, and are not intersected thereby. In one embodiment, a mesh may be generated based on data collected by receiver 120, alternatively, a generic mesh may be generated to span the domain and the data collected by receiver 120 may be used to modify the structure thereof. For example, the data collected may be used to generate a set of point values at "sampling point". The values at these points may reorient the nodes or cells of the mesh to generate a model that spatially or otherwise represents the geological data collected from the Earth. Other or different structures, data points, or sequences of steps may be used to process collected geological data to generate a model. The various processes described herein (e.g., modeling faults) may be performed by manipulating such modeling data.

The geological time function may be defined at a finite number of nodes or sampling points based on real data corresponding to a subsurface structure, e.g., one or more particles or a volume of particles of Earth. The geological time function may be approximated between nodes to continuously represent the subsurface structure, or alternatively, depending on the resolution in which the data is modeled may represent discrete or periodic subsurface structures, e.g., particles or volumes of Earth that are spaced from each other.

Seismic data used to generate the model may be uncertain. For example, the wavelength of a signal received by receiver 120 which was reflected off of a seismic terrain may have an uncertainty proportional to the incident wavelength of the signal. When the seismic data is uncertain, the computing system 130 may generate a geophysical model that is also uncertain. That is, the exact solution may be indeterminate at one or more nodes of the geophysical model. Instead, there is a plurality of possible solutions, each with the same probability of being correct.

Embodiments of the invention propose a solution to overcome the uncertainty by perturbing an initial uncertain model to generate and display a plurality of perturbed models, each perturbed model having a different arrangement of nodes, where each arrangement has substantially the same probability of occurring in the subsurface terrain. In an alternate embodiment, the arrangement of nodes in the perturbed models may have approximately the same probability, for example, within a predetermined range of probabilities. Additionally or alternatively, the arrangement of nodes may have approximately the same probability of occurring with respect to a first geological property, for example, the location of faults, and a different probability with respect to a second geological property, for example, the density or porosity of the terrain.

Computing system 130 may generate each perturbed model by for example applying a vector field (e.g., part of data 155) to the initial model (e.g., by vector addition). The applied vector field typically causes the nodes of the initial model to move to corresponding new locations in the perturbed models. The vector fields are preferably substantially continuous. A plurality of such vector fields may be individually applied to the initial model, thereby generating a plurality of different models, each of which has substantially the same probability of occurrence.

According to embodiments of the invention, the vector fields applied to the initial model are three-dimensional. That is, the vectors of the vector field may have different directions represented (non-trivially) by a three-component vector ($v_x$, $v_y$, $v_z$). Accordingly, when the three-dimensional vector field is applied to the initial model, each of the nodes of the initial model may be moved in different directions in the 3D space relative to each other, rather than in the same direction. Furthermore, when multiple three-dimensional vector fields are applied to the initial model to generate a plurality of perturbed models, corresponding nodes in different perturbed models may be moved in different directions in the 3D space relative to each other, rather than in the same direction. Using a three-dimensional vector field to move individual nodes of an initial model in different directions may preserve the relative structures of the initial model, e.g., such as networks of branching faults, while executing random perturbations of the remainder of the model. In contrast to conventional systems, in which for each perturbed model, a vector having the same direction is applied to every node, according to embodiments of the invention, a different 3D vector having a different direction may be applied to each different node.

Embodiments of the invention include applying a three-dimensional vector field to an initial model. In one embodiment of the invention, applying a three-dimensional vector field distinguishes applying a group of a plurality of one-dimensional (i.e., unidirectional) vector fields, where each of the different one-dimensional vector fields has a different direction. For example, when a three-dimensional vector field is applied to a model, each node of the model may be moved in any different direction in 3D space. In contrast, applying a group of a plurality of one-dimensional vector fields may be similar to partitioning a 3D modeled domain and applying a differently directional one-dimensional vector field to each partition of the 3D modeled domain. Thus, when the vector fields are applied, although nodes in different partitioned regions may be moved in different direction, within any partition, the same one of the plurality of one-dimensional vector fields is applied, and all the nodes in that region are moved in the same direction in three-dimensional space.

In an alternative embodiment, the vector fields applied to the initial model may be two-dimensional. In this embodiment, when the two-dimensional vector field is applied to the initial model, each of the nodes of the initial model may be moved in different directions of a 2D space, rather than in the same direction.

In one embodiment, the vector field perturbation for each node may be represented by a function defined on the set of nodes or by a discrete collection of data points. This data may be stored in memory 150 (e.g. in data 155). The data may be, for example, data embedded at each node or in an associated matrix, scalar or vector field, lookup data or any other configuration for storing the data. In another embodiment of the invention, a gradient of a scalar field may be used instead of the three-dimensional vector field. The scalar field may have only a single scalar value, s, stored for each node, which when compared to the three vector values ($v_x$, $v_y$, $v_z$) stored for a corresponding vector field, reduces the effective amount of data in memory 150 (e.g., by 2/3).

In one embodiment, computing system 130 may determine the vector or scalar field perturbation of the model independently for each node. Alternatively, computing system 130 may determine the perturbations together for a set or neighborhood of nodes. For example, the scalar field or the magnitude of the vector field may be averaged or may be a maximum, minimum or other approximation of the individual uncertainties of each node in the set. For example, a grouping of individual nodes into a set of nodes may be based on physical (e.g., spatial) characteristics of the model. For example, the set of nodes may share a cell, edge or vertex of a mesh of the model, or the set of nodes may represent a similar geological time, or may be located on the same side of a fault, etc.

Display 180 may display a visualization of the plurality of perturbed models on a graphical user interface. Such visualizations may be for example stored as data 155. A user may analyze display 180 or initiate computations executed by processor 140 to compare and determine the coherency, consistency, or reliability of each of the models. Alternatively, the user may have knowledge of the terrain and easily accept or reject each of the models based on this knowledge. The generation of a plurality of alternative models may be a one-time process or alternatively, may be an iterative process repeated until final results are achieved. For example, if there are multiple acceptable models such that a user cannot narrow his decision to select to a single model or alternatively, none of the models generated are desirable, a command may be received, e.g., automatically generated or input by a user, for computing module to repeat the model generation process. In one embodiment, a refinement process may be used. In the example above, if the user is not satisfied with any of the models generated by an initial partition or set of points, the user may add or remove model data points, refine a partition, reiterate a process, etc., to generate a new set of models.

A user may inspect display 180 and remove erroneous data (e.g., bubbles) from the model. For example, if there is a great likelihood that erroneous data occurs in a specific region (e.g., due to a rapid variation in the thickness of layers), the user may highlight (e.g., visually on a displayed model, by selecting points, or by defining the bounds of a region) or otherwise indicate that data may be extracted from the region. In one example, the user may send a command to the computer module via an input device.

The user may select or highlight a region of the model on display 180 by pointing or dragging a cursor controllable by a mouse on the display of the model, entering coordinates of the model, or otherwise indicating a model location. The user may command computing system 130 to refine a selected region of a model. For example, if a user recognizes a region of incoherent or inconsistent data (e.g., a region with rapid lateral variations of layer thicknesses in a sedimentary context known to be unlikely or impossible) the user may highlight or mark that region. Executing a command, computing system 130 may generate various models for each different possible solution corresponding to the uncertainty in the user selected region, while the remainder of the model may remain unchanged. In the example above, while observing the plurality of models generated, the user may select only those for which thicknesses are constant since models with rapid variations of thickness are known to be erroneous. In this or other embodiments, where only a portion of the model is regenerated for different possible solutions of an uncertain solution, the boundary of the regenerated and unchanged regions may be smoothed, e.g., by an approximation function.

In another embodiment, the user may set the number of models generated (e.g., 10, 100, or 1,000). For a set range of uncertainty, the greater the number of models generated, the more the solution set spans the whole range of possible solutions.

In one embodiment, input data may include horizon sampling points, including well paths, well markers, or other data. Sampling points may be displayed on the horizon model. Data removed from the set of sampling points (e.g., a pathological set of sampling points forming bubbles) may be displayed on the model with the retained sampling points, e.g., in a different color or by a symbol having a different geometrical shape. The user may select normal, reverse or undefined types for a fault by clicking on the name of the fault in a list.

Fault surfaces, horizon surfaces, model boundaries (e.g., as lines or transparent surfaces) may be modeled and displayed on display 180. The paleo-geographic coordinate functions u and v of the uvt-transform may be "painted" on horizons as a grid (e.g., each line of the grid may correspond to a constant value for function u or the function v). The model may be displayed in geological space or in geo-chronological space or both at the same time.

To model the uncertainties associated with an initial model (horizons and faults), the initial model and/or one or more perturbed models (horizons and faults) may be displayed on display 180. A neighborhood or volume around faults for which the fault is uncertain may be displayed.

Reference is again made to FIG. 7, which schematically illustrates a graphical user interface 700 for received input to generate or modify models of subsurface structures. Graphical user interface 700 may be displayed on display 180, for example, adjacent to the models of subsurface structures, or separately from in a preprocessing stage. Graphical user interface 700 may be an interface for requesting information from a user (e.g., via input fields, controls for parameters or computer settings, or explicit requests). A user may operate an input device (e.g., input device 165 of FIG. 10), such a mouse or keyboard having functionality to alter field, select buttons and otherwise interact with graphical user interface 700. Processor 140 may receive user input to the graphical user interface 700 and adapt its functionality accordingly. For example, graphical user interface 700 may provide data fields 702 and 704 for receiving user-instructions to ignore data and use data, respectively, e.g., in modeled region selected or highlighted by a user. Graphical user interface 700 may provide data field 706 to reset points that are to be ignored when generating a subsequent model, e.g., so that the user may select or highlight a different region. Graphical user interface 700 may provide data field 708 to indicate to a user that a computing module is generating horizons according to embodiments of the invention. Graphical user interface 700 may provide data field 710 to indicate to a user that one or more geological properties are being modeled by a computing module. Graphical user interface 700 may provide data field 712 to select, e.g., in a range of values, the degree to which data will be refined or filtered when generating a model. At one extreme, no data is filtered and at another extreme, all data is filtered. Graphical user interface 700 may provide data field 714 to ignore inconsistent or incoherent data when generating a model. For example, a user may select to ignore, filter or remove data points which are further away from a plane which best approximates the data by, for example, an amount greater that most other input data points (e.g., more than half or another predetermined percentage).

Figure 11:
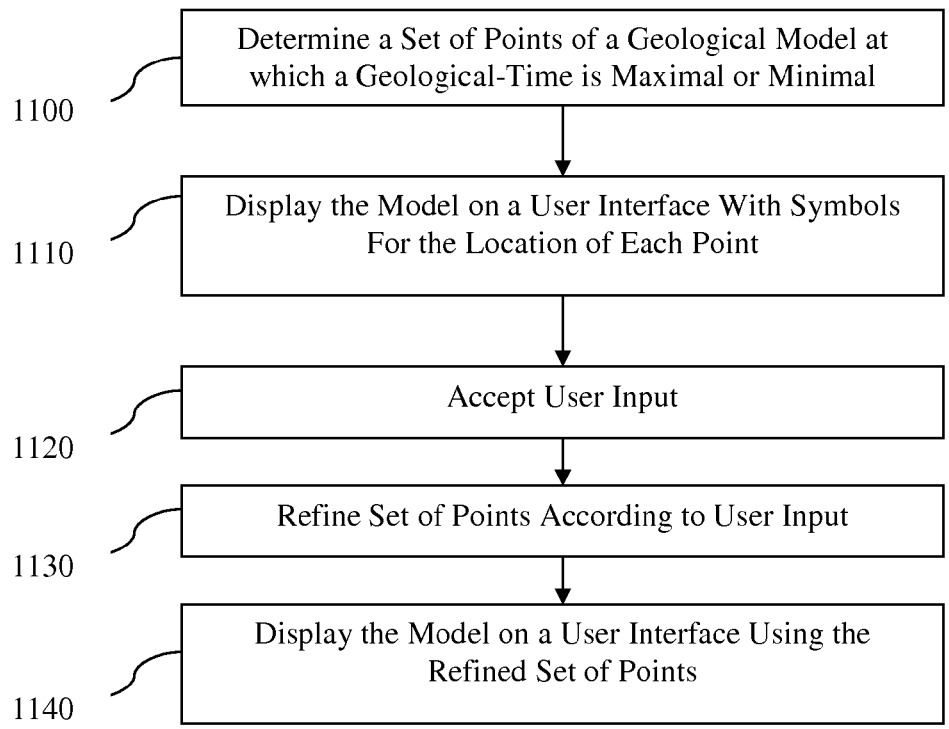
FIGS. 11-16 are flowcharts of methods according to embodiments of the invention.

Reference is made to FIG. 11, which is a flowchart of a method for identifying erroneous points in a geological model, which may be performed for example using system 105 of FIG. 10 or another suitable computing system. Other operations or series of operations may be used, and the exact set of steps shown below may be varied.

In operation 1100, a computing device (e.g. processor 140 of FIG. 10) may determine a set of points of a geological model at which a geological-time function has a maximum or minimum value in a set of local regions. The local regions may be predefined based on a local partition of the domain in which the geological model is generated. For example, the computing device may define a partition of the model to generate the set of local regions. Each point in the set of maximum or minimum points may correspond to a different local region in the set of local regions.

In operation 1110, a display device (e.g. display 180 of FIG. 10) may display the model on a user interface. The model may include symbols indicating the location of each point in the set of points at which a geological-time function has the maximum or minimum value.

In operation 1120, the computing device may accept input from the user (e.g., via input device 160 of FIG. 10). User input may indicate one or more point to be added or removed from the set of points at which a geological-time function has the maximum or minimum value. The user may also enter input, which when received by the computing device, may prevent the symbols indicating the maximum or minimum points from being displayed on the model.

In operation 1130, the computing device may refine the set of points according to input received from a user for example by adding or removing points in the set of points at which a geological-time function has the maximum or minimum value. The computing device may refine the set of points by refining the partition of the model.

In operation 1140, the display device may display the model to the user generated using the refined set of points.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 12:
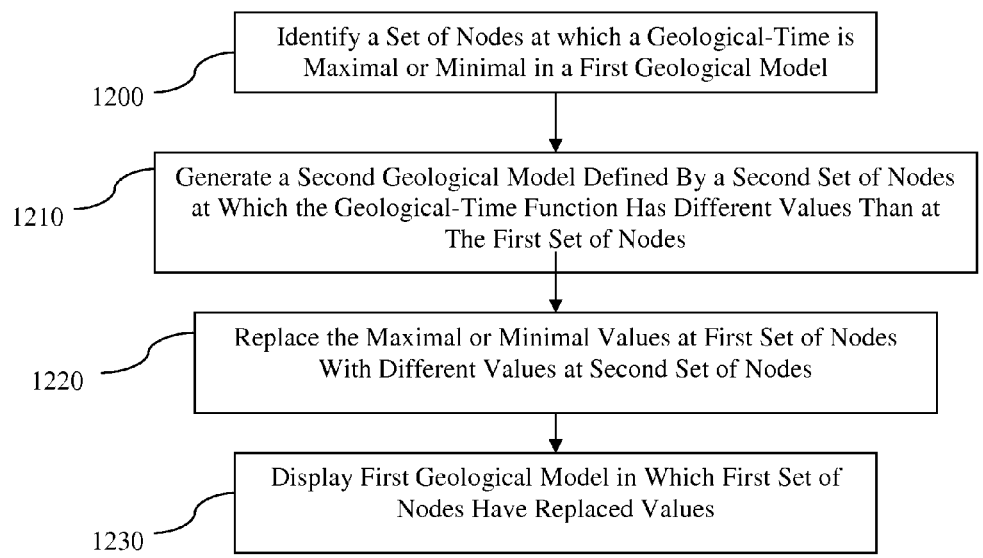

Reference is made to FIG. 12, which is a flowchart of a method for refining a first geological model, which may be performed for example using system 105 of FIG. 10 or another suitable computing system. Other operations or series of operations may be used, and the exact set of steps shown below may be varied.

In operation 1200, a computing device (e.g. processor 140 of FIG. 10) may identify a first set of nodes at which a geological-time function has a local maximum or minimum value in a first geological model.

In operation 1210, the computing device may generate a second set of nodes. The second set of nodes may correspond to the first set of nodes, where values of the geological-time function at the second set of nodes are substantially different than the values of the geological-time function at the first set of nodes. The values of the geological-time function at the second set of nodes are typically not a local maximum or minimum value. The computing device may apply a smoothness constraint to the values of the geological-time function at the second set of nodes. The computing device may approximate the values of the second set of nodes from values of nodes in the first geological model that neighbor the replaced first set of nodes.

In operation 1220, the computing device may replace the values at the first set of nodes in the first geological model with the values at the second set of nodes.

In operation 1230, a display device (e.g. display 180 of FIG. 10) may display the first geological model in which the values of the first set of nodes are replaced with the values at the second set of nodes. The display may optionally display the first set of nodes at which a geological-time function has a local maximum or minimum value.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 13:
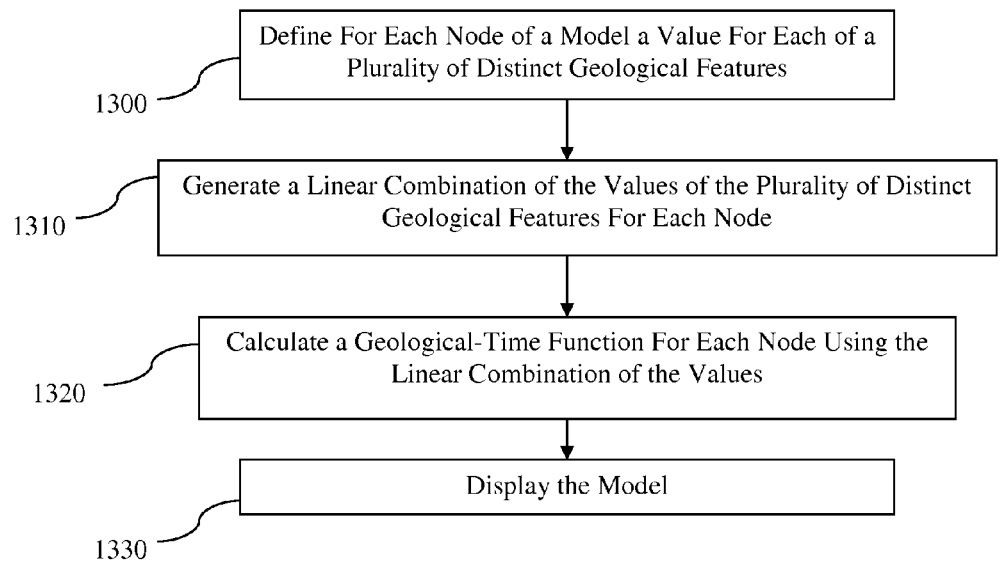

Reference is made to FIG. 13, which is a flowchart of a method for generating a model by defining a combination of geological properties of the model, which may be performed for example using system 105 of FIG. 10 or another suitable computing system. Other operations or series of operations may be used, and the exact set of steps shown below may be varied.

In operation 1300, a computing device (e.g. processor 140 of FIG. 10) may define, for each node of the model, a value for each of a plurality of distinct geological properties associated with the model. The geological properties may include for example the geometry of faults, geometry of well paths, geometry of horizons, the occurrence of sampling points and seismic travel times.

In operation 1310, the computing device may generate a linear combination of the values of the plurality of geological properties for each node of the model. The computing device may accept data from a user for defining values of a geological property associated with one or more nodes of the model.

In operation 1320, the computing device may calculate a geological-time function at each node of the model using the linear combination of the values of the geological properties associated with the node of the model. The values of each of the plurality of distinct geological properties may be simultaneously used as a linear combination to generate the geological-time function. Accordingly, the model generated using the linear combination may have the plurality of geological properties corresponding thereto at each node of the model.

In operation 1330, a display device (e.g. display 180 of FIG. 10) may display the model.

In one embodiment, the model may be generated using control-point data, wherein control-points derived from seismic cross sections or seismic cubes and control-points observed on well paths are used to generate substantially separate horizons.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 14:
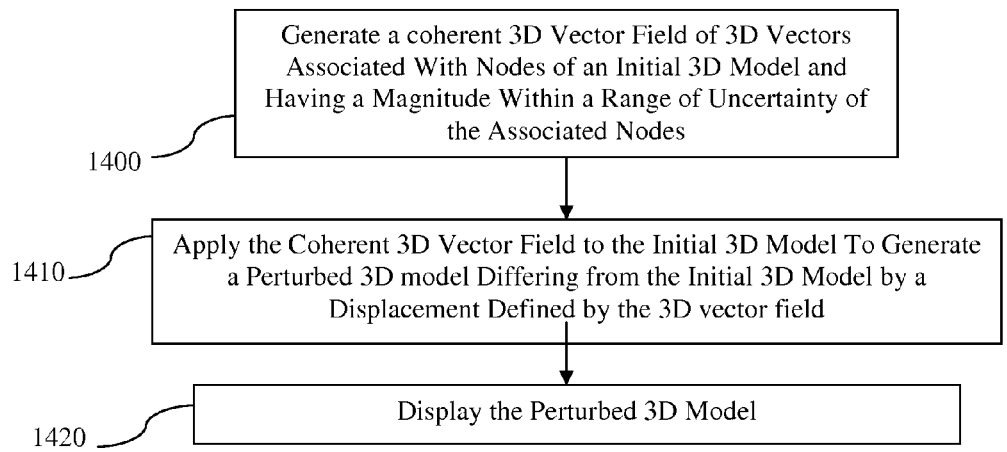

Reference is made to FIG. 14, which is a flowchart of a method for perturbing an initial three-dimensional (3D) geological model using a 3D vector field, which may be performed using system 105 of FIG. 10. Other operations or series of operations may be used, and the exact set of steps shown below may be varied.

In operation 1400, a computing device (e.g. processor 140 of FIG. 10) may generate a 3D vector field including 3D vectors. For example, a coherent vector field may be generated. Each 3D vector of the 3D vector field may be associated with a node of the initial 3D geological model and may have a magnitude within a range of uncertainty of the node of the initial 3D geological model associated therewith. In one embodiment, the uncertainty at the nodes of the model may correspond to the location of the nodes. In another embodiment, the uncertainty at the nodes of the model may correspond to the location of a fault. In yet another embodiment, the uncertainty at the nodes of the model may be proportional to the wavelength of data reflected from a subsurface geological feature.

The 3D geological model has three dimensions, and the 3D vector field associated with each node of the 3D geological model may be defined by three values, each of which corresponds to a different one of the three dimensions of the 3D geological model. In one embodiment, the vector field is defined by a 3D gradient of a scalar field. In this embodiment, a scalar value may be associated with each node of the geological model and the 3D vector field may be generated by taking a three dimensional gradient of the scalar field.

In operation 1410, the computing device may apply the 3D vector field to the initial 3D geological model associated therewith to generate an alternative 3D model. The alternative 3D model may differ from the initial 3D geological model by a 3D vector at the nodes having uncertain values. The computing device may apply separately one or more additional different 3D vector fields to the initial 3D geological model to generate a plurality of alternative 3D models. In one embodiment, the computing device may represent the 3D vector field by a first matrix and the initial 3D geological model by a second matrix. In this embodiment, the computing device may apply the 3D vector field to the initial 3D geological model by adding the first and second matrices together.

In operation 1420, a display device (e.g. display 180 of FIG. 10) may display the alternative 3D model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 15:
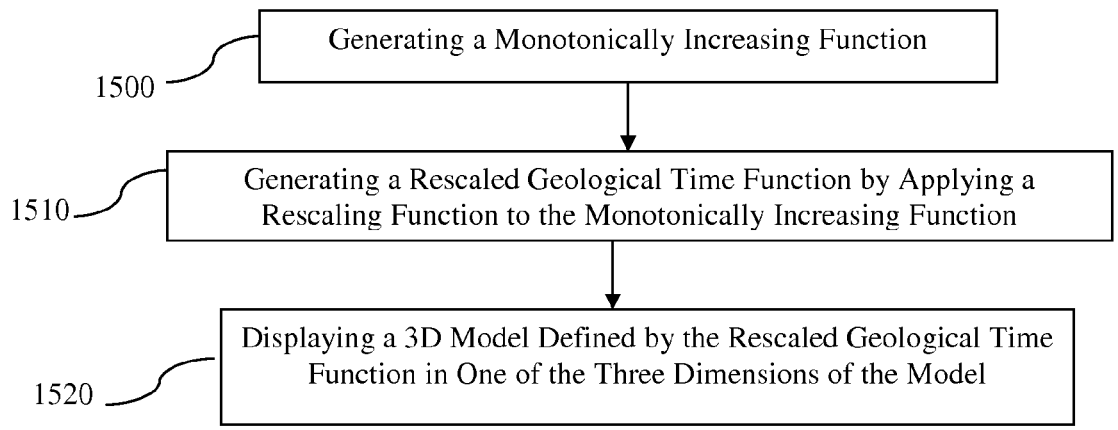

Reference is made to FIG. 15, which is a flowchart of a method for, in a three-dimensional (3D) subsurface model, rescaling a function of time of when a geological structure was originally formed in the Earth, which may be performed using for example system 105 of FIG. 10 or another suitable computing system. Other operations or series of operations may be used, and the exact set of steps shown below may be varied.

In operation 1500, a computing device (e.g. processor 140 of FIG. 10) may generate a monotonically increasing function. The computing device may automatically generate the monotonically increasing function, for example, to be a random function.

In operation 1510, the computing device may generate a rescaled geological time function by applying a rescaling function to the monotonically increasing function. The rescaling function may be defined so that the norm of the gradient of the rescaled geological-time function is, on average, approximately constant throughout the model. The computing device may automatically generate the constant value of the norm of the gradient of the rescaled geological-time function to be, for example one (1). A computer memory unit (e.g. memory 150 of FIG. 10) may store the rescaled geological-time function.

In operation 1520, a display device (e.g. display 180 of FIG. 10) may display a three-dimensional model of the structure when it was originally formed, the three-dimensional model defined by the rescaled geological time function in one of the three dimensions of the model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

Figure 16:
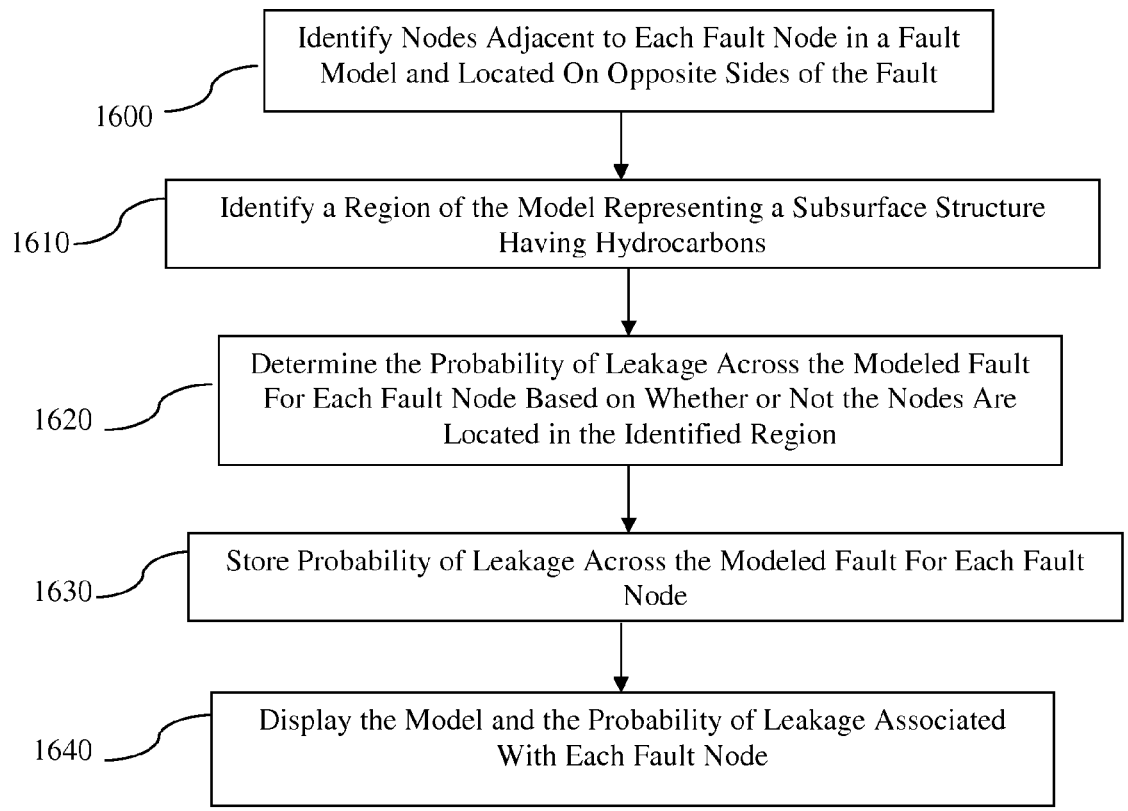

Reference is made to FIG. 16, which is a flowchart of a method for modeling the probability of leakage across a fault in a model, which may be performed using for example system 105 of FIG. 10 or another suitable computing system. Other operations or series of operations may be used, and the exact set of steps shown below may be varied.

In operation 1600, a computing device (e.g. processor 140 of FIG. 10) may, for each fault node associated with the modeled fault, identify two or more nodes that are substantially adjacent to the fault node and that are located on opposite sides of the fault from each other.

In operation 1610, the computing device may identify a region of the model representing a subsurface structure having hydrocarbons.

In operation 1620, the computing device may determine the probability of leakage across the modeled fault for each fault node. The probability of leakage may be determined based on whether or not the two or more nodes identified in operation 1600 are determined to be located in the region of the model identified in operation 1610. The computing device may automatically determine if the two or more nodes are located in the identified region. Alternatively or additionally, the computing device may receive data manually entered by a user (e.g., input device 165 of FIG. 10) indicating if the two or more nodes are located in the identified region. In one embodiment, the computing device may initialize a counter for each node and may increase the probability associated with each node by incrementing the counter by a value, e.g., one, if the two or more identified nodes are determined to be located in the identified region of the model.

In operation 1630, a computer memory (e.g. memory 150 of FIG. 10) may store the probability of leakage associated with each fault node. For each fault node, the probability of leakage may be greater when the two or more nodes are determined to be located in the identified region of the model than if the two or more nodes are determined to be located outside the identified region. The computing device may generate a total probability of leakage across the modeled fault by averaging the probabilities for each fault node.

In one embodiment, the computing device may repeat operations 1600-1630 for a node in each of a plurality of equiprobable models that correspond to the fault node. In this embodiment, the probability of leakage for each node may be an average of the probabilities of leakage for all corresponding nodes of the plurality of equiprobable models.

In operation 1640, a display device (e.g. display 180 of FIG. 10) may display the model and the probability of leakage associated with each fault node using a color scale overlaying the model.

The computing device may accept the data used in the aforementioned operations as for example a set of data reflected from a subsurface geological feature, or such data augmented by another process. The computing device may accept one or more of seismic and well data. The computing device may generate one or more of seismic and well data.

When used herein, "generating" or "creating" a model or a subsurface feature may include creating data representing the model or feature, the data being stored for example in a computer system such as that shown in FIG. 10.

In the foregoing description, various aspects of the present invention have been described. For purposes of explanation, specific configurations and details have been set forth in order to provide a thorough understanding of the present invention. However, it will also be apparent to one skilled in the art that the present invention may be practiced without the specific details presented herein. Furthermore, well known features may have been omitted or simplified in order not to obscure the present invention. Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

Embodiments of the invention may manipulate data representations of real-world objects and entities such as underground geological features, including faults and other features. Data received by for example a receiver receiving waves generated by an air gun or explosives may be manipulated and stored, e.g., in memory 150, and data such as images representing underground features may be presented to a user, e.g., as a visualization on display 180.

When used herein, geological features such as horizons and faults may refer to the actual geological feature existing in the real world, or computer data representing such features (e.g., stored in a memory or mass storage device). Some features when represented in a computing device may be approximations or estimates of a real world feature, or a virtual or idealized feature, such as an idealized horizon as produced in a uvt-transform. A model, or a model representing subsurface features or the location of those features, is typically an estimate or a "model", which may approximate or estimate the physical subsurface structure being modeled with more or less accuracy.

It should be recognized that embodiments of the present invention may solve one or more of the objectives and/or challenges described in the background, and that embodiments of the invention need not meet every one of the above objectives and/or challenges to come within the scope of the present invention. While certain features of the invention have been particularly illustrated and described herein, many modifications, substitutions, changes, and equivalents may occur to those of ordinary skill in the art. It is, therefore, to be understood that the appended claims are intended to cover all such modifications and changes in form and details as fall within the true spirit of the invention.

What is claimed is:

1. A method of modeling a geological-time function indicating approximate times when subsurface particles were originally deposited, the method being executed by a processor according to software instructions, the method comprising:

using the processor:
generating a plurality of linear equations of the geological-time function representing a plurality of respective geological properties at each of a plurality of model locations, wherein one of the plurality of geological properties provides fault type information represented by a linear equation defining the geological-time function for a first and a second collocated points, the first point on a negative side of a fault and the second point on a positive side of the fault, wherein the linear equation includes an inequality that specifies that the geological-time function at the second point is greater than the geological-time function at the first point if the fault is a normal fault and the geological-time function at the second point is less than the geological-time function at the first point if the fault is a reverse fault;

solving the plurality of linear equations for the geological-time function to simultaneously apply independent data corresponding to the plurality of geological properties into the geological-time function; and
modeling the geological-time function.

2. The method of claim 1, wherein the plurality of linear equations are solved simultaneously to generate the geological-time function satisfying the plurality of geological properties in a single execution of an interpolation algorithm.

3. The method of claim 1, wherein one of the plurality of geological properties provides reference horizon information represented by a linear equation defining the geological-time function for each sampling point in a set of sampling points located on a horizon to be equal to time (ti) at the sampling point location.

4. The method of claim 1, wherein one of the plurality of geological properties provides horizon geometry information represented by a linear equation defining the gradient of the geological-time function for each sampling point in a set of sampling points to be approximately parallel to a normal vector orthogonal to a horizon at the sampling point location.

5. A method for generating a model by defining a combination of geological properties of the model, the method being executed by a processor according to software instructions, the method comprising:

in a processor:
defining for each node of the model a linear relationship for each of a plurality of distinct geological properties associated with the model;
solving the linear relationships to generate a geological-time value at each node of the model that simultaneously satisfies the plurality of geological properties, wherein one of the plurality of geological properties is a geometry of faults property represented by a linear relationship defining the geological-time value for a first and a second collocated points, the first point on a negative side of a fault and the second point on a positive side of the fault, wherein the linear relationship includes an inequality that specifies that the geological-time value at the second point is greater than the geological-time value at the first point if the fault is a normal fault and the geological-time value at the second point is less than the geological-time value at the first point if the fault is a reverse fault; and
displaying the model.

6. The method of claim 5, wherein the plurality of linear relationships are solved simultaneously in a single execution of an interpolation algorithm.

7. The method of claim 5, wherein the values of each of the plurality of distinct geological properties are simultaneously used as a linear combination to generate the geological-time function.

8. The method of claim 5, comprising accepting from a user data for defining values of a geological property associated with one or more nodes of the model.

9. The method of claim 5, comprising accepting a set of data reflected from a subsurface geological feature; generating sampling points from seismic data and well data derived from the set of data; and using the sampling points to generate the model.

10. The method of claim 5, wherein the geological properties are selected from the group consisting of: geometry of faults, geometry of well paths, geometry of horizons and the occurrence of sampling points on reference horizons.

11. The method of claim 10, wherein the geometry of horizons property is represented by a linear relationship defining the gradient of the geological-time function for each sampling point in a set of sampling points to be approximately parallel to a normal vector orthogonal to a horizon at the sampling point location.

12. The method of claim 10, wherein the occurrence of sampling points on reference horizons property is represented by a linear relationship including an equality defining the geological-time function for each sampling point in a set of sampling points located on a horizon to be equal to time (ti) at the sampling point location.

13. A system for modeling a geological-time function indicating approximate times when subsurface particles were originally deposited, the system comprising:

a memory to store a plurality of sampling points representing data reflected from a subsurface geological feature;
a processor configured to generate a plurality of linear equations of the geological-time function representing a plurality of respective geological properties at each of the plurality of sampling points and to solve the plurality of linear equations for the geological-time function to simultaneously apply independent data corresponding to the plurality of geological properties into the geological-time function, wherein one of the plurality of geological properties provides fault type information represented by a linear equation defining the geological-time function for a first and a second collocated points, the first point on a negative side of a fault and the second point on a positive side of the fault, wherein the linear equation includes an inequality that specifies that the geological-time function at the second point is greater than the geological-time function at the first point if the fault is a normal fault and the geological-time function at the second point is less than the geological-time function at the first point if the fault is a reverse fault; and
an output device configured to display a model of the geological-time function.

14. The system of claim 13, wherein the processor is configured to simultaneously solve the plurality of linear equations to generate the geological-time function satisfying the plurality of geological properties in a single execution of an interpolation algorithm.

15. The system of claim 13 comprising an input device configured to accept input from a user data for defining values of a geological property associated with one or more sampling points of the model.

16. The system of claim 13 comprising a receiver to accept the data reflected from the subsurface geological feature, wherein the processor is configured to generate the plurality of sampling points from seismic data and/or well data derived from the reflected data.

17. The system of claim 13, wherein the geological properties are selected from the group consisting of: geometry of faults, geometry of well paths, geometry of horizons and the occurrence of sampling points on reference horizons.

18. A method of modeling a geological-time function indicating approximate times when subsurface particles were originally deposited, the method being executed by a processor according to software instructions, the method comprising:
using the processor:
generating a plurality of linear equations of the geological-time function representing a plurality of respective geological properties at each of a plurality of model locations;
solving the plurality of linear equations for the geological-time function to simultaneously apply independent data corresponding to the plurality of geological properties into the geological-time function; and
modeling the geological-time function, wherein one of the plurality of geological properties provides well path geometry information represented by:
a linear equation including an equality defining the geological-time function for each well marker in a set of sampling points located at an intersection of a horizon and a well path to be equal to time (ti) at each well marker location,
a linear equation including an inequality defining the geological-time function for each sampling point located above a well marker at an intersection of the horizon and the well path to be greater than the time (ti) at the well marker location, and
a linear equation including an inequality defining the geological-time function (t) for each sampling point located below a well marker at an intersection of the horizon and the well path to be less than the time (ti) at the well marker location.

19. The method of claim 18, wherein the plurality of linear equations are solved simultaneously to generate the geological-time function satisfying the plurality of geological properties in a single execution of an interpolation algorithm.

20. The method of claim 18, wherein one of the plurality of geological properties provides reference horizon information represented by a linear equation defining the geological-time function for each sampling point in a set of sampling points located on a horizon to be equal to time (ti) at the sampling point location.

21. The method of claim 18, wherein one of the plurality of geological properties provides horizon geometry information represented by a linear equation defining the gradient of the geological-time function for each sampling point in a set of sampling points to be approximately parallel to a normal vector orthogonal to a horizon at the sampling point location.

22. A system for modeling a geological-time function indicating approximate times when subsurface particles were originally deposited, the system comprising:
a memory to store a plurality of sampling points representing data reflected from a subsurface geological feature;
a processor configured to generate a plurality of linear equations of the geological-time function representing a plurality of respective geological properties at each of the plurality of sampling points and to solve the plurality of linear equations for the geological-time function to simultaneously apply independent data corresponding to the plurality of geological properties into the geological-time function; and
an output device configured to display a model of the geological-time function, wherein one of the plurality of geological properties provides well path geometry information represented by:
a linear equation including an equality defining the geological-time function for each well marker in a set of sampling points located at an intersection of a horizon and a well path to be equal to time (ti) at each well marker location,
a linear equation including an inequality defining the geological-time function for each sampling point located above a well marker at an intersection of the horizon and the well path to be greater than the time (ti) at the well marker location, and
a linear equation including an inequality defining the geological-time function (t) for each sampling point located below a well marker at an intersection of the horizon and the well path to be less than the time (ti) at the well marker location.

23. The system of claim 22, wherein the processor is configured to simultaneously solve the plurality of linear equations to generate the geological-time function satisfying the plurality of geological properties in a single execution of an interpolation algorithm.

24. The system of claim 22 comprising an input device configured to accept input from a user data for defining values of a geological property associated with one or more sampling points of the model.

25. The system of claim 22 comprising a receiver to accept the data reflected from the subsurface geological feature, wherein the processor is configured to generate the plurality of sampling points from seismic data and/or well data derived from the reflected data.

26. The system of claim 22, wherein the geological properties are selected from the group consisting of: geometry of faults, geometry of well paths, geometry of horizons and the occurrence of sampling points on reference horizons.

* * * * *